(12) United States Patent
Park et al.

(10) Patent No.: US 9,947,672 B2
(45) Date of Patent: Apr. 17, 2018

(54) SEMICONDUCTOR DEVICES INCLUDING A DUMMY GATE STRUCTURE ON A FIN

(71) Applicant: Samsung Electronics Co., Ltd., Suwon-si, Gyeonggi-do (KR)

(72) Inventors: Sang-Jine Park, Yongin-si (KR); Kee-Sang Kwon, Seoul (KR); Do-Hyoung Kim, Hwaseong-si (KR); Bo-Un Yoon, Seoul (KR); Keun-Hee Bai, Suwon-si (KR); Kwang-Yong Yang, Seoul (KR); Kyoung-Hwan Yeo, Seoul (KR); Yong-Ho Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/371,751

(22) Filed: Dec. 7, 2016

(65) Prior Publication Data

US 2017/0084617 A1    Mar. 23, 2017

Related U.S. Application Data

(63) Continuation of application No. 15/047,181, filed on Feb. 18, 2016, now Pat. No. 9,548,309, which is a (Continued)

(30) Foreign Application Priority Data

May 8, 2014    (KR) ................. 10-2014-0054924

(51) Int. Cl.
| | | |
|---|---|---|
| *H01L 29/66* | (2006.01) | |
| *H01L 29/06* | (2006.01) | |
| *H01L 27/11* | (2006.01) | |
| *H01L 27/088* | (2006.01) | |
| *H01L 21/8234* | (2006.01) | |
| *H01L 27/092* | (2006.01) | |
| *H01L 29/08* | (2006.01) | |
| *H01L 29/16* | (2006.01) | |
| *H01L 29/161* | (2006.01) | |

(Continued)

(52) U.S. Cl.
CPC .... *H01L 27/1104* (2013.01); *H01L 21/76224* (2013.01); *H01L 21/823431* (2013.01); *H01L 21/823437* (2013.01); *H01L 21/823481* (2013.01); *H01L 27/0886* (2013.01); *H01L 27/0924* (2013.01); *H01L 27/1116* (2013.01); *H01L 29/06* (2013.01);
(Continued)

(58) Field of Classification Search
CPC .................................................... H01L 29/785
See application file for complete search history.

(56) References Cited

U.S. PATENT DOCUMENTS 6,525,403 B2 *  2/2003  Inaba ............... H01L 29/42384
                                                            257/329
6,764,884 B1    7/2004  Yu et al.
(Continued)

FOREIGN PATENT DOCUMENTS

KR    1020050079270 A    8/2005
KR    1020070062867 A    6/2007

*Primary Examiner* — Thao P Le
(74) *Attorney, Agent, or Firm* — Myers Bigel P.A.

(57) ABSTRACT

Semiconductor devices including a dummy gate structure on a fin are provided. A semiconductor device includes a fin protruding from a substrate. The semiconductor device includes a source/drain region in the fin, and a recess region of the fin that is between first and second portions of the source/drain region. Moreover, the semiconductor device includes a dummy gate structure overlapping the recess region, and a spacer that is on the fin and adjacent a sidewall of the dummy gate structure.

8 Claims, 89 Drawing Sheets

Related U.S. Application Data continuation of application No. 14/639,494, filed on Mar. 5, 2015, now Pat. No. 9,299,700.

(51) Int. Cl.
*H01L 29/165* (2006.01)
*H01L 29/78* (2006.01)
*H01L 21/762* (2006.01)

(52) U.S. Cl.
CPC ...... *H01L 29/0653* (2013.01); *H01L 29/0847* (2013.01); *H01L 29/161* (2013.01); *H01L 29/165* (2013.01); *H01L 29/1608* (2013.01); *H01L 29/7848* (2013.01)

(56) References Cited

U.S. PATENT DOCUMENTS

| | | | |
|---|---|---|---|
| 7,217,623 B2 * | 5/2007 | Kim | H01L 29/66621 257/E21.429 |
| 7,638,838 B2 | 12/2009 | Chung et al. | |
| 7,868,380 B2 | 1/2011 | Kim et al. | |
| 8,053,833 B2 | 11/2011 | Kim et al. | |
| 8,264,034 B2 | 9/2012 | Kim et al. | |
| 9,548,309 B2 * | 1/2017 | Park | H01L 29/0653 |
| 2012/0181604 A1 | 7/2012 | Kim et al. | |
| 2013/0134506 A1 | 5/2013 | Yagishita | |
| 2013/0270652 A1 | 10/2013 | Liaw | |
| 2013/0285143 A1 | 10/2013 | Oh et al. | |
| 2013/0307088 A1 | 11/2013 | Yang et al. | |
| 2014/0273379 A1 * | 9/2014 | Tsai | H01L 29/66795 438/283 |
| 2014/0353719 A1 | 12/2014 | Kim | |
| 2015/0021695 A1 | 1/2015 | Hu et al. | |
| 2015/0076610 A1 * | 3/2015 | Ito | H01L 29/785 257/365 |
| 2015/0102348 A1 | 4/2015 | Cai et al. | |
| 2015/0187881 A1 * | 7/2015 | Basker | H01L 29/66795 257/192 |
| 2015/0236016 A1 | 8/2015 | Wann et al. | |
| 2015/0279995 A1 | 10/2015 | Maeda et al. | |
| 2015/0303198 A1 | 10/2015 | Ching et al. | |
| 2015/0311207 A1 | 10/2015 | Ching et al. | |
| 2016/0190243 A1 | 6/2016 | Lee et al. | |
| 2016/0233298 A1 | 8/2016 | Webb et al. | |

\* cited by examiner

SEMICONDUCTOR DEVICES INCLUDING A DUMMY GATE STRUCTURE ON A FIN

CROSS-REFERENCE TO RELATED APPLICATIONS

The present application is a continuation application of and claims priority from U.S. patent application Ser. No. 15/047,181, filed on Feb. 18, 2016, which is a continuation application of and claims priority from U.S. patent application Ser. No. 14/639,494, filed on Mar. 5, 2015, now U.S. Pat. No. 9,299,700, which claims priority under 35 U.S.C. 119 to Korean Patent Application No. 10-2014-0054924, filed on May 8, 2014 in the Korean Intellectual Property Office, the entire contents of which are hereby incorporated herein by reference in their entireties.

BACKGROUND

The present disclosure relates to semiconductor devices. As one example of scaling techniques for increasing the density of integrated circuit devices, a multi-gate transistor has been proposed, in which a fin-shaped or nanowire-shaped silicon body is formed on a substrate and a gate is then formed on a surface of the silicon body. Because the multi-gate transistor uses a three-dimensional (3D) channel, scaling of the multi-gate transistor may be relatively easily achieved. In addition, current controlling capability can be improved even without increasing a gate length of the multi-gate transistor. Further, a short channel effect (SCE), in which an electric potential of a channel region is affected by a drain voltage, can be reduced.

SUMMARY

Various embodiments of present inventive concepts provide a semiconductor device that can improve its operating characteristics by inhibiting a short from occurring and allowing a source/drain region to be subjected to epitaxial growth. According to various embodiments of present inventive concepts, a semiconductor device may include a fin protruding from a substrate and extending in a direction. The semiconductor device may include a recess in the fin, and a device isolation layer filling the recess. The semiconductor device may include a dummy gate structure overlapping the device isolation layer, and first and second spacers at opposite sides of the dummy gate structure on the fin. Moreover, the semiconductor device may include an inner spacer on inner sidewalls of the first and second spacers, and a source/drain region at opposite sides of the recess and spaced apart from the device isolation layer.

In various embodiments, a first width of the recess may be narrower than a second width of the dummy gate structure. Moreover, a first bottom surface of the recess may be lower than a second bottom surface of the source/drain region.

According to various embodiments, the first spacer may include a first region and a second region on the first region, the second spacer may include a third region and a fourth region on the third region, a first width of the first region may be wider than a second width of the second region, and a third width of the third region may be wider than a fourth width of the fourth region. In some embodiments, a first distance between the first region and the third region may be shorter than a second distance between the second region and the fourth region. In some embodiments, the inner spacer may be on sidewalls of each of the first and third regions. Moreover, a profile of the recess and a profile of the inner spacer may be connected.

In various embodiments, the semiconductor device may include a capping layer between the recess and the device isolation layer and continuously extending adjacent a boundary of the recess. In some embodiments, the semiconductor device may include a cover layer on a top surface of the dummy gate structure. Moreover, the first and second spacers may extend along respective sidewalls of the cover layer.

According to various embodiments, a top surface of the device isolation layer may protrude beyond or be coplanar with a top surface of the fin. Moreover, the device isolation layer may include a first region in the recess and a second region on the first region, and a first width of the first region may be narrower than a second width of the second region.

In various embodiments, the semiconductor device may include a first gate structure and a second gate structure spaced apart from the dummy gate structure at opposite sides, respectively, of the dummy gate structure on the fin. Moreover, a bottom surface of the dummy gate structure may be higher than or coplanar with respective bottom surfaces of the first and second gate structures.

A semiconductor device, according to various embodiments, may include a fin protruding from a substrate and extending in a direction. The semiconductor device may include a recess in the fin, and a dummy gate structure filling the recess. The semiconductor device may include first and second gate structures at opposite sides of the dummy gate structure, respectively. The first and second gate structures may be spaced apart from the dummy gate structure on the fin and may extend over the fin. The semiconductor device may include a first spacer on the first gate structure, a second spacer on the second gate structure, and a third spacer including respective portions on the opposite sides of the dummy gate structure. Moreover, the semiconductor device may include an inner spacer between the dummy gate structure and the third spacer.

In various embodiments, a first width of the recess may be narrower than a second width of the dummy gate structure on the recess. Moreover, the dummy gate structure may include a gate insulation layer, a barrier layer and a gate electrode, and the gate electrode may be in the recess.

A semiconductor device, according to various embodiments, may include a substrate that includes a first region and a second region. The semiconductor device may include a first fin protruding from the substrate and extending in a first direction on the first region. The semiconductor device may include a recess extending in a second direction different from the first direction in the first fin. The semiconductor device may include a dummy gate structure overlapping the recess and extending in the second direction. The semiconductor device may include second and third fins on the second region, protruding from the substrate, and extending in the first direction. Moreover, the semiconductor device may include a trench between the second fin and the third fin such that the second fin and the third fin are spaced apart from each other. A height and a width of the recess may be smaller than those of the trench.

In various embodiments, the height of the recess may be smaller than that of the fin, and the height of the trench is greater than that of the fin. Moreover, the semiconductor device may include a first device isolation layer filling the recess and a second device isolation layer filling the trench.

A semiconductor device, according to various embodiments, may include a fin protruding from a substrate, a source/drain region in the fin, and a device isolation layer in a recess region of the fin that is between and spaced apart from first and second portions of the source/drain region. Moreover, the semiconductor device may include a dummy gate structure overlapping the device isolation layer, and a spacer that is on the fin and adjacent a sidewall of the dummy gate structure. In some embodiments, the semiconductor device may include first and second gate structures on the fin, where the dummy gate structure is between the first and second gate structures. In some embodiments, the semiconductor device may include a protective cover layer on the dummy gate structure and the first and second gate structures.

In various embodiments, the spacer may be a first spacer, and the semiconductor device may include a second spacer that is on a sidewall of the first spacer and that undercuts a portion of the dummy gate structure. Moreover, the device isolation layer may be tapered away from the dummy gate structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
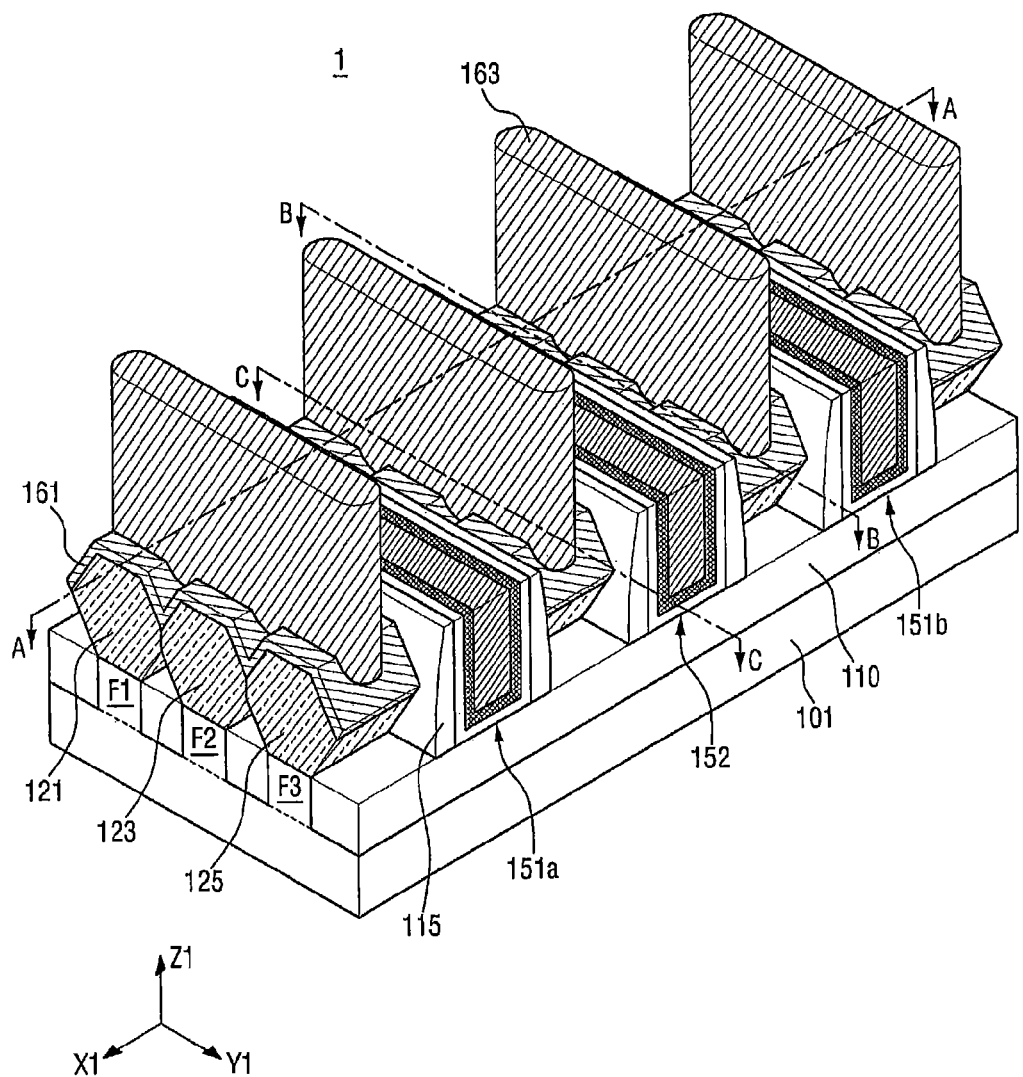
FIG. 1 is a perspective view of a semiconductor device according to some embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, a semiconductor device 1 according to some embodiments of present inventive concepts will be described with reference to FIGS. 1 to 4.

Figure 2:
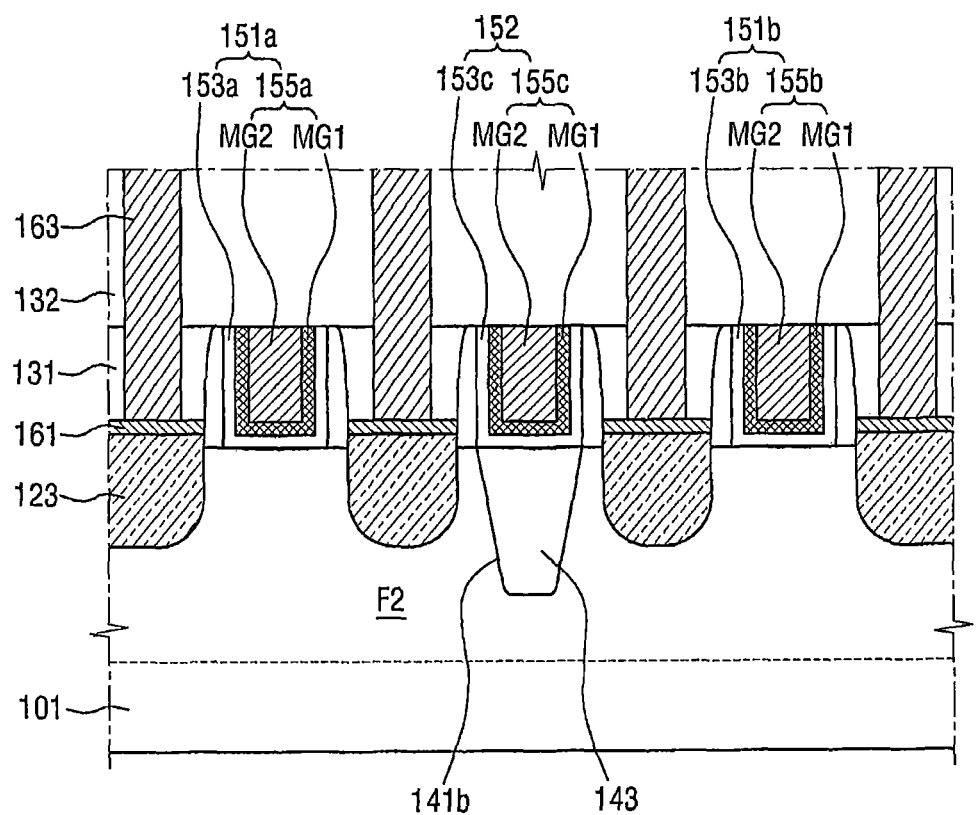
FIG. 2 is a cross-sectional view taken along the line A-A of FIG. 1.
Figure 3:
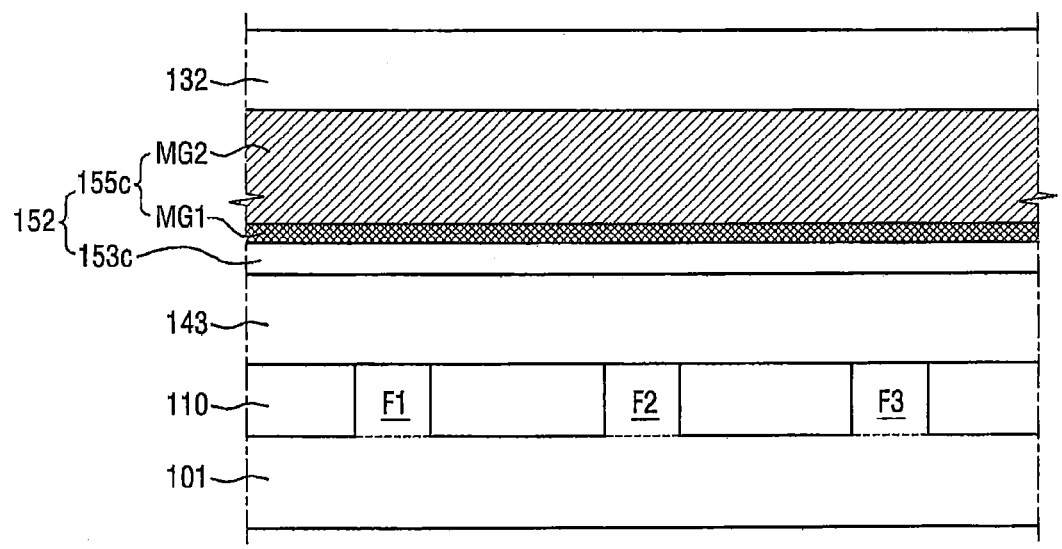
FIG. 3 is a cross-sectional view taken along the line B-B of FIG. 1.
Figure 4:
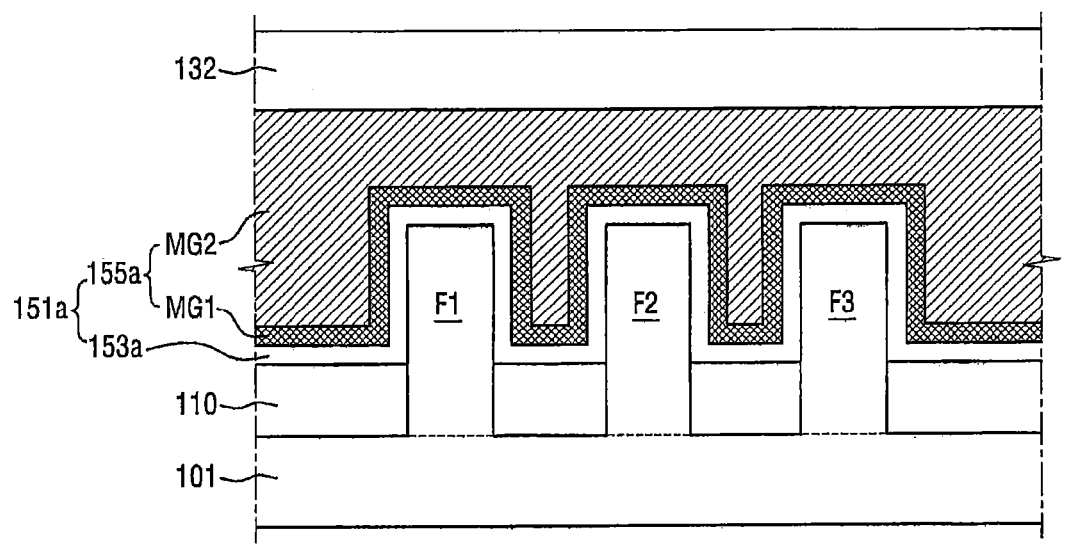
FIG. 4 is a cross-sectional view taken along the line C-C of FIG. 1.

FIG. 1 is a perspective view of a semiconductor device 1 according to some embodiments of present inventive concepts, FIG. 2 is a cross-sectional view taken along the line A-A of FIG. 1, FIG. 3 is a cross-sectional view taken along the line B-B of FIG. 1, and FIG. 4 is a cross-sectional view taken along the line C-C of FIG. 1. First and second interlayer insulation layers 131 and 132 may be provided in some embodiments, even if not explicitly illustrated in FIG. 1.

Referring to FIGS. 1 to 4, the semiconductor device 1 may include a substrate 101, first to third fins F1, F2 and F3, a field insulation layer 110, a recess 141b, a device isolation layer 143, first and second gate structures 151a and 151b, a dummy gate structure 152, a first spacer 115, first to third source/drain regions 121, 123 and 125, first and second interlayer insulation layers 131 and 132, a silicide layer 161, and a contact 163.

In detail, the substrate 101 may include one or more semiconductor materials selected from the group comprising Silicon (Si), Germanium (Ge), Silicon Germanium (SiGe), Gallium Phosphide (GaP), Gallium Arsenide (GaAs), Silicon Carbide (SiC), Silicon-Germanium-Carbon (SiGeC), Indium Arsenide (InAs) and Indium Phosphide (InP). Moreover, in some embodiments, the substrate 101 may be a silicon on insulator (SOI) substrate.

The first to third fins F1 to F3 may protrude in a third direction Z1. The first to third fins F1 to F3 may extend in a lengthwise direction, that is, lengthwise in a first direction X1. Each of the first to third fins F1 to F3 may have long sides and short sides. The first to third fins F1 to F3 may be disposed on the substrate 101 to be spaced apart from one another. For example, the first to third fins F1 to F3 may be spaced apart from one another in the second direction Y1. In FIG. 1, the long side direction corresponds to the first direction X1 and the short side direction corresponds to the second direction Y1, but aspects of present inventive concepts are not limited thereto. In each of the first to third fins F1 to F3, for example, the long side direction may correspond to the second direction Y1 and the short side direction may correspond to the first direction X1.

Each of the first to third fins F1 to F3 may be part of the substrate 101 or may include an epitaxial layer grown from the substrate 101. The first to third fins F1 to F3 may include, for example, Si or SiGe. The field insulation layer 110 may be formed on the substrate 101 and may expose top portions of sidewalls of the first to third fins F1 to F3. The field insulation layer 110 may be, for example, an oxide layer.

The first and second gate structures 151a and 151b and the dummy gate structure 152 are disposed to be spaced apart from each other. The first and second gate structures 151a and 151b and the dummy gate structure 152 may cross the first to third fins F1 to F3, respectively. The dummy gate structure 152 is disposed on the device isolation layer 143. In FIG. 1, the first and second gate structures 151a and 151b and the dummy gate structure 152 extending in the second direction Y1 are illustrated, but aspects of present inventive concepts are not limited thereto. The first and second gate structures 151a and 151b and the dummy gate structure 152 may cross/overlap each of the first to third fins F1 to F3 while forming an acute angle or an obtuse angle with the first to third fins F1 to F3.

The recess 141b aligned in the second direction Y1 is formed in each of the first to third fins F1 to F3. A bottom surface of the recess 141b is lower than or at the same level with bottom surfaces of the first to third source/drain regions 121, 123 and 125. In FIG. 2, the recess 141b is illustrated with the shape of a trench tapering away from its top portion, but aspects of present inventive concepts are not limited thereto. The recess 141b may have, for example, a U-shape, a V-shape, a rectangular shape, or a trapezoidal shape.

The device isolation layer 143 may fill the recess 141b. Therefore, the device isolation layer 143 may extend in the second direction Y1. The device isolation layer 143 may be formed on the field insulation layer 110 and may be formed in the first to third fins F1 to F3. Since the device isolation layer 143 fills the recess 141b, a bottom surface of the device isolation layer 143 is lower than bottom surfaces of first to third source/drain regions 121, 123 and 125. The device isolation layer 143 may isolate source/drain regions 123 formed at opposite sides of the device isolation layer 143 to inhibit/prevent a short from occurring and to inhibit/prevent current from flowing. The device isolation layer 143 may include, for example, an oxide layer, a nitride layer, or an oxynitride layer. The device isolation layer 143 is spaced apart from the first to third source/drain regions 121, 123 and 125.

Top surfaces of the first and second gate structures 151a and 151b may be coplanarly positioned with a top surface of the dummy gate structure 152.

The first and second gate structures 151a and 151b may include respective first and second gate insulation layers 153a and 153b and respective first and second gate electrodes 155a and 155b.

The first and second gate insulation layers 153a and 153b may be formed between the first to third fins F1 to F3 and the first and second gate electrodes 155a and 155b, respectively. As shown in FIG. 1 and FIG. 4, the first and second gate insulation layers 153a and 153b may be formed on top surfaces and top portions of sidewalls of the first to third fins F1 to F3, respectively. In addition, the first and second gate insulation layers 153a and 153b may be disposed between each of the first and second gate electrodes 155a and 155b and the field insulation layer 110, respectively. The first and second gate insulation layers 153a and 153b may include a high-k material having a higher dielectric constant than a silicon oxide layer. For example, the first and second gate insulation layers 153a and 153b may include Hafnium Oxide ($HfO_2$), Zirconium Oxide ($ZrO_2$), Lanthanum Oxide (LaO), Aluminum Oxide ($Al_2O_3$) or Tantalum Oxide ($Ta_2O_5$).

The first and second gate electrodes 155a and 155b may include first and second metal layers MG1 and MG2, respectively. As shown, the first and second gate electrodes 155a and 155b may include two or more stacked metal layers MG1 and MG2. The first metal layer MG1 may control a work function, and the second metal layer MG2 may fill a space provided by the first metal layer MG1. As shown in FIG. 3, the first metal layer MG1 may be conformally formed along the top surfaces and top portions of sidewalls of the first to third fins F1 to F3. For example, the first metal layer MG1 may include at least one of Titanium Nitride (TiN), Tantalum Nitride (TaN), Titanium Carbide (TiC), Titanium-Aluminum Carbide (TiAlC) and Tantalum Carbide (TaC). In addition, the second metal layer MG2 may include Tungsten (W) or Aluminum (Al). In addition, the first and second gate electrodes 155a and 155b may include may include a non-metal material, e.g., Si or SiGe. The first and second gate structures 151a and 151b may be formed by, for example, a replacement process, but aspects of present inventive concepts are not limited thereto.

The dummy gate structure 152 may include a dummy gate insulation layer 153c and a dummy gate electrode 155c. The dummy gate structure 152 does not function as a gate of a transistor, unlike the first and second gate structures 151a and 151b.

As shown in FIGS. 2 and 3, the dummy gate insulation layer 153c may be formed between each of the first to third fins F1 to F3 and the dummy gate electrode 155c. As shown in FIG. 3, the dummy gate insulation layer 153c may be formed on the device isolation layer 143. The dummy gate insulation layer 153c may include a high-k material having a higher dielectric constant than a silicon oxide layer. For example, the dummy gate insulation layer 153c may include $HfO_2$, $ZrO_2$, LaO, $Al_2O_3$ or $Ta_2O_5$.

The dummy gate electrode 155c may include first and second metal layers MG1 and MG2. As shown in FIG. 3, the dummy gate electrode 155c may include two or more stacked sub metal layers, that is, the first and second metal layers MG1 and MG2. For example, the first metal layer MG1 may include at least one of TiN, TaN, TiC, TiAlC and TaC. In addition, the second metal layer MG2 may include W or Al. In addition, the dummy gate electrode 155c may include a non-metal material, e.g., Si or SiGe. The dummy gate structure 152 may be formed by, for example, a replacement process, but aspects of present inventive concepts are not limited thereto.

The dummy gate structure 152 and the first and second gate structures 151a and 151b may be formed at the same time.

The first spacer 115 may be formed on sidewalls of the first and second gate structures 151a and 151b and sidewalls of the dummy gate structure 152. The first spacer 115 is disposed on the first to third fins F1 to F3 but is not disposed on the recess 143. For example, the first spacer 115 may include at least one of an oxide layer, a nitride layer and an oxynitride layer. Alternatively, the first spacer 115 may include multiple layers, rather than a single layer.

The first to third source/drain regions 121, 123 and 125 may be disposed on both sides of the first and second gate structures 151a and 151 b and the dummy gate structure 152. In other words, the first to third source/drain regions 121, 123 and 125 may be disposed between the first gate structure 151a and the dummy gate structure 152 and between the second gate structure 151b and the dummy gate structure 152. The first to third source/drain regions 121, 123 and 125 may be disposed in the first to third fins F1 to F3, respectively. Therefore, the first to third source/drain regions 121, 123 and 125 may be formed at portions produced by partially etching the first to third fins F1 to F3.

In FIG. 1, the first to third source/drain regions 121, 123 and 125 are illustrated as making contact with one another, but aspects of present inventive concepts are not limited thereto. Rather, the first to third source/drain regions 121, 123 and 125 may be spaced apart from one another.

The first to third source/drain regions 121, 123 and 125 may be elevated source/drain regions. Therefore, top surfaces of the first to third source/drain regions 121, 123 and 125 may be higher than top surfaces of the first to third fins F1 to F3.

When the semiconductor device 1 is a PMOS transistor, the first to third source/drain regions 121, 123 and 125 may include a compressive stress material. For example, the compressive stress material may be a material having a larger lattice constant than silicon (Si), such as, for example, SiGe. The compressive stress material may improve the mobility of carriers of a channel region by applying compressive stress to the first to third fins F1 to F3 under the first and second gate structures 151a and 151b, that is, the channel region.

When the semiconductor device 1 is an NMOS transistor, the first to third source/drain regions 121, 123 and 125 may include the same material as the substrate 101 or a tensile stress material. For example, when the substrate 101 includes Si, the first to third source/drain regions 121, 123 and 125 may include Si or a material having a smaller lattice constant than Si (e.g., SiC or Silicon Phosphide (SiP)).

The first to third source/drain regions 121, 123 and 125 may be formed through epitaxial growth.

The silicide layer 161 is disposed on the first to third source/drain regions 121, 123 and 125. The silicide layer 161 may be formed along the top surfaces of the first to third source/drain regions 121, 123 and 125. The silicide layer 161 may serve to reduce surface resistance or contact resistance of the first to third source/drain regions 121, 123 and 125 and may include a conductive material, for example, Platinum (Pt), Nickel (Ni), or Cobalt (Co).

The contact 163 is formed on the silicide layer 161. The contact 163 may be made of a conductive material, for example, W, Al or Copper (Cu), but is not limited thereto.

The first interlayer insulation layer 131 and the second interlayer insulation layer 132 are sequentially formed on the field insulation layer 110. The first interlayer insulation layer 131 may cover the silicide layer 161 and sidewalls of the first spacer 115 and may cover portions of sidewalls of the contact 163. The second interlayer insulation layer 132 may cover the remaining portions of the sidewalls of the contact 163.

As shown in FIG. 2, a top surface of the first interlayer insulation layer 131 may be coplanarly positioned with the top surfaces of the first and second gate structures 151a and 151b and a top surface of the dummy gate structure 152. The top surface of the first interlayer insulation layer 131, the top surfaces of the first and second gate structures 151a and 151b and the top surface of the dummy gate structure 152 may become parallel with each other through planarization (for example, Chemical Mechanical Planarization/Polishing (CMP)). The second interlayer insulation layer 132 may be formed to cover the first and second gate structures 151a and 151b and the dummy gate structure 152. The first interlayer insulation layer 131 and the second interlayer insulation layer 132 may include at least one of an oxide layer, a nitride layer and an oxynitride layer.

Hereinafter, a semiconductor device 2 according to some embodiments of present inventive concepts will be described with reference to FIG. 5. Referring to the semiconductor device 2, repeated descriptions of the same content as that of the semiconductor device 1 may be omitted, and the following description will focus on differences between the semiconductor devices 1 and 2.

Figure 5:
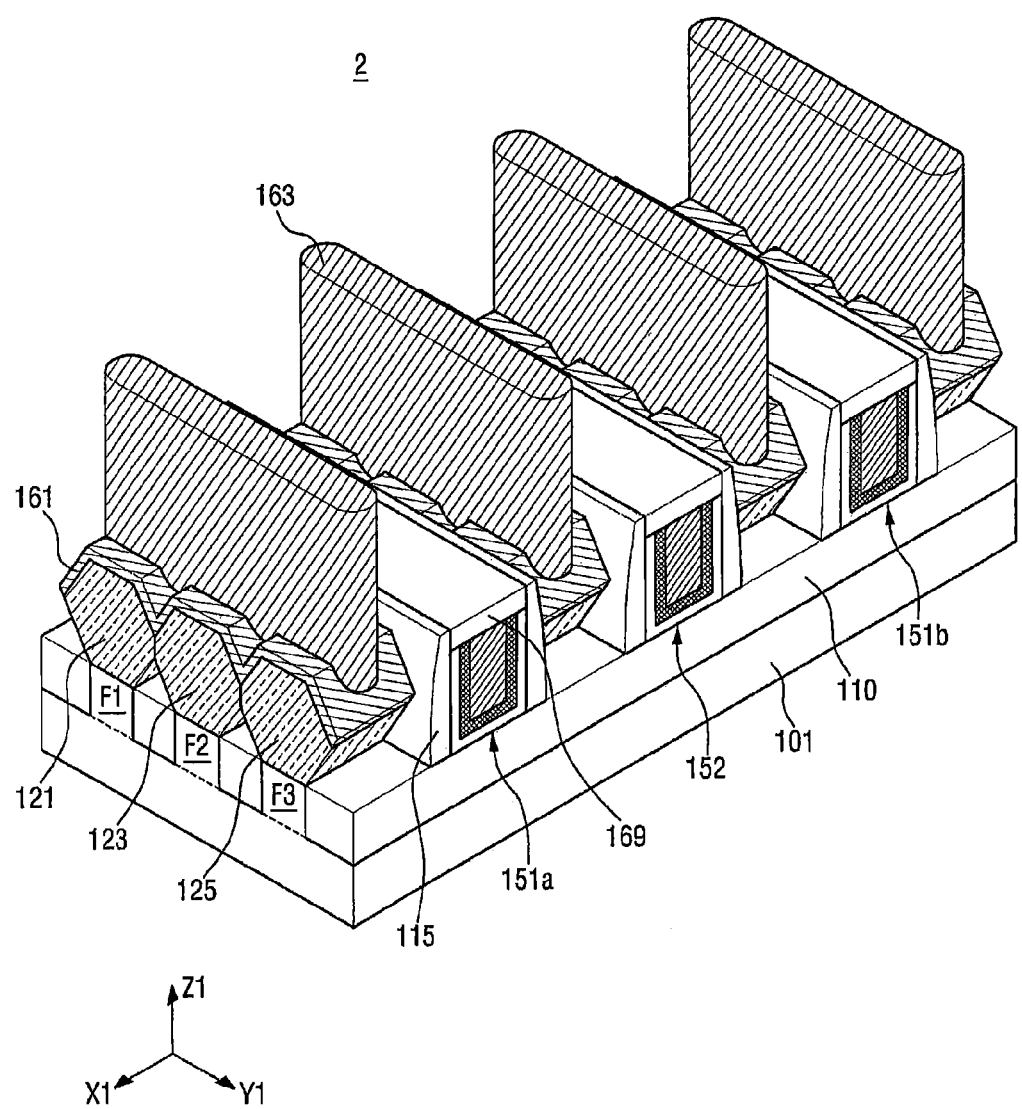
FIG. 5 is a perspective view of a semiconductor device according to some embodiments of present inventive concepts.

FIG. 5 is a perspective view of a semiconductor device 2 according to some embodiments of present inventive concepts. The first and second interlayer insulation layers 131 and 132 may be provided in the semiconductor device 2, even if they are not explicitly illustrated in FIG. 5.

Compared to the semiconductor device 1 shown in FIG. 1, the semiconductor device 2 according to some embodiments of present inventive concepts further includes a cover layer 169. The cover layer 169 may cover top surfaces of a dummy gate structure 152 and first and second gate structures 151a and 151b. The cover layer 169 may extend in a second direction Y1. A first spacer 115 may cover sidewalls of the cover layer 169. In a case where the cover layer 169 is formed, a top surface of the first interlayer insulation layer 131 (e.g., the first interlayer insulation layer 131 illustrated in FIG. 2) may be coplanarly positioned with the top surface of the cover layer 169 and the second interlayer insulation layer 132 (e.g., the second interlayer insulation layer 132 illustrated in FIG. 3) may cover the cover layer 169.

The cover layer 169 may protect the first and second gate structures 151a and 151b and the dummy gate structure 152. For example, even if a contact 163 is misaligned, the cover layer 169 may inhibit/prevent shorts between the contact 163 and the first and second gate structures 151a and 151b and between the contact 163 and the dummy gate structure 152. In addition, deterioration of the first and second gate structures 151a and 151b may be reduced/prevented by the cover layer 169. The cover layer 169 may include, for example, at least one of Silicon Carbonitride (SiCN), Silicon Nitride (SiN), Silicon Oxynitride (SiON), Silicon-Carbon-Oxynitride (SiCON), and Silicon Oxycarbide (SiCO).

Hereinafter, a semiconductor device 3 according to some embodiments of present inventive concepts will be described with reference to FIGS. 6 and 7. In the semiconductor device 3, repeated descriptions of the same content as that of the semiconductor device 1 may be omitted, and the following description will focus on differences between the semiconductor devices 1 and 3.

Figure 6:
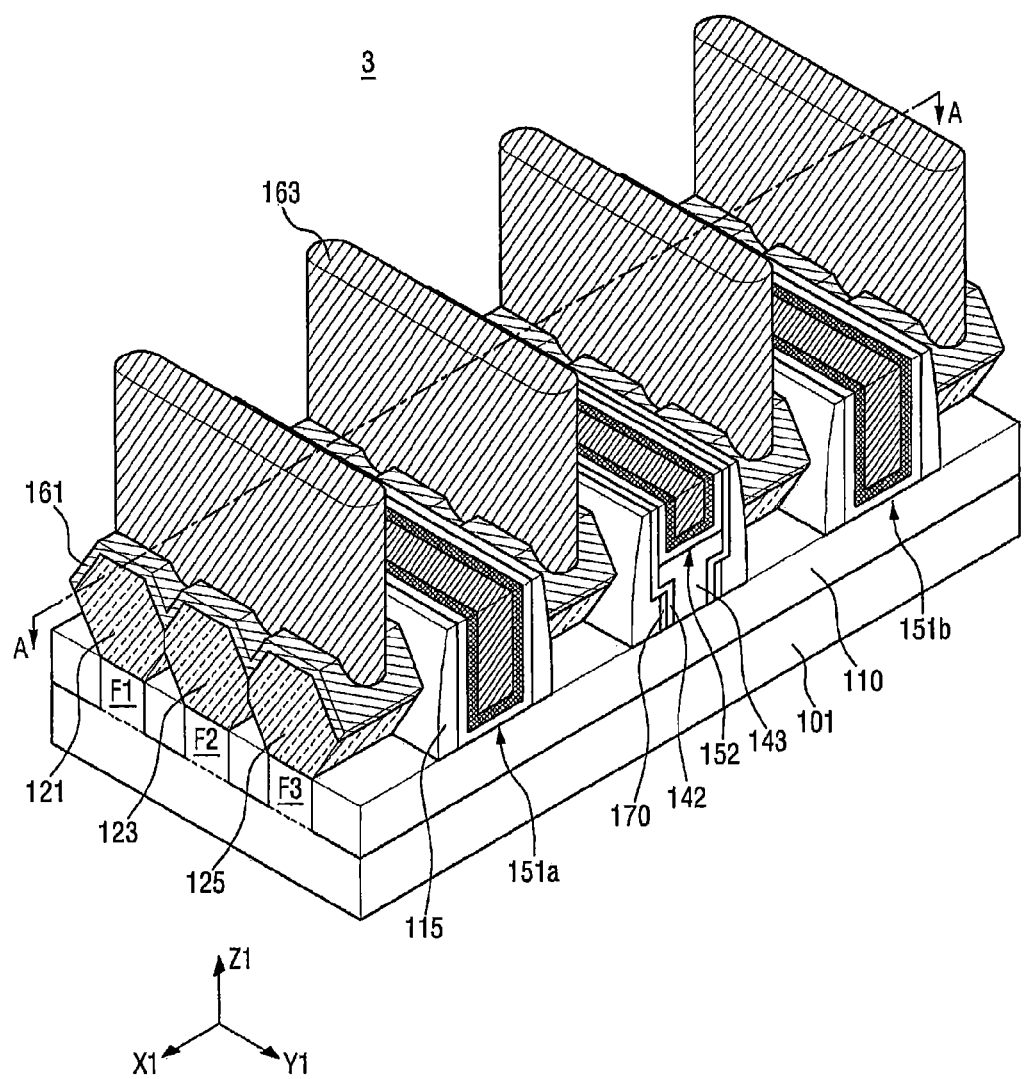
FIG. 6 is a perspective view of a semiconductor device according to some embodiments of present inventive concepts.
Figure 7:
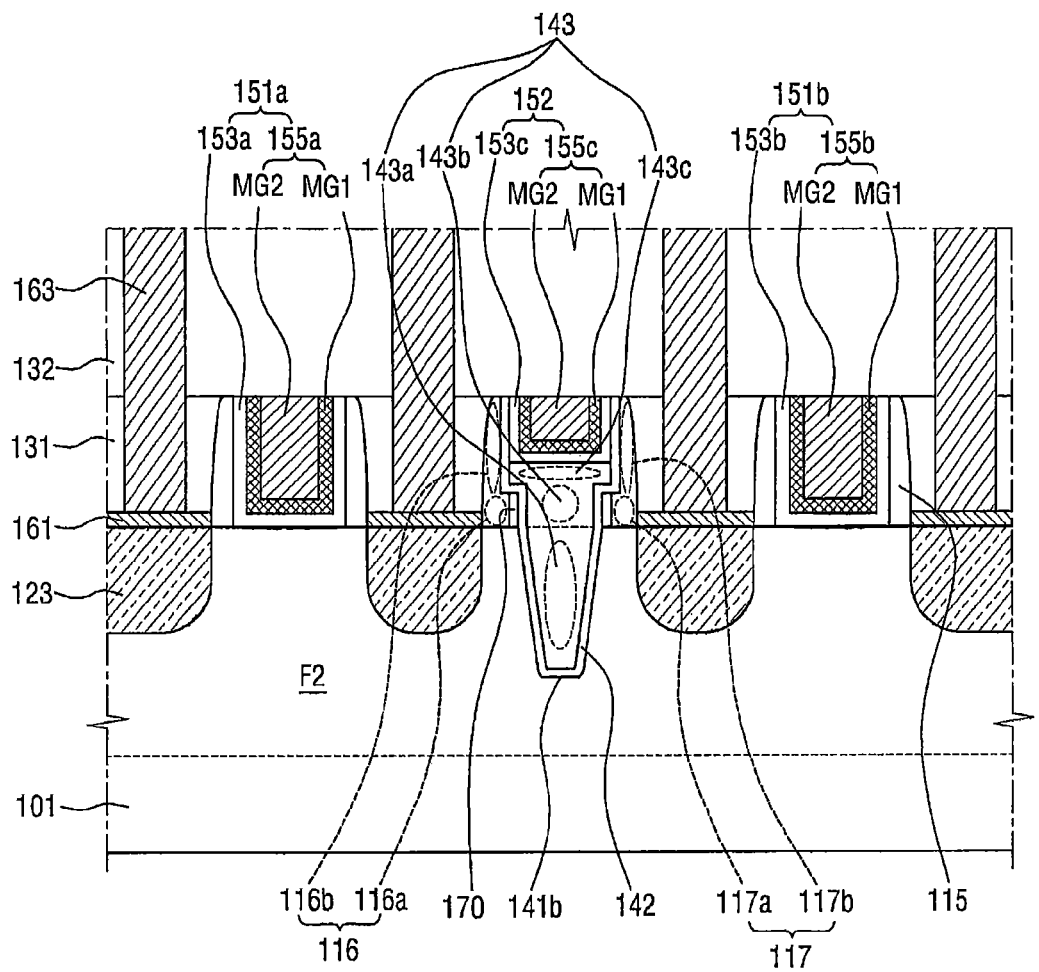
FIG. 7 is a cross-sectional view taken along the line A-A of FIG. 6.

FIG. 6 is a perspective view of a semiconductor device 3 according to some embodiments of present inventive concepts and FIG. 7 is a cross-sectional view taken along the line A-A of FIG. 6. The first and second interlayer insulation layers 131 and 132 may be provided in the semiconductor device 3, even if they are not explicitly illustrated in FIG. 6.

The semiconductor device 3 shown in FIGS. 6 and 7 may be different from the semiconductor device 1 shown in FIG. 1, in view of configurations of a device isolation layer 143, a dummy gate structure 152 and a first spacer 115. In addition, the semiconductor device 3 further includes an inner spacer 170 and a capping layer 142, compared to the semiconductor device 1 shown in FIG. 1.

While the first spacer 115 formed on sidewalls of first and second gate structures 151a and 151b may be the same as that of the semiconductor device 1 shown in FIG. 1, spacers 116 and 117 formed on opposite sidewalls of the dummy gate structure 152 have different structures from each other. In detail, the spacer 116 covering one sidewall of the dummy gate structure 152 and the spacer 117 covering the other sidewall of the dummy gate structure 152 are disposed on first to third fins F1 to F3 while not covering a recess 141b.

The spacers 116 and 117 include first and second regions 116a and 116b and third and fourth regions 117a and 117b, respectively. The second region 116b is disposed on the first region 116a and the fourth region 117b is disposed on the third region 117a. A width of the first region 116a is greater than or equal to a width of the second region 116b, and a width of the third region 117a is greater than or equal to a width of the fourth region 117b. Therefore, the spacers 116 and 117 may have L shapes facing each other. Here, the phrase "facing each other" may mean that a distance between the first region 116a and the third region 117a is shorter than a distance between the second region 116b and the fourth region 117b. In a case where the spacers 116 and 117 do not face each other, the first and third regions 116a and 117a may protrude in opposite directions. Therefore, if the spacers 116 and 117 do not face each other, the distance between the first region 116a and the third region 117a is equal to the distance between the second region 116b and the fourth region 117b.

The inner spacer 170 is formed on inner sidewalls of the spacers 116 and 117. In detail, the inner spacer 170 is formed on sidewalls of the first region 116a and the third region 117a. A height of the inner spacer 170 may be equal to heights of the first and third regions 116a and 117a. A profile of the inner spacer 170 and a profile of the recess 141b may be connected. The inner spacer 170 may include, for example, at least one of an oxide layer, a nitride layer and an oxynitride layer.

The capping layer 142 may be formed between the recess 141b and the device isolation layer 143. The capping layer 142 may be conformally formed along an inner surface of the recess 141b. In addition, the capping layer 142 may extend to be conformally formed along the sidewalls of the spacers 116 and 117. The capping layer 142 may be disposed between each of the spacers 116 and 117 and the dummy gate structure 152. The capping layer 142 may include, for example, at least one of an oxide layer, a nitride layer and an oxynitride layer.

The dummy gate structure 152 is formed on the device isolation layer 142. A bottom surface of the dummy gate structure 152 may be higher than bottom surfaces of the first and second gate structures 151a and 151b. In other words, a top surface of the device isolation layer 143 may be higher than or at the same level with top surfaces of the first to third fins F1 to F3.

When the bottom surface of the dummy gate structure 152 is higher than the bottom surfaces of the first and third regions 116a and 117a, the device isolation layer 143 may have fifth to seventh regions 143a, 143b and 143c. Here, the fifth region 143a of the device isolation layer 143 is a region filling the recess 141b, the sixth region 143b is a region between the first and third regions 116a and 117a disposed on the fifth region 143a, and the seventh region 143c is a region extending from the sixth region 143b to the bottom surface of the dummy gate structure 152. A width of the seventh region 143c is greater than or equal to a width of the sixth region 143b. Therefore, a portion of the first region 116a and a portion of the third region 117a may be disposed between the seventh region 143c and each of the first to third fins F1 to F3. In addition, the first region 116a and the third region 117a may cover a portion of the bottom surface of the dummy gate structure 152. In other words, the portion of the first region 116a and the portion of the third region 117a may be disposed between each of the first to third fins F1 to F3 and the dummy gate structure 152, but aspects of present inventive concepts are not limited thereto. The bottom surface of the dummy gate structure 152 may come into contact with the seventh region 143c.

Since the other parts of the semiconductor device 3 shown in FIGS. 6 and 7 may be the same as those of the semiconductor device 1 shown in FIG. 1, no further description may be given.

Hereinafter, a semiconductor device 4 according to some embodiments of present inventive concepts will be described with reference to FIG. 8. In the semiconductor device 4, repeated descriptions of the same content as that of the semiconductor device 3 may be omitted, and the following description will focus on differences between the semiconductor devices 3 and 4.

Figure 8:
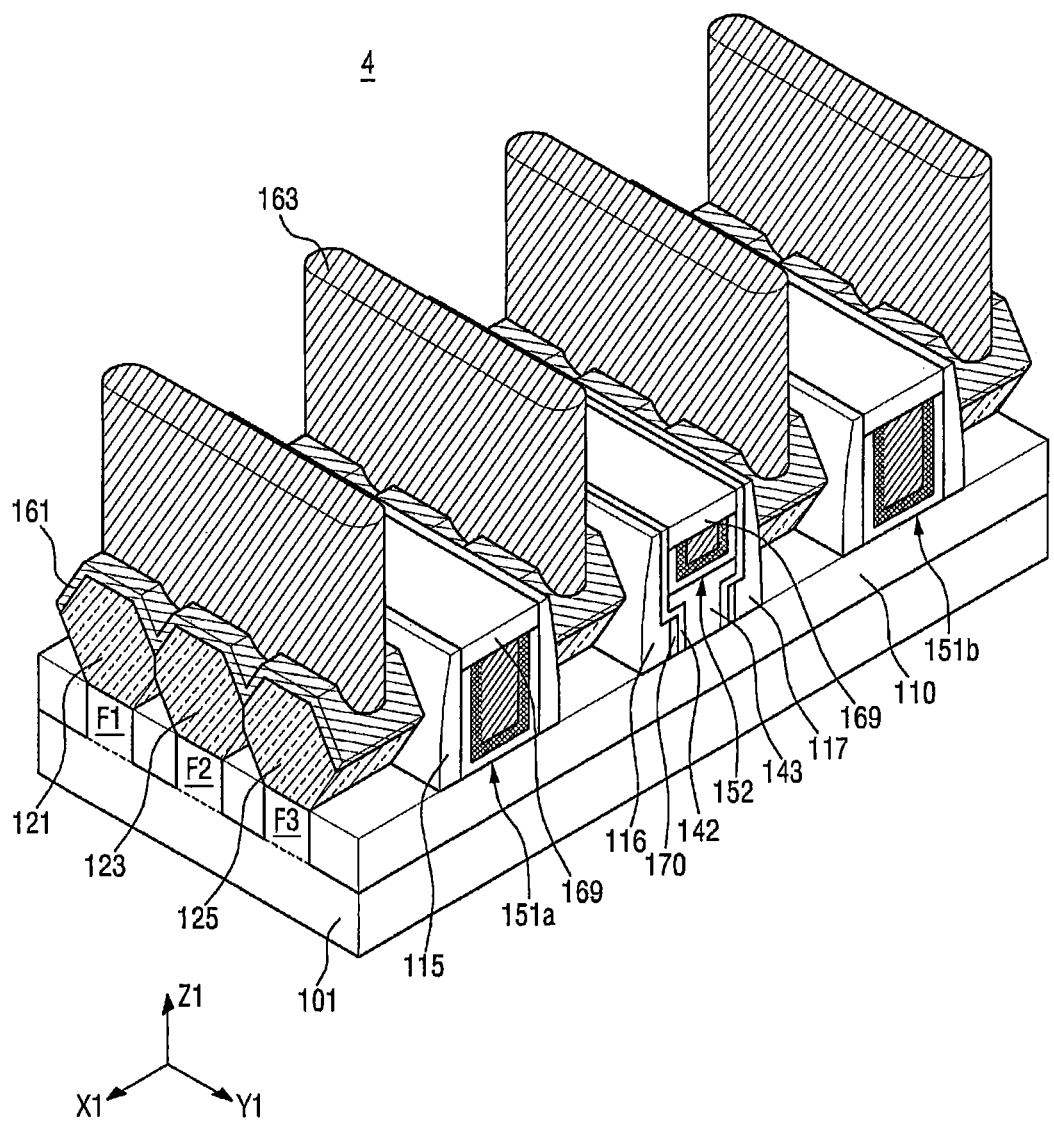
FIG. 8 is a perspective view of a semiconductor device according to some embodiments of present inventive concepts.

FIG. 8 is a perspective view of a semiconductor device 4 according to some embodiments of present inventive concepts. The first and second interlayer insulation layers 131 and 132 may be provided in the semiconductor device 4, even if they are not explicitly illustrated in FIG. 8.

Compared to the semiconductor device 3 shown in FIG. 6, the semiconductor device 4 according to some embodiments of present inventive concepts further includes a cover layer 169. The cover layer 169 may cover top surfaces of a dummy gate structure 152 and first and second gate structures 151a and 151b. A spacer 115 may cover sidewalls of the cover layer 169. In addition, a capping layer 142 may be disposed between the dummy gate structure 152 and each of spacers 116 and 117 disposed at opposite sides of the dummy gate structure 152, while covering sidewalls of the dummy gate structure 152. When the cover layer 169 is formed, a top surface of the first interlayer insulation layer 131 may be coplanarly positioned with a top surface of the cover layer 169, and the second interlayer insulation layer 132 may cover the cover layer 169.

The cover layer 169 may protect the first and second gate structures 151a and 151b and the dummy gate structure 152. The cover layer 169 may include, for example, at least one of SiCN, SiN, SiON, SiCON, and SiCO.

Hereinafter, a semiconductor device 5 according to some embodiments of present inventive concepts will be described with reference to FIGS. 9 and 10. In the semiconductor device 5, repeated descriptions of the same content as that of the semiconductor device 1 may be omitted, and the following description will focus on differences between the semiconductor devices 1 and 5.

Figure 9:
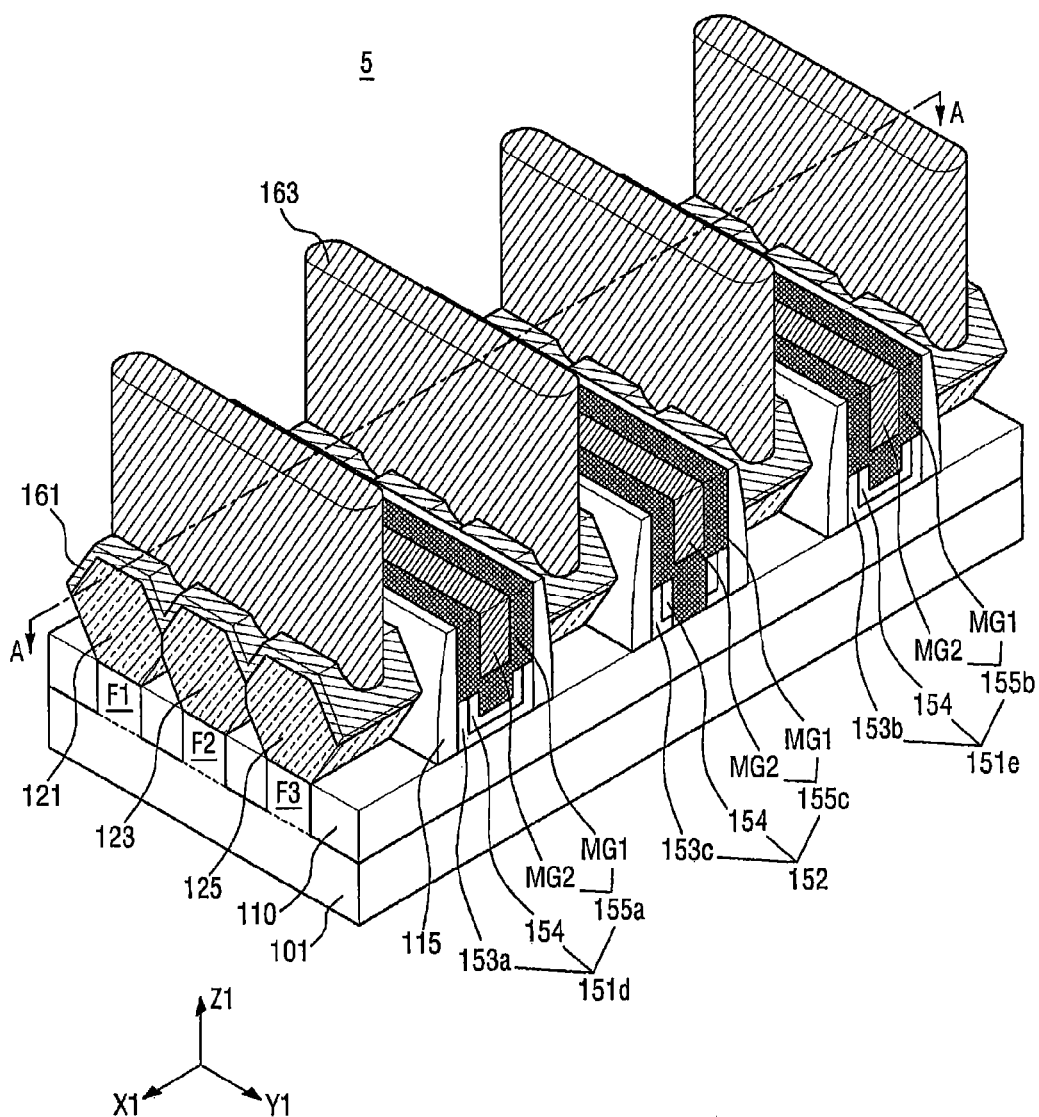
FIG. 9 is a perspective view of a semiconductor device according to some embodiments of present inventive concepts.
Figure 10:
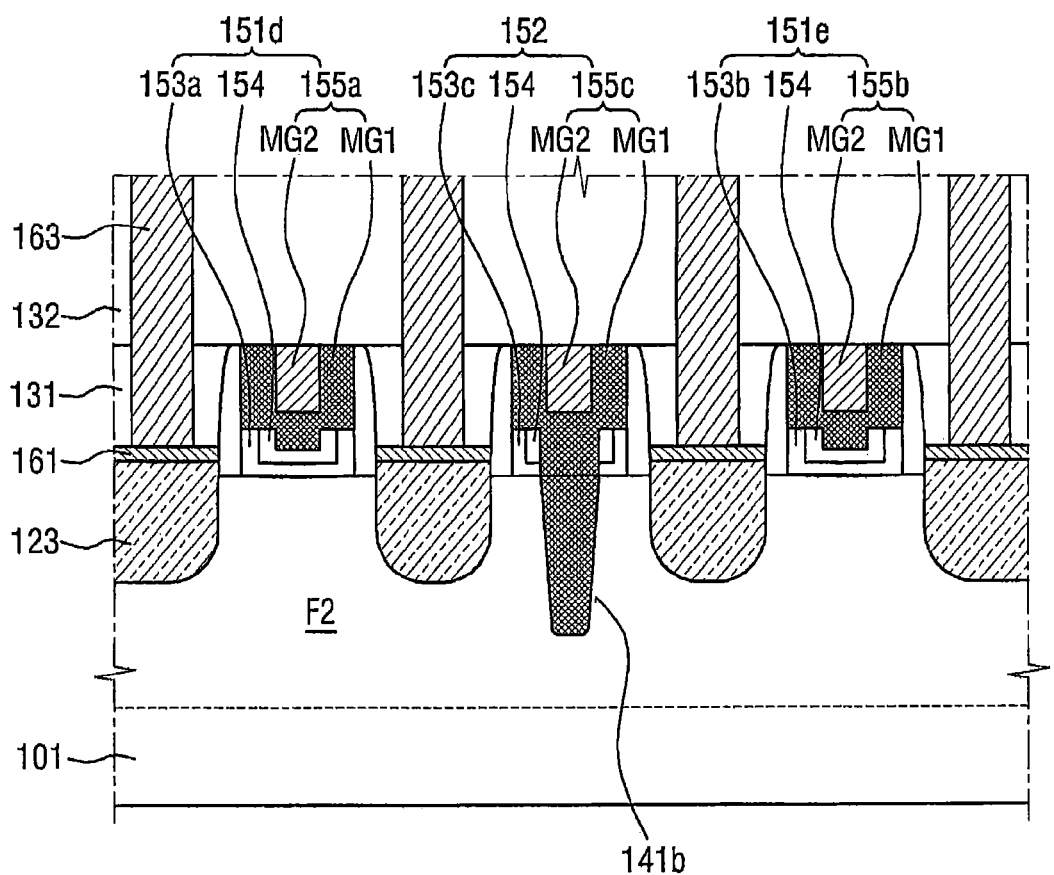
FIG. 10 is a cross-sectional view taken along the line A-A of FIG. 9.

FIG. 9 is a perspective view of a semiconductor device 5 according to some embodiments of present inventive concepts and FIG. 10 is a cross-sectional view taken along the line A-A of FIG. 9.

Unlike the semiconductor device 1 shown in FIG. 1, the semiconductor device 5 according to some embodiments of present inventive concepts is not provided with a device isolation layer 143. Instead, a dummy gate structure 152 fills a recess 141b.

In detail, the dummy gate structure 152 may fill the recess 141b, and a top surface of the dummy gate structure 152 may be coplanarly positioned with top surfaces of first and second gate structures 151d and 151 e.

The first and second gate structures 151d and 151e may include first and second gate insulation layers 153a and 153b, a barrier layer 154, and first and second gate electrodes 155a and 155b, respectively. The first and second gate insulation layers 153a and 153b may cover top surfaces and top portions of sidewalls of first to third fins F1 to F3 and may be conformally formed along sidewalls of the spacer 115 and the sidewalls of the first to third fins F1 to F3, as shown in FIG. 10. However, unlike in the semiconductor device 1 shown in FIG. 1, the first and second gate insulation layers 153a and 153b of FIGS. 9 and 10 do not cover the whole portions of the sidewalls of the spacer 115 but cover only portions of the sidewalls of the spacer 115.

The barrier layer 154 is disposed on each of the first and second gate insulation layers 153a and 153b. The barrier layer 154 may have a concave shape, like the first and second gate insulation layers 153a and 153b. The barrier layer 154 may include, for example, Titanium Nitride (TiN), but is not limited thereto.

The first and second gate electrodes 155a and 155b cover the first and second gate insulation layers 153a and 153b and barrier layers 154, respectively. The first and second gate electrodes 155a and 155b may include first and second metal layers MG1 and MG2.

The dummy gate structure 152 may include the dummy gate insulation layer 153c, the barrier layer 154, and the dummy gate electrode 155c, and the dummy gate electrode 155c may include first and second metal layers MG1 and MG2.

The dummy gate insulation layer 153c is disposed on the sidewalls of the spacer 115 but is not disposed in the recess 141b. The dummy gate insulation layer 153c may have an L shape. The barrier layer 154 is disposed on the dummy gate insulation layer 153c but is not disposed on the recess 141b. A width of the recess 141b is wider than a width of the first spacer 115.

The dummy gate electrode 155c fills the recess 141b and is formed on the recess 141b. For example, the recess 141b may be filled with the first metal layer MG1, and the second metal layer MG2 may be formed on the first metal layer MG1.

Hereinafter, a semiconductor device 6 according to some embodiments of present inventive concepts will be described with reference to FIG. 11. In the semiconductor device 6, repeated descriptions of the same content as that of the semiconductor device 5 may be omitted, and the following description will focus on differences between the semiconductor devices 5 and 6.

Figure 11:
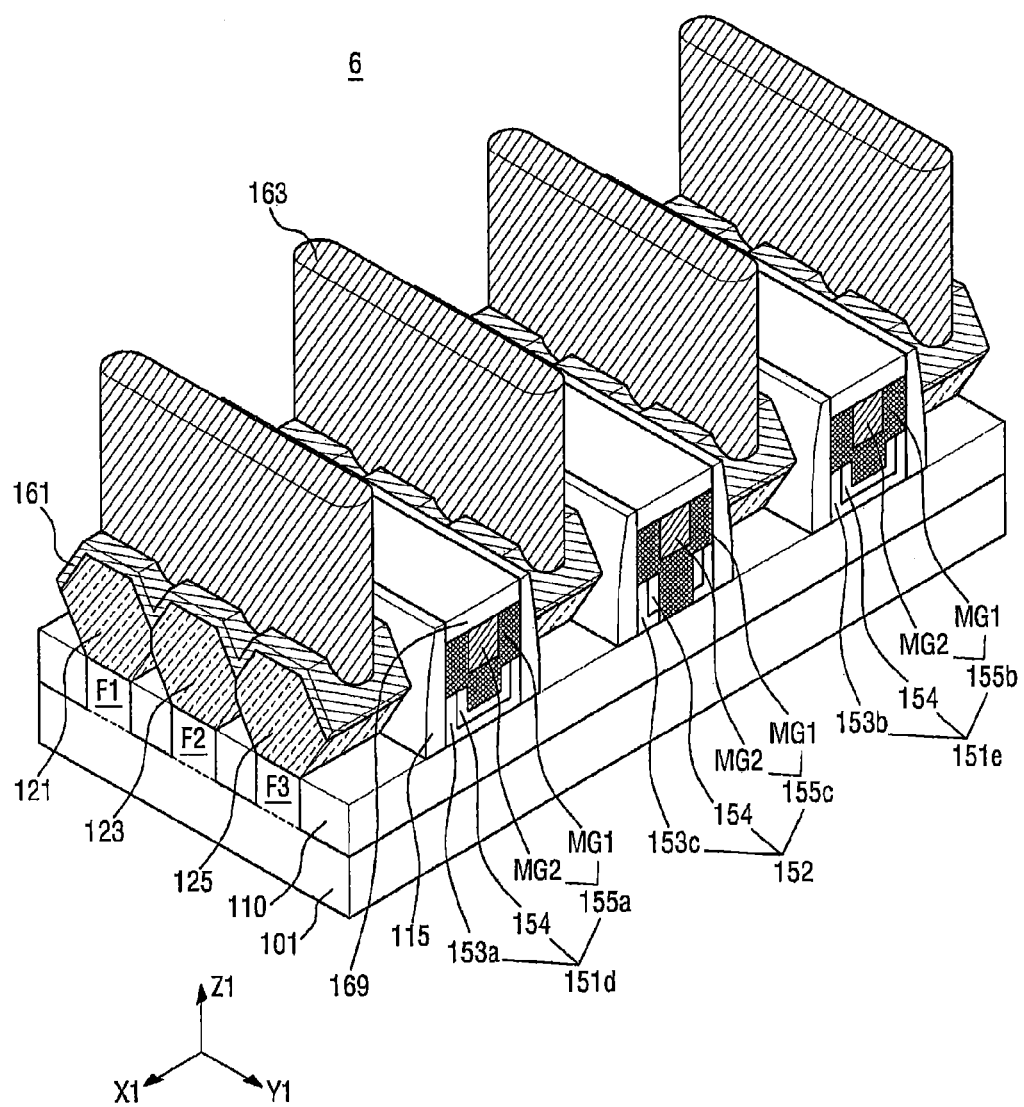
FIG. 11 is a perspective view of a semiconductor device according to some embodiments of present inventive concepts.

FIG. 11 is a perspective view of a semiconductor device 6 according to some embodiments of present inventive concepts. The first and second interlayer insulation layers 131 and 132 may be provided in the semiconductor device 6, even if they are not explicitly illustrated in FIG. 11.

Compared to the semiconductor device 5 shown in FIG. 9, the semiconductor device 6 according to some embodiments of present inventive concepts further includes a cover layer 169. The cover layer 169 may cover top surfaces of a dummy gate structure 152 and first and second gate structures 151a and 151b. A spacer 115 may cover sidewalls of the cover layer 169. When the cover layer 169 is formed, a top surface of the first interlayer insulation layer 131 may be coplanarly positioned with a top surface of the cover layer 169, and the second interlayer insulation layer 132 may cover the cover layer 169.

Hereinafter, a semiconductor device 7 according to some embodiments of present inventive concepts will be described with reference to FIGS. 12A, 12B and 13. In the semiconductor device 7, repeated descriptions of the same content as described above may be omitted, and the following description will focus on differences.

Figure 12A:
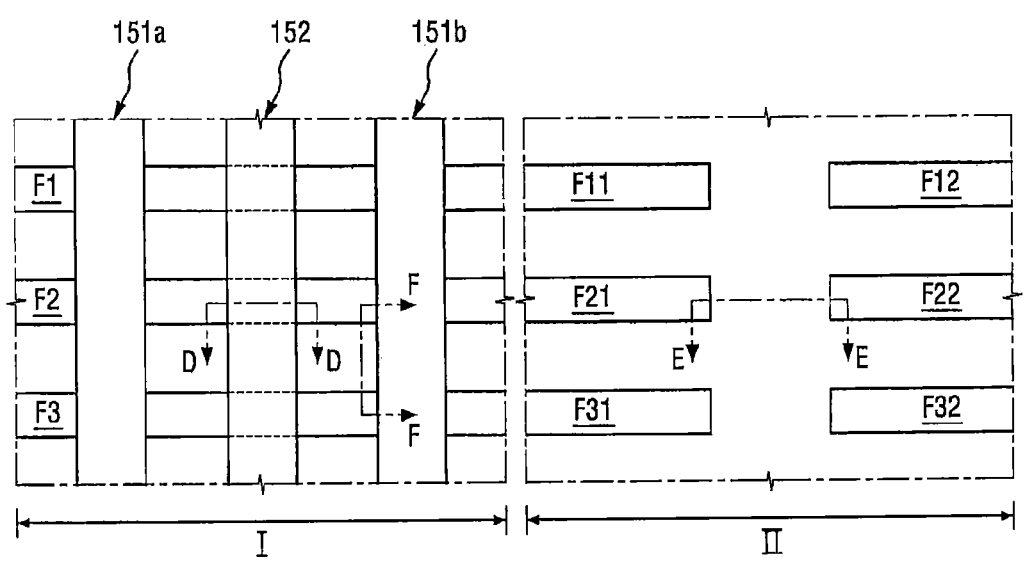
FIGS. 12A and 12B are layout views of a semiconductor device according to some embodiments of present inventive concepts.
Figure 12A:
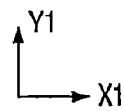
Figure 12B:
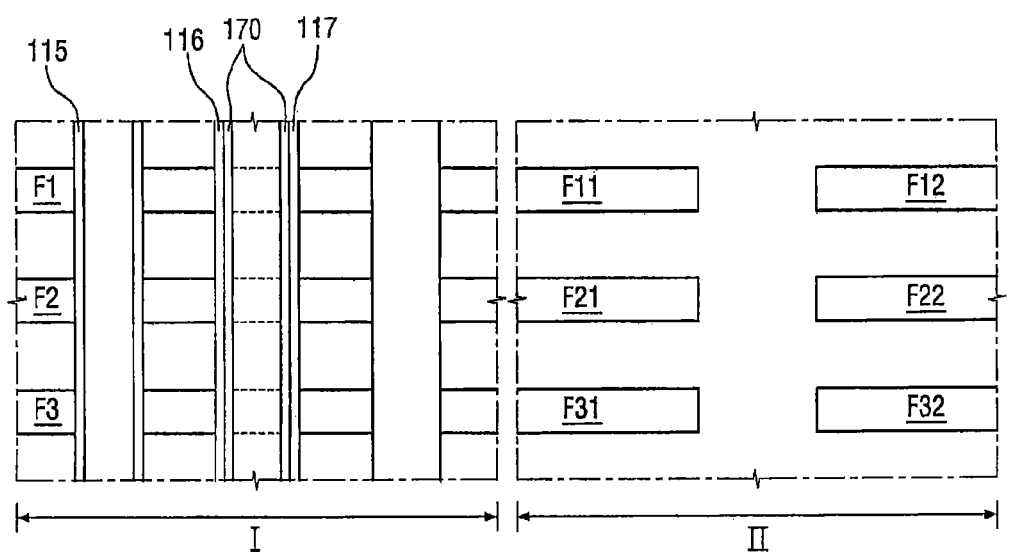
Figure 13:
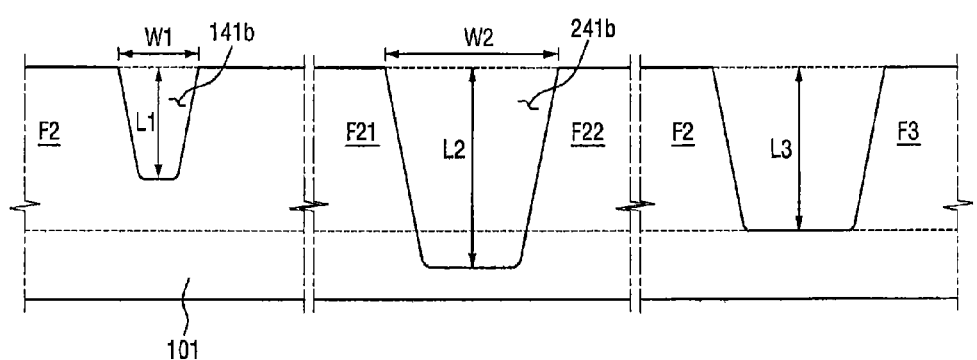
FIG. 13 is a cross-sectional view taken along the lines D-D, E-E and F-F of FIG. 12A.

FIGS. 12A and 12B are layout views of a semiconductor device 7 according to some embodiments of present inventive concepts and FIG. 13 is a cross-sectional view taken along the lines D-D, E-E and F-F of FIG. 12A. In FIG. 12A, only first to third fins F1 to F3, first and second gate structures 151a and 151b and a dummy gate structure 152 are illustrated. In FIG. 12B, spacers 115-117 and an inner spacer 170, rather than first and second gate structures 151a and 151b and a dummy gate structure 152, are illustrated in a first region I shown in FIG. 12A. In FIG. 13, only a second fin F2, a third fin F3, a sixth fin F21, a seventh fin F22 and a substrate 101 are illustrated.

Referring to FIGS. 12A, 12B and 13, a first region I and a second region II are defined on the substrate 101. The first region I and the second region II may be spaced apart from each other or may be connected to each other. The first region I may be the same as that of each of the aforementioned semiconductor devices 1 to 6. Therefore, the first to third fins F1 to F3 may extend in a direction X1 while protruding from the substrate 101. A recess 141b may be formed in each of the first to third fins F1 to F3. The recess 141b may extend in a second direction Y1. The dummy gate structure 152 may be disposed on the recess 141b and may extend in the second direction Y1. In addition, the first spacer 115 and the inner spacer 170 may extend in the second direction Y1 at opposite sides of the dummy gate structure 152. The inner spacer 170 may extend in the second direction Y1 between the first spacer 115 and the dummy gate structure 152. At opposite sides of the first and second gate structures 151a and 151b, only the first spacer 115 extends in the second direction Y1 but the inner spacer 170 is not formed.

In the second region II, fourth to ninth fins F11, F12, F21, F22, F31 and F32 may protrude from the substrate 101. The fourth and fifth fins F11 and F12 may be aligned and extend in the first direction X1 and may be spaced apart from one another by a trench 241b. The sixth and seventh fins F21 and F22 may be aligned and extend in the first direction X1 and may be spaced apart from one another by the trench 241b. The eighth and ninth fins F31 and F32 may be aligned and extend in the first direction X1 and may be spaced apart from one another by the trench 241b. The fourth, sixth and eighth fins F11, F21 and F31 are spaced apart from one another in the second direction Y1, and the fifth, seventh and ninth fins F12, F22 and F32 are spaced apart from one another in the second direction Y1. The trench 241b may extend in the second direction Y1.

A height L1 of the recess 141b is smaller than a height L2 of the trench 241b, and a width W1 of the recess 141b is smaller than a width W2 of the trench 241b. A height L3 of a shallow trench isolation (STI) region between fins, for example, between the second fin F2 and the third fin F3 is greater than the height L1 of the recess 141b and smaller than the height L2 of the trench 241b. The trench 241b may be formed by etching a portion of the substrate 101. The height L3 of the STI region may be equal to heights of the second fin F2 and the third fin F3.

In other words, among the height L1 of the recess 141b, the height L3 of the STI region and the height L2 of the trench 241b, the height L1 of the recess 141b is smallest and the height L2 of the trench 241b is largest.

The recess 141b may be filled with a first device isolation layer (143 of FIGS. 1 to 8) and the trench 241b may be filled with a second device isolation layer. In addition, in the first region I, like in the semiconductor devices 2 to 4, a capping layer 142 may be conformally formed along an inner surface of the recess 141b. However, the capping layer 142 is not formed in the trench 241b of the second region II. The second device isolation layer may include the same material as the first device isolation layer (143 of FIGS. 1 to 8).

The first region I and the second region II may be defined according to the arrangement and operation of a semiconductor device. For example, the first region I may be a memory region and the second region II may be a core/periphery region.

Alternatively, the first region I may be a Static Random Access Memory (SRAM) region and the second region II may be a logic region, but aspects of present inventive concepts are not limited thereto. That is to say, the second region II may be a logic region and the first region I may be a region in which other types of memories, for example, Dynamic Random Access Memory (DRAM), Magnetic/Magnetoresistive Random Access Memory (MRAM), Resistive Random Access Memory (RRAM), Phase-Change Random Access Memory (PRAM), etc., are formed.

Next, a semiconductor device 8 according to some embodiments of present inventive concepts will be described with reference to FIGS. 14 to 16. In the semiconductor device 8, repeated descriptions of the same content as described above may be omitted, and the following description will focus on differences.

Figure 14:
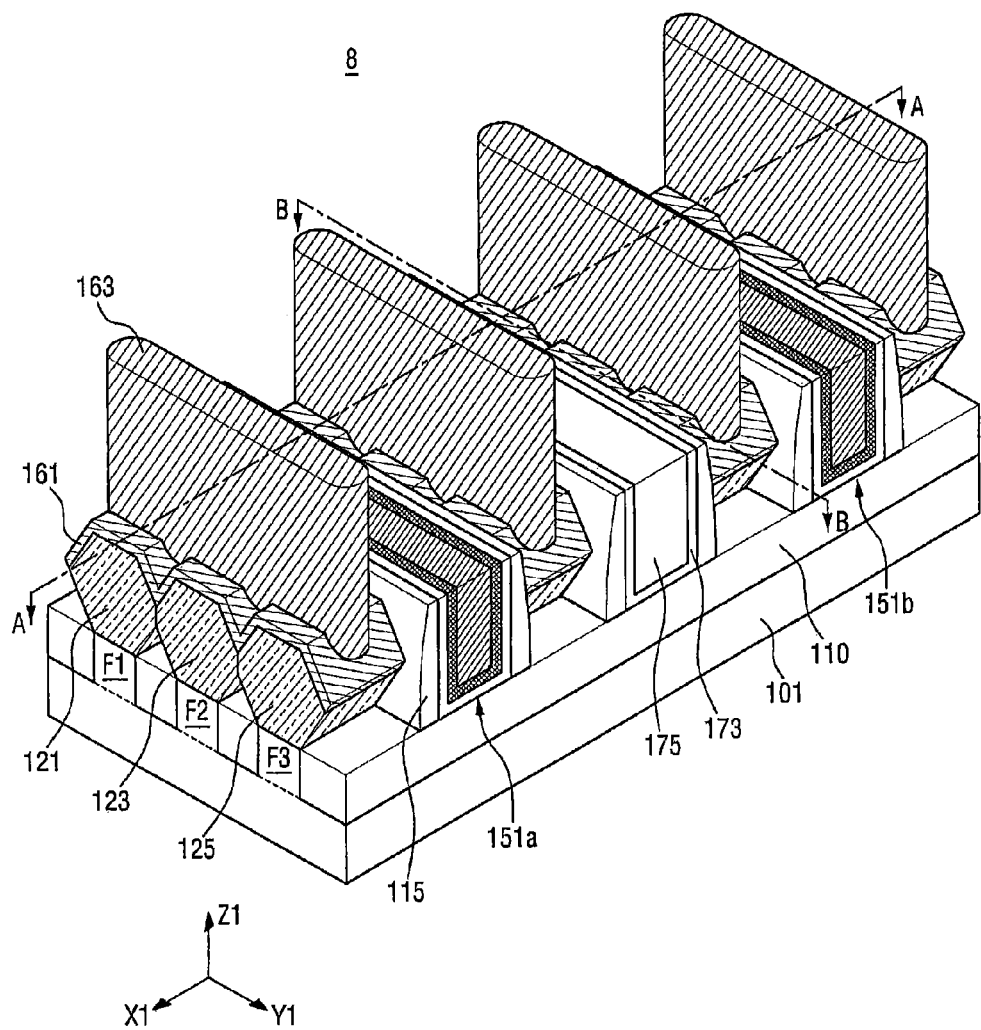
FIG. 14 is a perspective view of a semiconductor device according to some embodiments of present inventive concepts.
Figure 15:
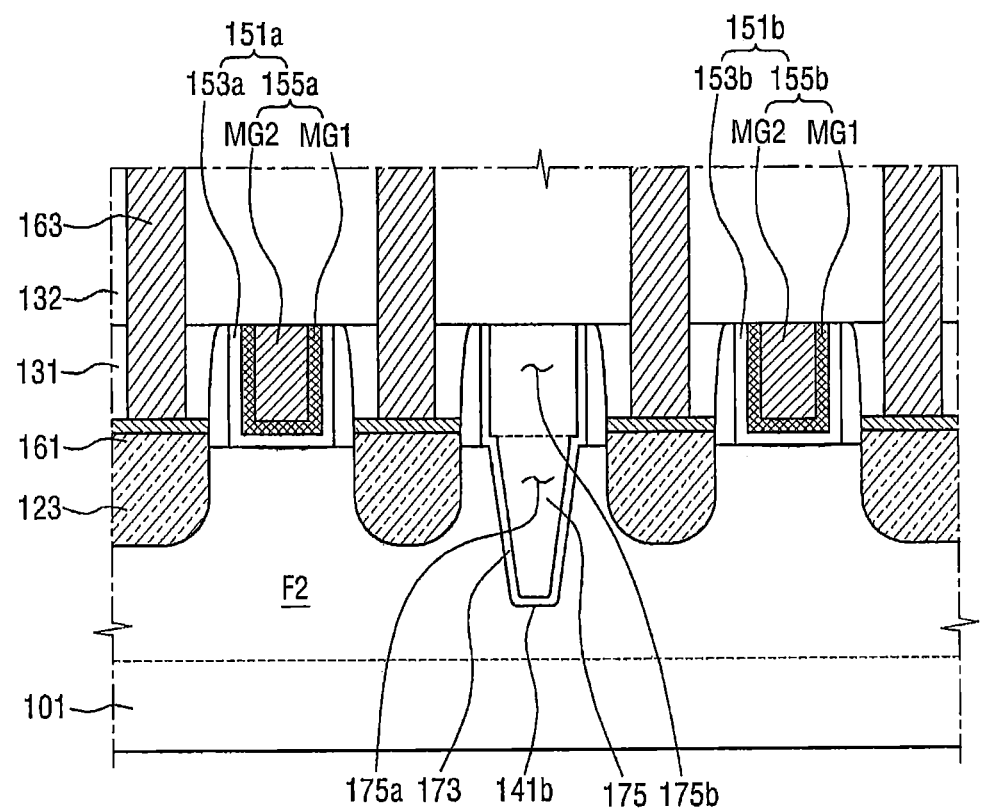
FIG. 15 is a cross-sectional view taken along the line A-A of FIG. 14.
Figure 16:
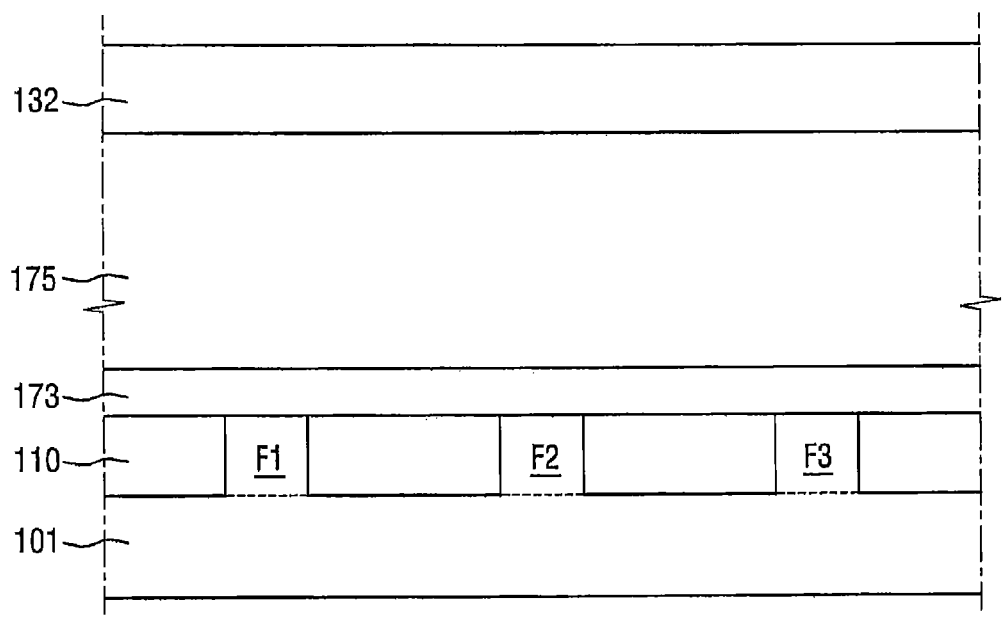
FIG. 16 is a cross-sectional view taken along the line B-B of FIG. 14.

FIG. 14 is a perspective view of a semiconductor device 8 according to some embodiments of present inventive concepts, FIG. 15 is a cross-sectional view taken along the line A-A of FIG. 14, and FIG. 16 is a cross-sectional view taken along the line B-B of FIG. 14. The first and second interlayer insulation layers 131 and 132 may be provided in the semiconductor device 8, even if they are not explicitly illustrated in FIG. 14.

Unlike in the semiconductor device 1 shown in FIG. 1, in the semiconductor device 8 shown in FIG. 14, a dummy gate structure 152 is not formed. Instead, a device isolation layer 175 may fill a region that might otherwise be filled with the dummy gate structure 152.

In detail, referring to FIG. 15, a recess 141b is formed in each of first to third fins F1 to F3. The device isolation layer 175 may fill the recess 141b. A spacer 115 may be disposed on sidewalls of the device isolation layer 175 protruding from the recess 141b. The spacer 115 is disposed on the first to third fins F1 to F3 but is not formed on the recess 141b.

The device isolation layer 175 may include, for example, at least one of silicon oxide, silicon nitride, silicon oxynitride, hafnium oxide, lanthanum oxide, polysilicon, germanium, germanium oxide, titanium oxide, and tungsten oxide.

A capping layer 173 may be formed between the recess 141b and the device isolation layer 175. The capping layer 173 may be conformally formed along sidewalls of a first spacer 115, top surfaces of the first to third fins F1 to F3, and an inner surface of the recess 141b. The capping layer 173 may be disposed on the first to third fins F1 to F3 and a field insulation layer 110.

The capping layer 173 may include, for example, at least one of silicon oxide, silicon nitride, silicon oxynitride, Hf oxide, La oxide, polysilicon, Ge, Ge oxide, Ti oxide, and W oxide.

Meanwhile, a second capping layer (e.g., the second capping layer 174 illustrated in FIG. 19) may be additionally formed between the capping layer 173 and the device isolation layer 175. The second capping layer 174 is described in greater detail with respect to FIG. 19.

A profile of the first spacer 115 and a profile of the recess 141b are not connected.

The device isolation layer 175 may include a first region 175a in the recess 141b and a second region 175b on the recess 141b, and a width of the first region 175a may be smaller than a width of the second region 175b. A top surface of the device isolation layer 175 and top surfaces of the first and second gate structures 151a and 151b may be coplanarly positioned with each other.

Hereinafter, a semiconductor device 9a according to some embodiments of present inventive concepts will be described with reference to FIGS. 17 and 18. In the semiconductor device 9a, repeated descriptions of the same content as described above may be omitted, and the following description will focus on differences.

Figure 17:
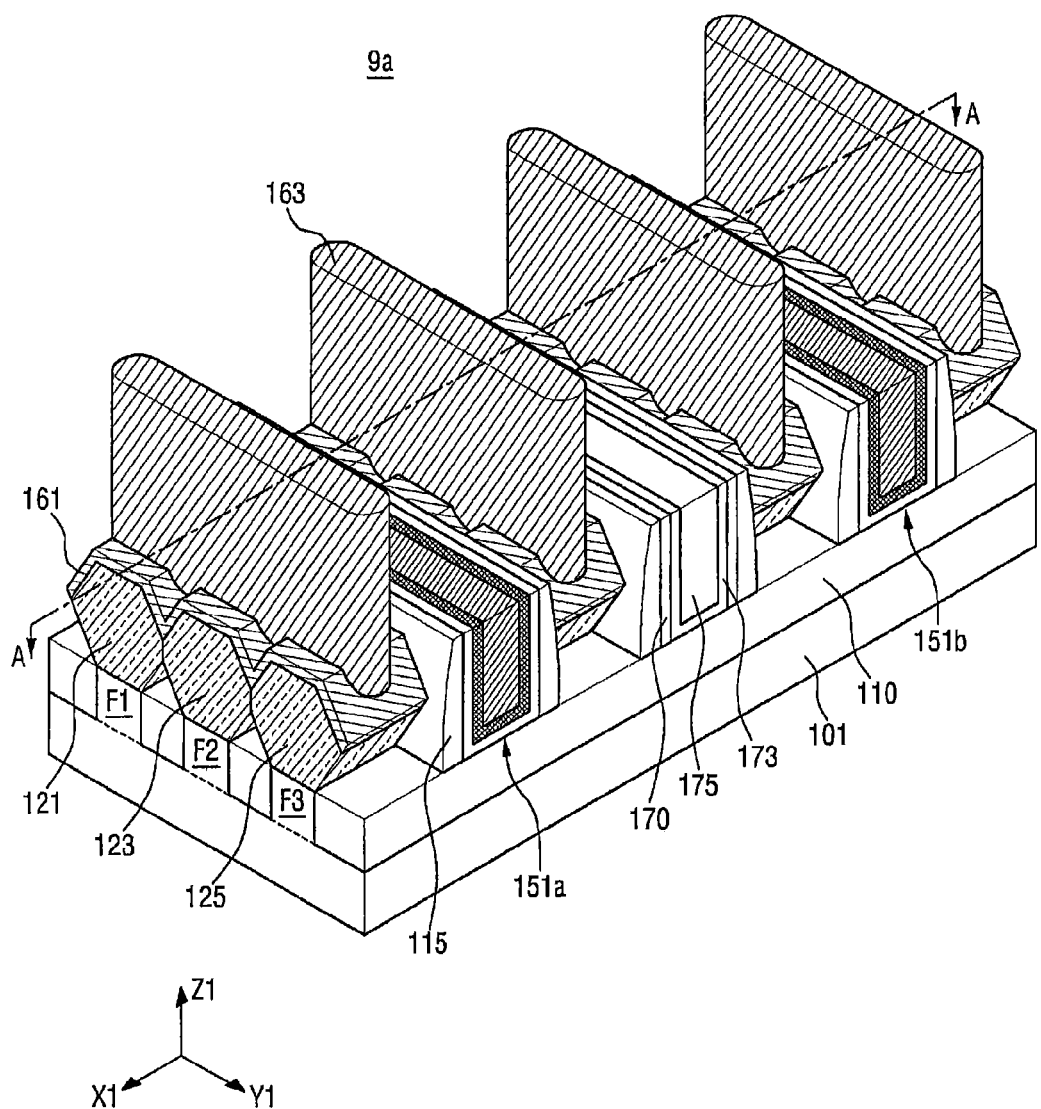
FIG. 17 is a perspective view of a semiconductor device according to some embodiments of present inventive concepts.
Figure 18:
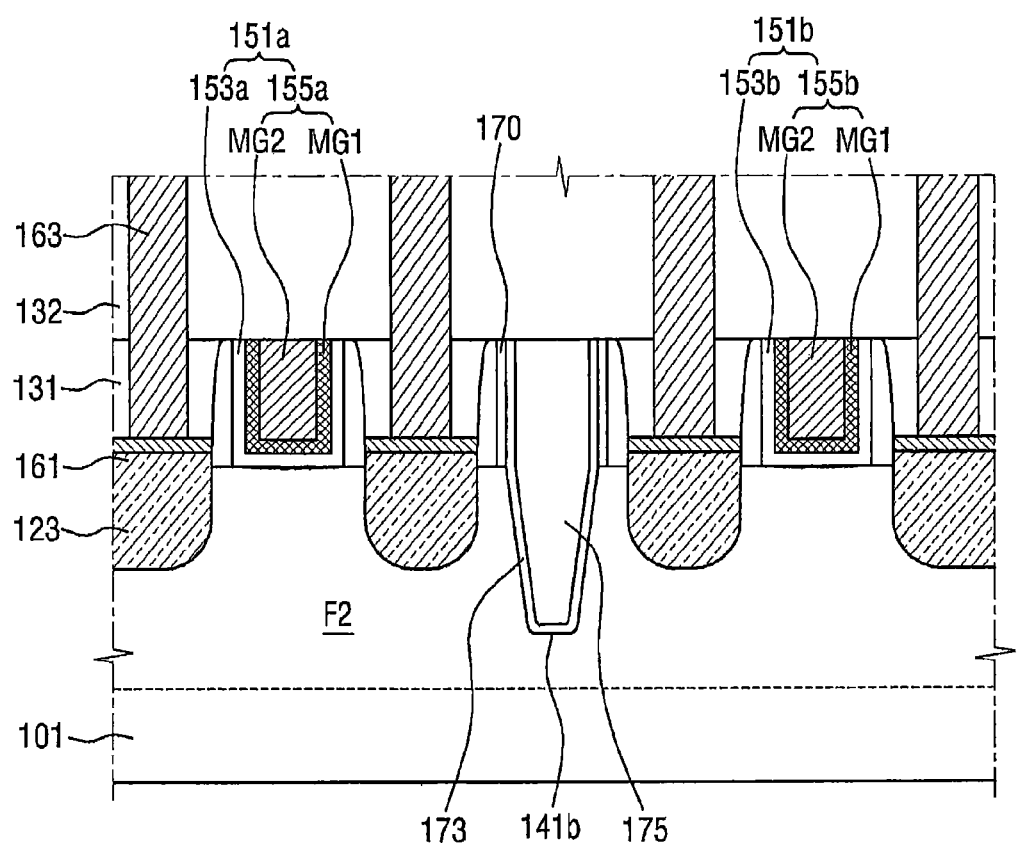
FIG. 18 is a cross-sectional view taken along the line A-A of FIG. 17.

FIG. 17 is a perspective view of a semiconductor device 9a according to some embodiments of present inventive concepts and FIG. 18 is a cross-sectional view taken along the line A-A of FIG. 17. The first and second interlayer insulation layers 131 and 132 may be provided in the semiconductor device 9a, even if they are not explicitly illustrated in FIG. 17.

Referring to FIGS. 17 and 18, compared to the semiconductor device 8 shown in FIG. 14, the semiconductor device 9a shown in FIG. 17 further includes an inner spacer 170. The inner spacer 170 may be disposed between a device isolation layer 175 and a first spacer 115. In detail, the inner spacer 170 is formed on sidewalls of the first spacer 115. A profile of the inner spacer 170 and a profile of a recess 141b are connected. A capping layer 173 may be conformally formed along inner surfaces of the inner spacer 170 and the recess 141b, and the device isolation layer 175 may be formed on the capping layer 173. A top surface of the device isolation layer 175 and top surfaces of the first and second gate structures 151a and 151b may be coplanarly positioned with each other. The first spacer 115 and the inner spacer 170 may have the same height.

Hereinafter, a semiconductor device 9b according to some embodiments of present inventive concepts will be described with reference to FIGS. 19 and 20. In the semiconductor device 9b, repeated descriptions of the same content as described above may be omitted, and the following description will focus on differences.

Figure 19:
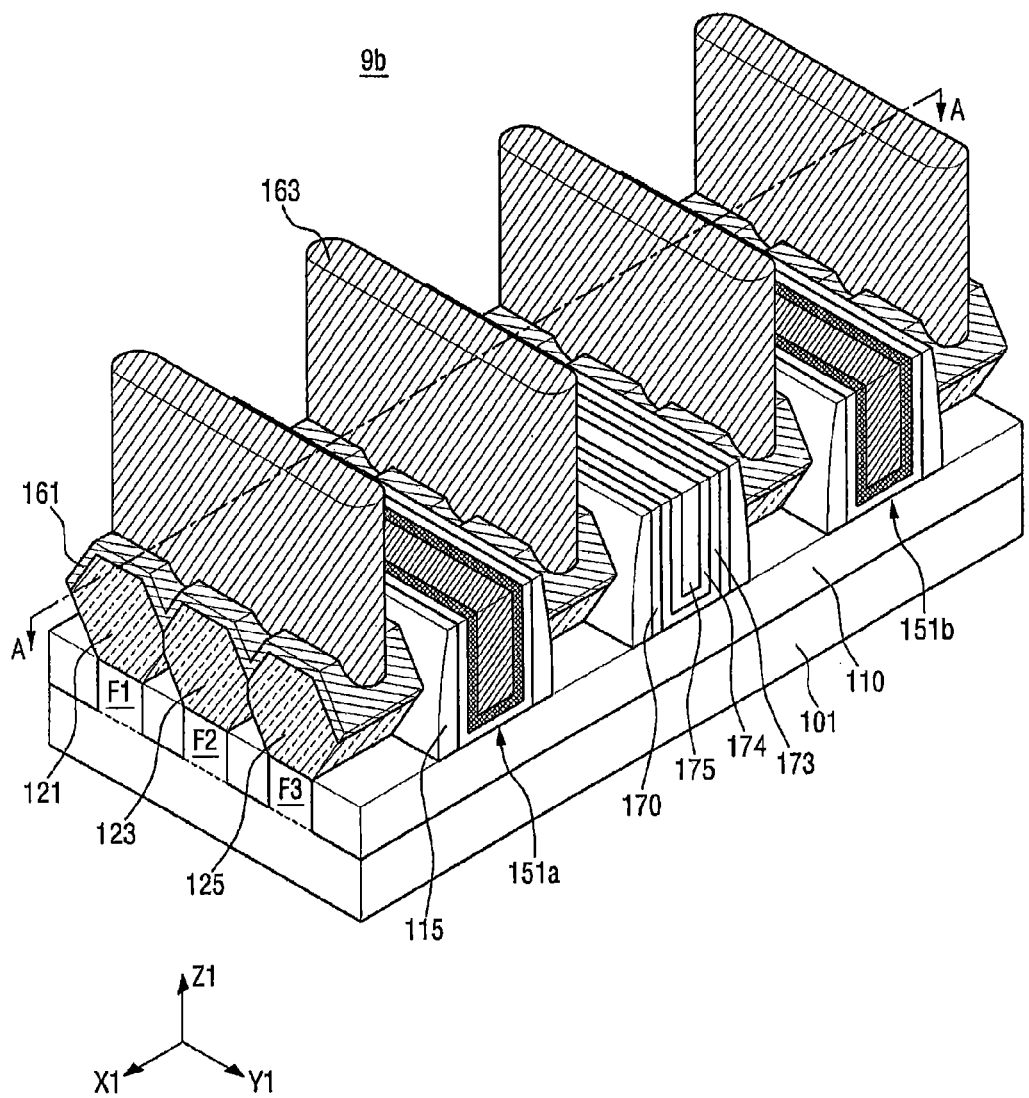
FIG. 19 is a perspective view of a semiconductor device according to some embodiments of present inventive concepts.
Figure 20:
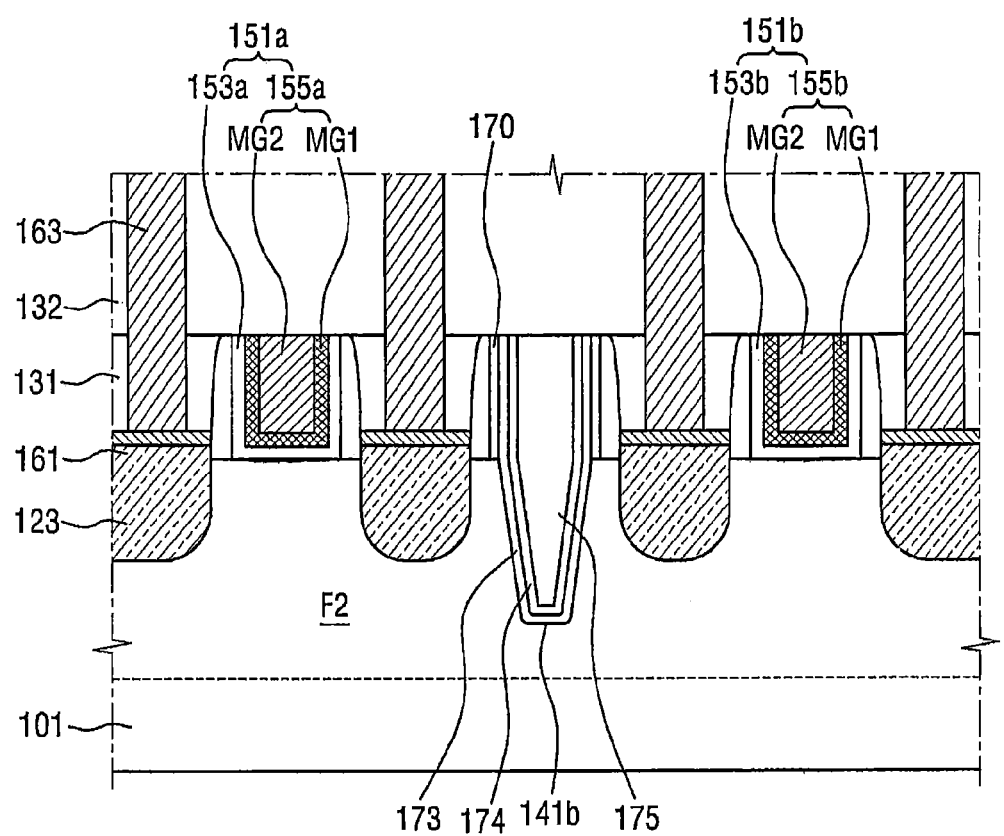
FIG. 20 is a cross-sectional view taken along the line A-A of FIG. 19.

FIG. 19 is a perspective view of a semiconductor device 9b according to some embodiments of present inventive concepts and FIG. 20 is a cross-sectional view taken along the line A-A of FIG. 19. The first and second interlayer insulation layers 131 and 132 may be provided in the semiconductor device 9b, even if they are not explicitly illustrated in FIG. 19.

Compared to the semiconductor device 9a shown in FIG. 17, the semiconductor device 9b according to FIGS. 19 and 20 further includes a second capping layer 174. The second capping layer 174 is formed between a first capping layer 173 and a device isolation layer 175 and may be conformally formed along inner surfaces of an inner spacer 170 and a recess 141b.

The second capping layer 174 may include, for example, at least one of silicon oxide, silicon nitride, silicon oxynitride, Hf oxide, La oxide, polysilicon, Ge, Ge oxide, Ti oxide, and W oxide.

Hereinafter, a semiconductor device 9c according to some embodiments of present inventive concepts will be described with reference to FIGS. 21 and 22. In the semiconductor device 9c, repeated descriptions of the same content as described above may be omitted, and the following description will focus on differences.

Figure 21:
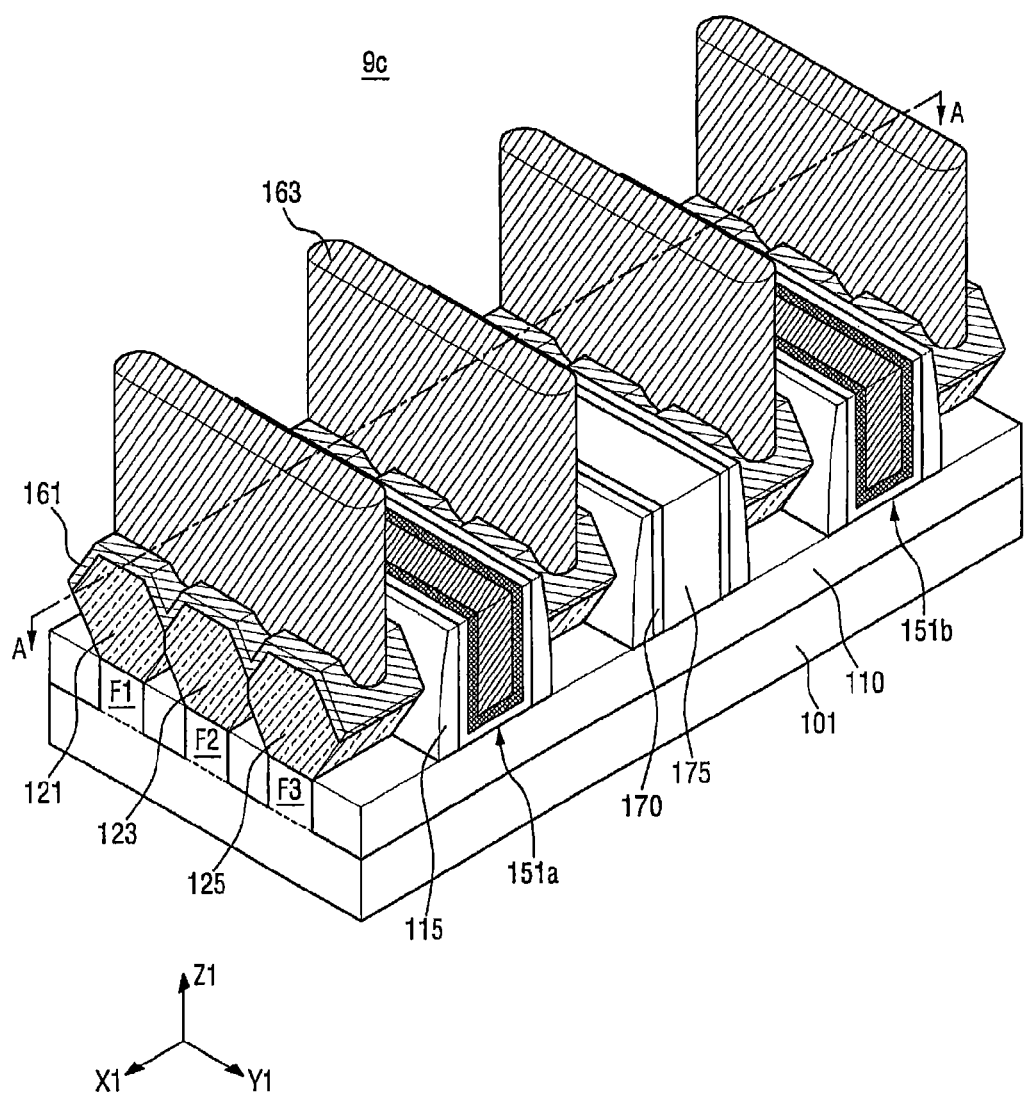
FIG. 21 is a perspective view of a semiconductor device according to some embodiments of present inventive concepts.
Figure 22:
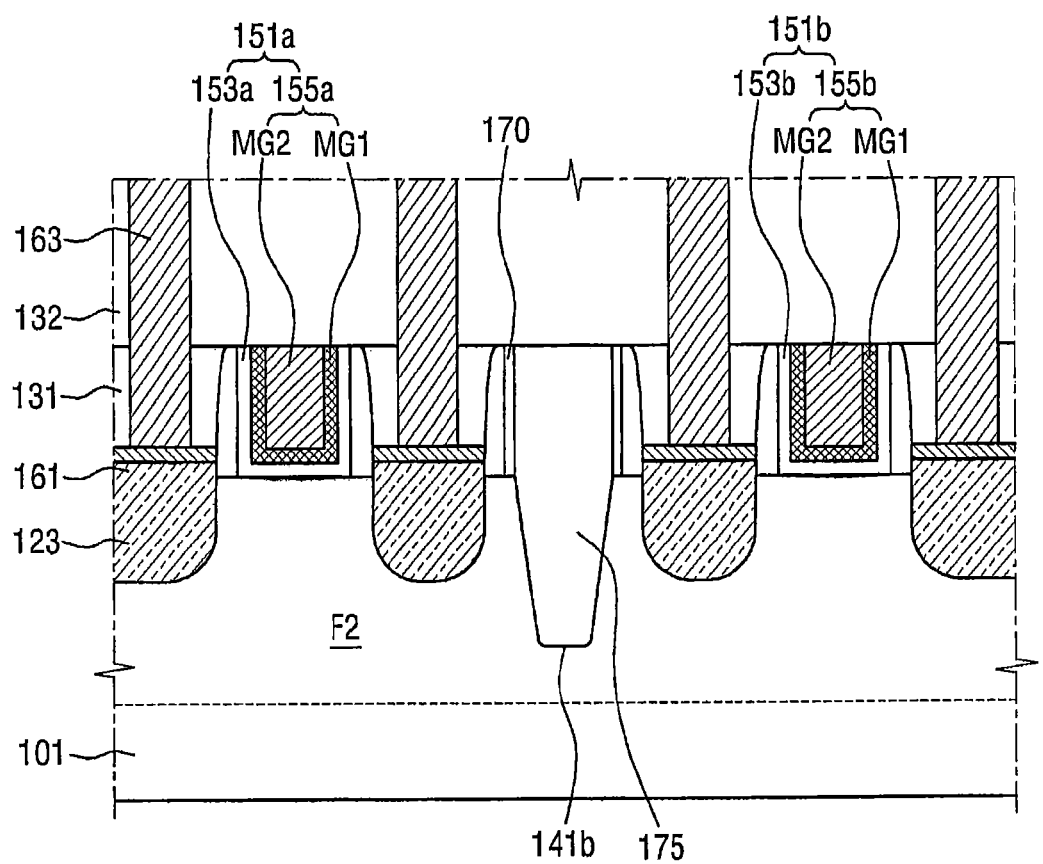
FIG. 22 is a cross-sectional view taken along the line A-A of FIG. 21.

FIG. 21 is a perspective view of a semiconductor device 9c according to some embodiments of present inventive concepts and FIG. 22 is a cross-sectional view taken along the line A-A of FIG. 21. The first and second interlayer insulation layers 131 and 132 may be provided in the semiconductor device 9c, even if they are not explicitly illustrated in FIG. 21.

Unlike in the semiconductor device 9a shown in FIG. 17, the semiconductor device 9c according to FIGS. 21 and 22 is not provided with a capping layer 173. A device isolation layer 175 may directly fill a recess 141b.

A top surface of the device isolation layer 175 and top surfaces of first and second gate structures 151a and 151b may be coplanarly positioned with each other.

Hereinafter, a semiconductor device 10 according to some embodiments of present inventive concepts will be described with reference to FIGS. 23 and 24. In the semiconductor device 10, repeated descriptions of the same content as described above may be omitted, and the following description will focus on differences.

Figure 23:
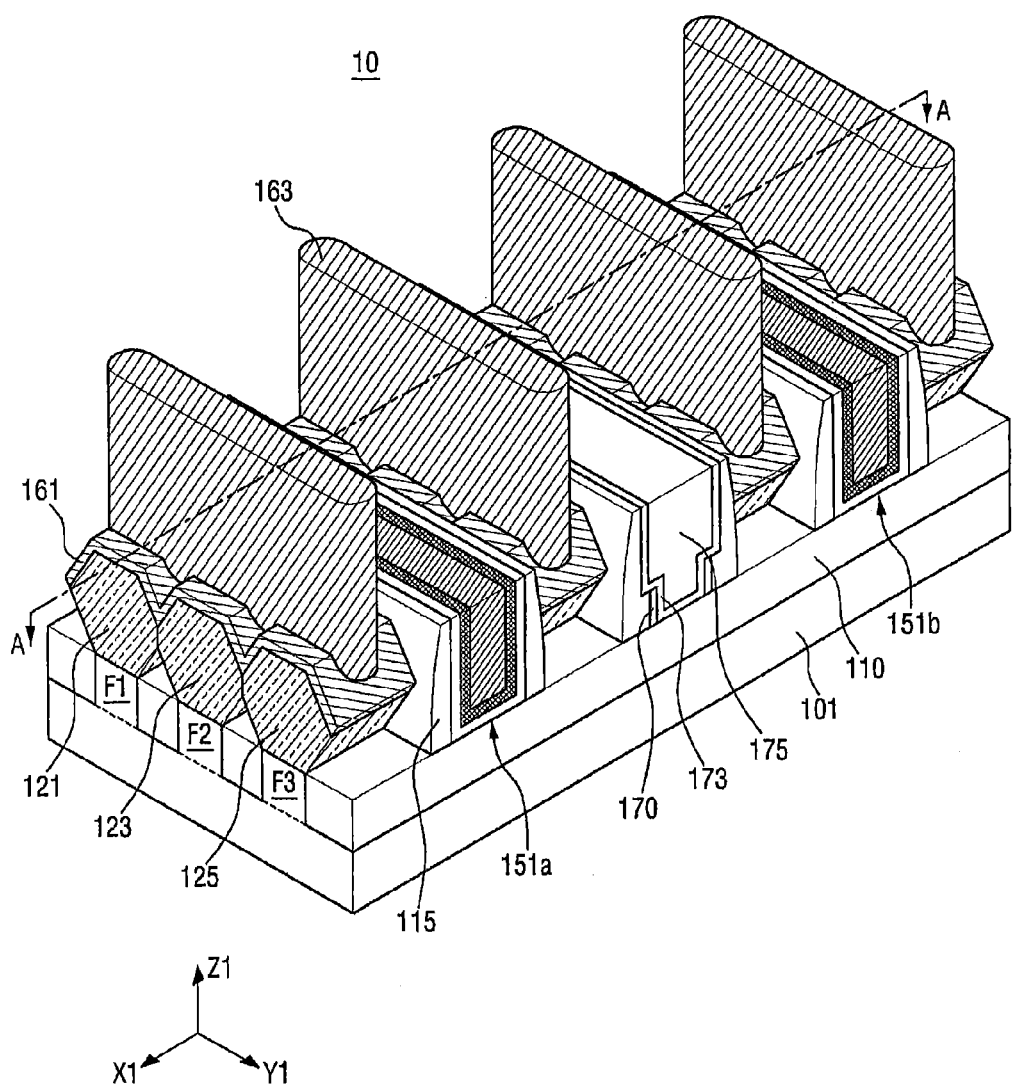
FIG. 23 is a perspective view of a semiconductor device according to some embodiments of present inventive concepts.
Figure 24:
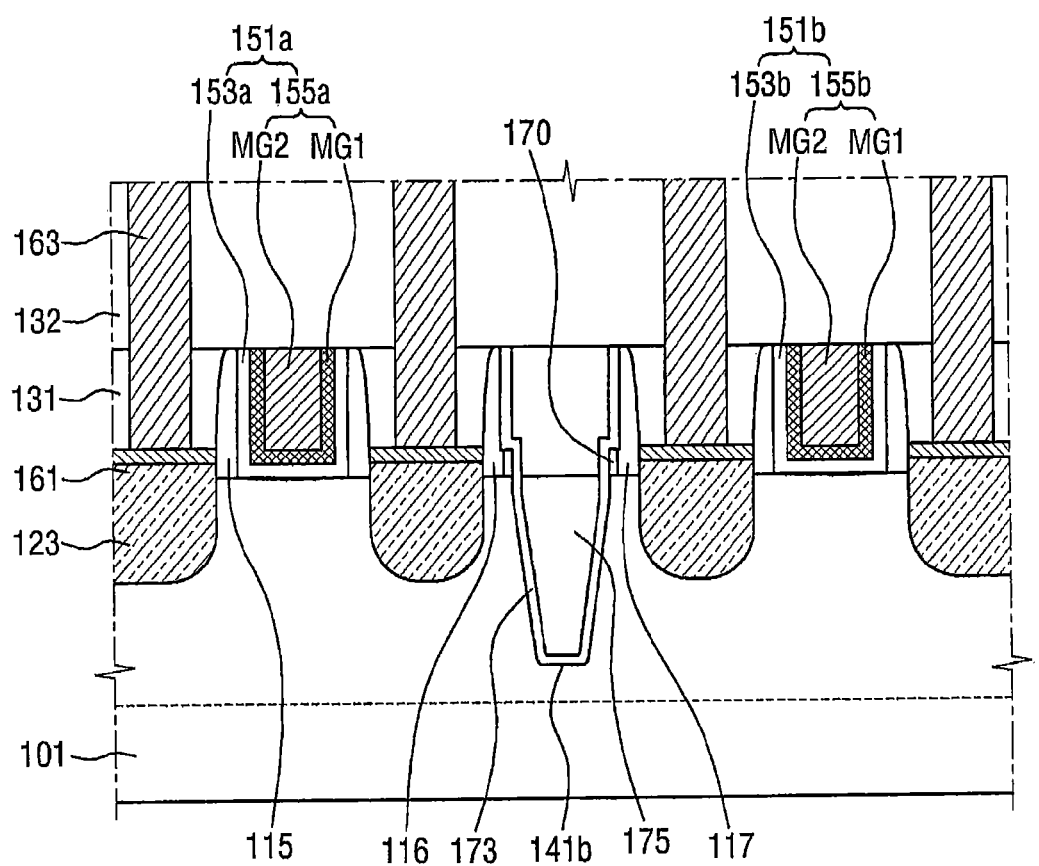
FIG. 24 is a cross-sectional view taken along the line A-A of FIG. 23.

FIG. 23 is a perspective view of a semiconductor device 10 according to some embodiments of present inventive concepts and FIG. 24 is a cross-sectional view taken along the line A-A of FIG. 23. The first and second interlayer insulation layers 131 and 132 may be provided in the semiconductor device 10, even if they are not explicitly illustrated in FIG. 23.

Compared to the semiconductor device 3 shown in FIG. 6, the semiconductor device 10 shown in FIG. 23 is shaped such that the dummy gate structure 152 is removed/omitted. In FIG. 23, an inner spacer 170 and a capping layer 173 correspond to the inner spacer 170 and the capping layer 142 shown in FIG. 6, respectively. Moreover, in FIG. 23, a region that might otherwise include the dummy gate structure 152 is filled by the device isolation layer 175. Therefore, in FIGS. 23 and 24, a top surface of the device isolation layer 175 and top surfaces of first and second gate structures 151a and 151b are coplanarly positioned with each other.

Spacers 116 and 117 disposed at opposite sides of the device isolation layer 175 and the inner spacer 170 shown in FIGS. 23 and 24 are the same as the spacers 116 and 117 disposed at opposite sides of the dummy gate structure 152 and the inner spacer 170 shown in FIGS. 6 and 7, respectively. Therefore, a height of the inner spacer 170 may be smaller than a height of the spacer 116, the spacer 116 may have an L shape, top and bottom widths of the spacer 116 disposed on the sidewall of the device isolation layer 175 may be different from each other, and top and bottom widths of the device isolation layer 175 positioned on a recess 141b may also be different from each other, which have been described above in detail and detailed descriptions thereof will not be given.

Hereinafter, a semiconductor device 11 according to some embodiments of present inventive concepts will be described with reference to FIGS. 25 and 26. In the semiconductor device 11, repeated descriptions of the same content as described above may be omitted, and the following description will focus on differences.

Figure 25:
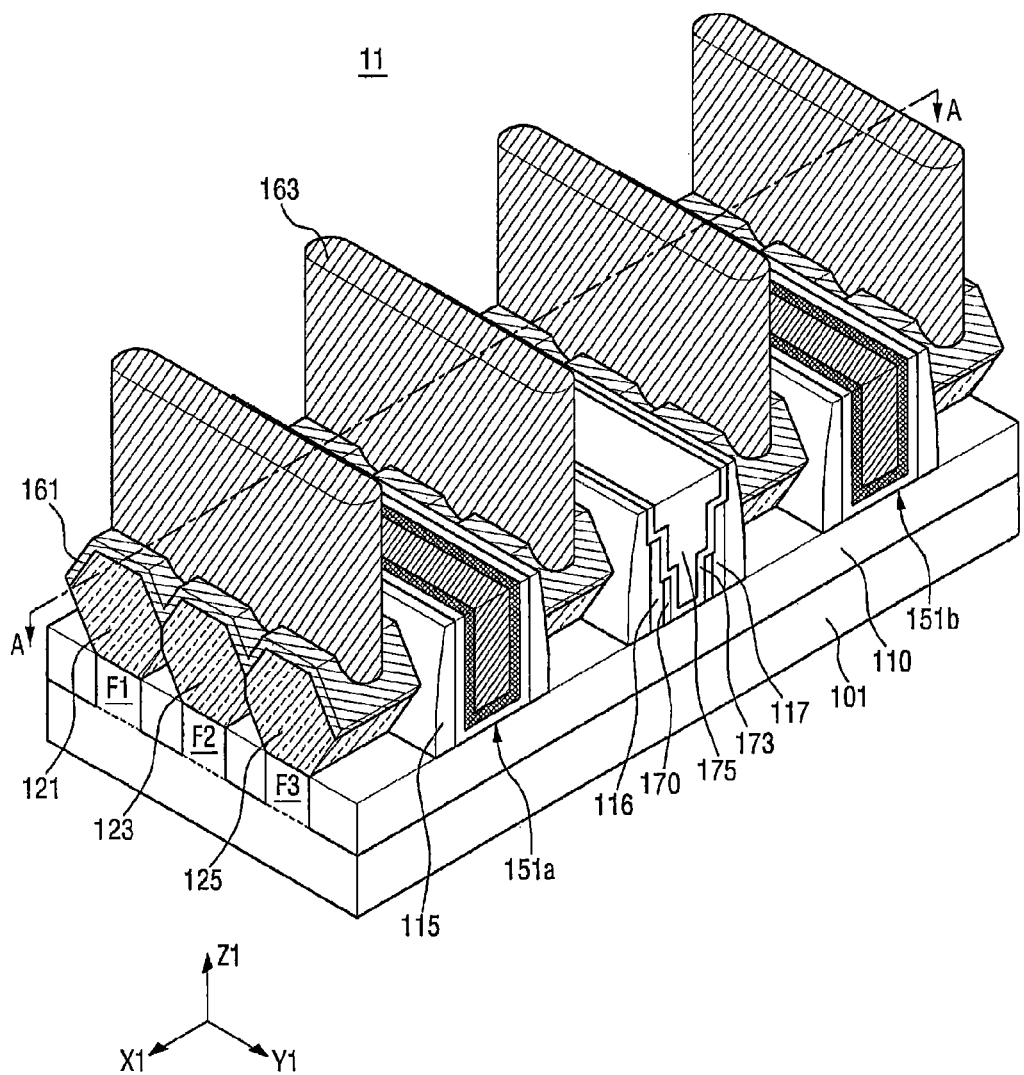
FIG. 25 is a perspective view of a semiconductor device according to some embodiments of present inventive concepts.
Figure 26:
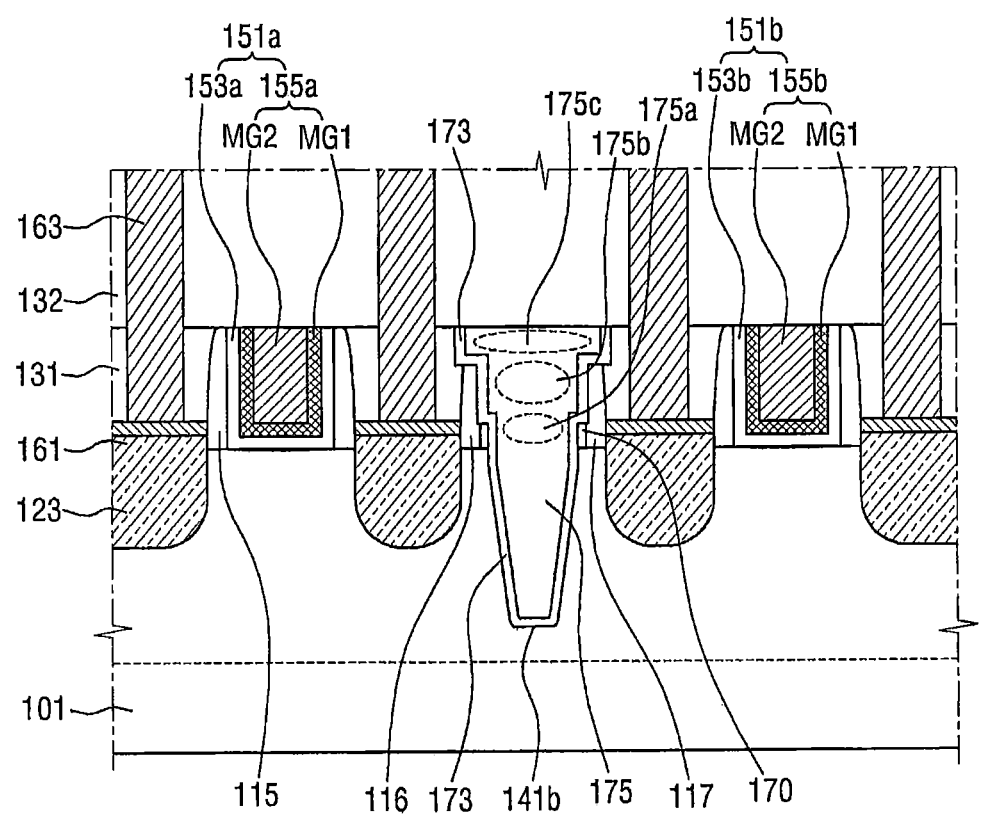
FIG. 26 is a cross-sectional view taken along the line A-A of FIG. 25.

FIG. 25 is a perspective view of a semiconductor device 11 according to some embodiments of present inventive concepts and FIG. 26 is a cross-sectional view taken along the line A-A of FIG. 25. The first and second interlayer insulation layers 131 and 132 may be provided in the semiconductor device 11, even if they are not explicitly illustrated in FIG. 25.

Unlike in the semiconductor device 10 shown in FIG. 23, in the semiconductor device 11 according to some embodiments of present inventive concepts, a device isolation layer 175 may cover top surfaces of spacers 116 and 117 disposed on opposite sidewalls of the device isolation layer 175. Therefore, heights of the spacers 116 and 117 disposed on opposite sidewalls of the device isolation layer 175 are smaller than a height of a first spacer 115 disposed on opposite sidewalls of first and second gate structures 151a and 151b.

The device isolation layer 175 may include first to third regions 175a, 175b and 175c on a recess 141b. The first region 175a is disposed between opposing portions of the inner spacer 170, the second region 175b is disposed on the first region 175a, and the third region 175c is disposed on the second region 175b. A width of the third region 175c may be greater than a width of the second region 175b and the width of the second region 175b may be greater than a width of the first region 175a.

A capping layer 173 may be formed along sidewalls of the first interlayer insulation layer 131, a top surface and sidewalls of the spacers 116 and 117, a top surface and sidewalls of the inner spacer 170 and sidewalls of the recess 141b. The capping layer 173 may have a stepped shape.

Meanwhile, the capping layer 173 and the device isolation layer 175 may extend in a first direction X1 on the spacers 116 and 117 to make contact with a contact 163. Even if the capping layer 173 and the device isolation layer 175 make contact with the contact 163, the semiconductor device 11 may not be affected by the capping layer 173 and the device isolation layer 175, which are not conductors and/or semiconductors.

Meanwhile, a void may be formed in the recess 141b of each of the semiconductor devices 1 to 11 according to some embodiments of present inventive concepts. Alternatively, a void may be formed in each of the device isolation layers 143 and 175 shown in FIGS. 1 to 26. Even in a case where the void is formed, the operation of each of the semiconductor devices 1 to 11 may not be affected by the void.

Figure 27:
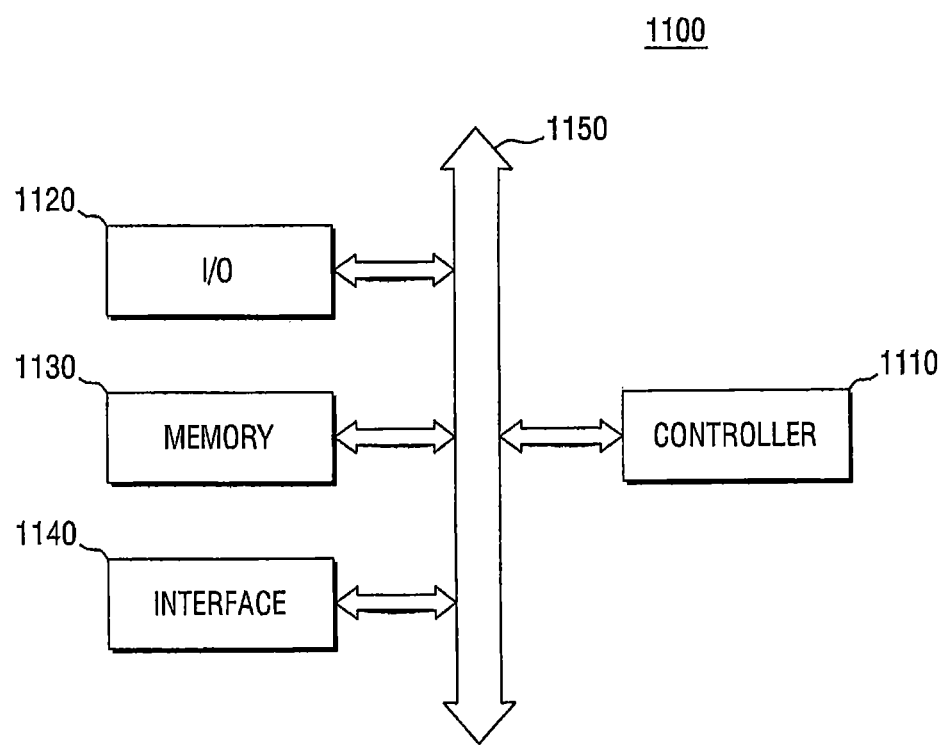
FIG. 27 is a block diagram of an electronic system including the semiconductor devices according to some embodiments of present inventive concepts.

FIG. 27 is a block diagram of an electronic system including the semiconductor devices 1 to 11 according to some embodiments of present inventive concepts.

Referring to FIG. 27, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include at least one of a keypad, a keyboard, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. The electronic system 1100 may further include high-speed DRAM and/or SRAM as a working memory for improving the operation of the controller 1110. The semiconductor devices 1 to 11 according to some embodiments of present inventive concepts may be provided in the memory device 1130 or may be provided as some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 28:
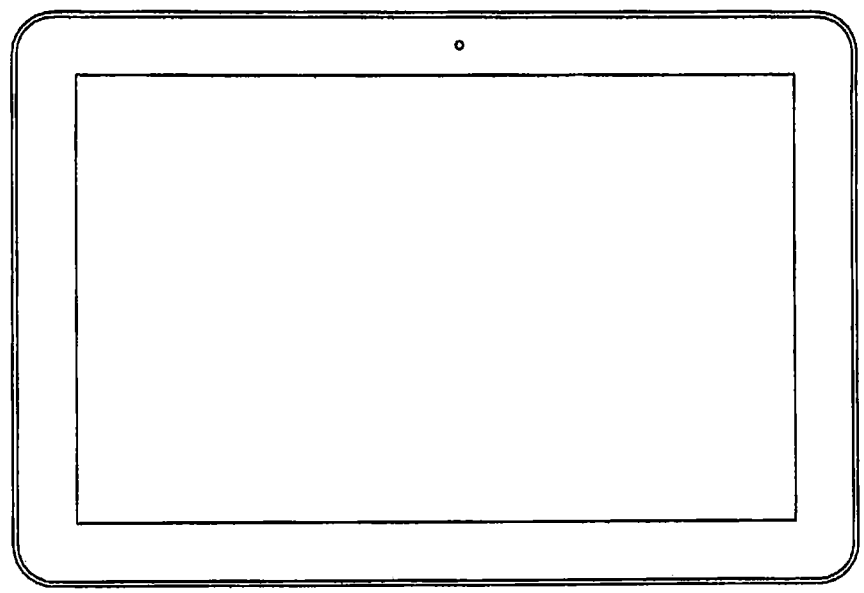
FIGS. 28 and 29 illustrate examples of semiconductor systems to which semiconductor devices according to some embodiments of present inventive concepts can be applied.
Figure 29:
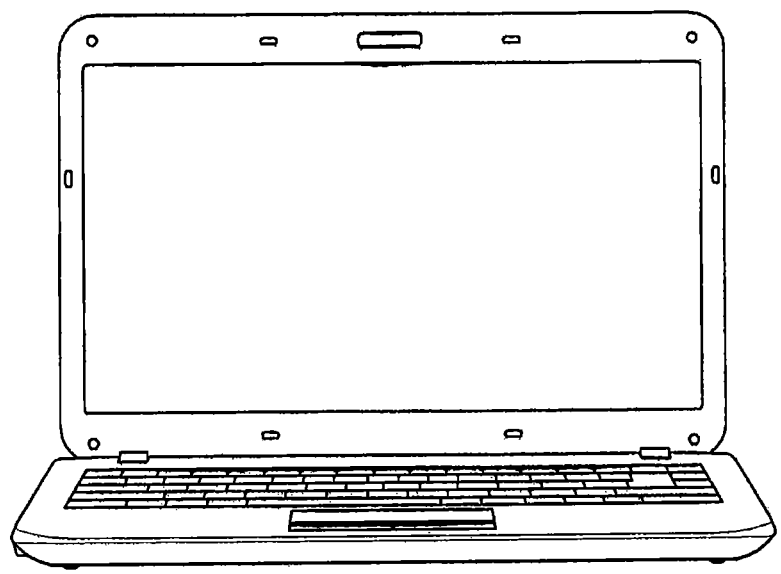

FIGS. 28 and 29 illustrate examples of semiconductor systems to which semiconductor devices according to some embodiments of present inventive concepts can be applied. FIG. 28 illustrates an example in which each of the semiconductor devices 1 to 11 according to some embodiments of present inventive concepts is applied to a tablet computer (e.g., a tablet personal computer (PC) or another tablet computer), and FIG. 29 illustrates an example in which each of the semiconductor devices 1 to 11 according to some embodiments of present inventive concepts is applied to a notebook/laptop computer. At least one of the semiconductor devices 1 to 11 according to some embodiments of present inventive concepts can be employed to a tablet computer, a notebook/laptop computer, and the like. The present inventive entity appreciates that the semiconductor devices 1 to 11 according to some embodiments of present inventive concepts may also be applied to other integrated circuit (IC) devices, even if they are not explicitly illustrated herein.

Hereinafter, a method for fabricating a semiconductor device according to some embodiments of present inventive concepts will be described with reference to FIGS. 1 to 4 and 30 to 50. Repeated descriptions of the same content as described above may be omitted, and the following description will focus on differences.

FIGS. 30 to 50 illustrate intermediate process operations of a method for fabricating a semiconductor device 1 according to some embodiments of present inventive concepts. In detail, FIGS. 30, 31, 32, 35, 36 and 38 are perspective views of the semiconductor device 1 according to some embodiments of present inventive concepts, FIGS. 33, 37 and 39 to 50 are cross-sectional views taken along the line A-A of FIGS. 32, 36, and 38, FIG. 34 is a cross-sectional view taken along the line B-B of FIG. 32 and FIGS. 45A to 45F are cross-sectional views illustrating various shapes of a second recess (141b).

Figure 30:
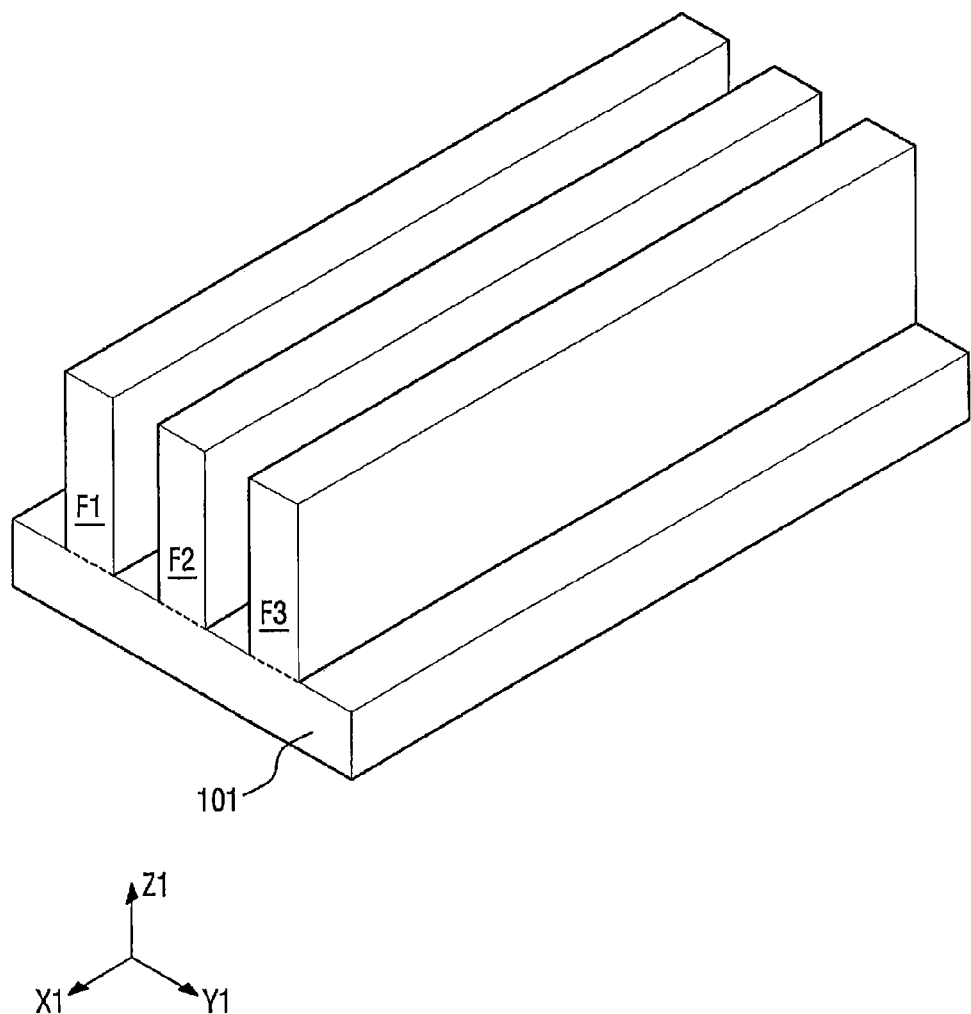
FIGS. 30 to 50 illustrate intermediate process operations of a method for fabricating a semiconductor device according to some embodiments of present inventive concepts.

Referring to FIG. 30, first to third fins F1 to F3 are formed on a substrate 101. The first to third fins F1 to F3 are formed on the substrate 101 while protruding in a third direction Z1. The first to third fins F1 to F3 may extend in a lengthwise direction, that is, in a first direction X1, and may have long sides of the first direction X1 and short sides of a second direction Y1, but aspects of present inventive concepts are not limited thereto. For example, the long side direction may correspond to the second direction Y1 and the short side direction may correspond to a first direction X1.

The first to third fins F1 to F3 may be disposed to be spaced apart from one another in the short side direction, as shown in FIG. 30.

Each of the first to third fins F1 to F3 may be part of the substrate 101 or may include an epitaxial layer grown from the substrate 101. Each of the first to third fins F1 to F3 may include, for example, Si or SiGe.

Figure 31:
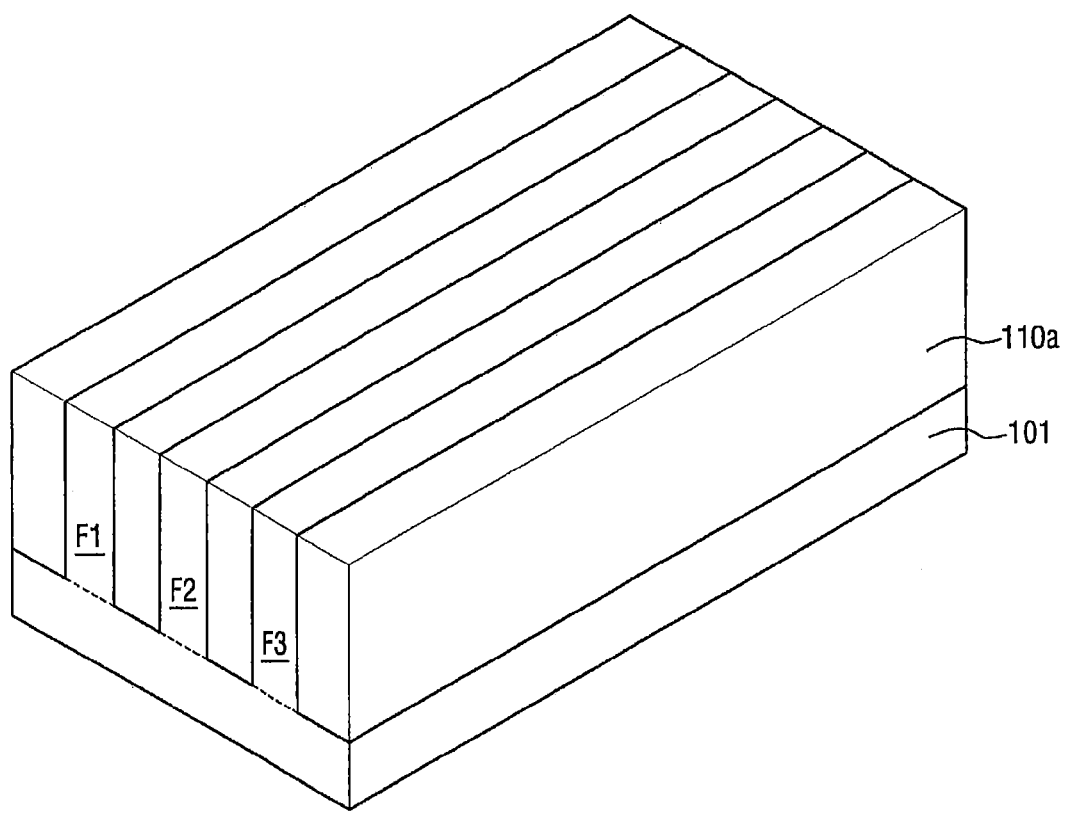

Referring to FIG. 31, an insulation layer 110a is formed to cover sidewalls of the first to third fins F1 to F3. The insulation layer 110a may include at least one of a silicon oxide layer, a silicon nitride layer, and a silicon oxynitride layer.

Figure 32:
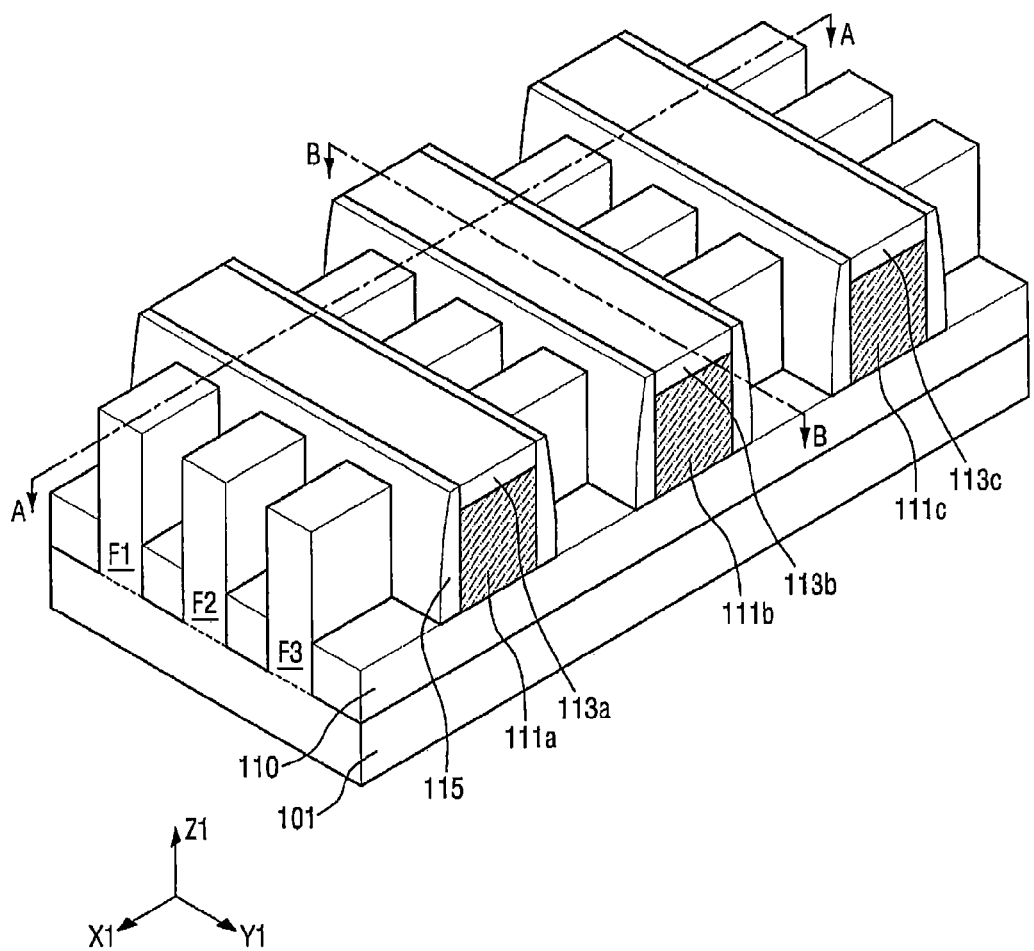
Figure 33:
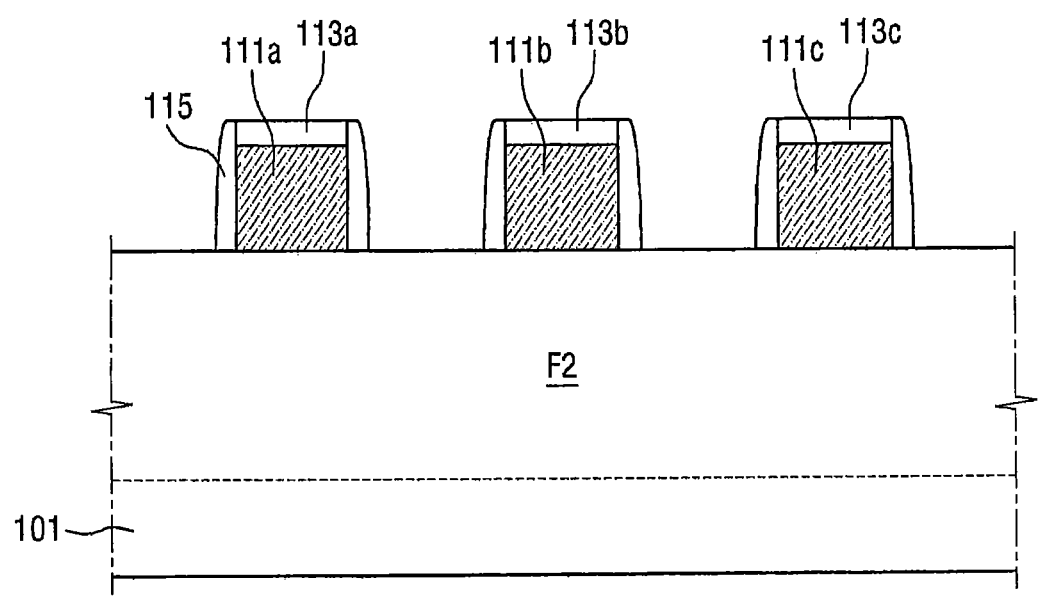
Figure 34:
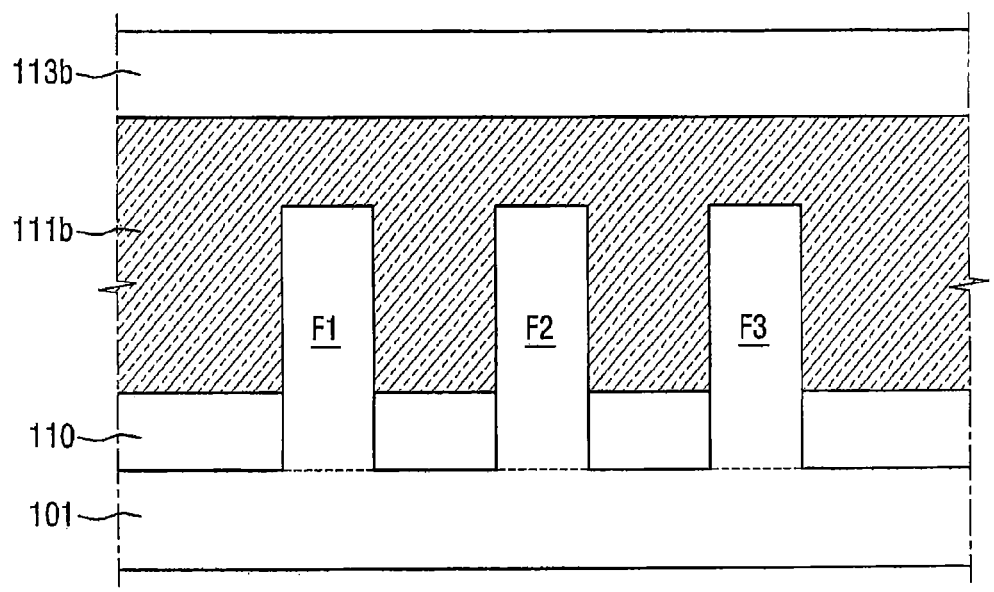

Referring to FIGS. 32 to 34, a field insulation layer 110 is formed by recessing a top portion of the insulation layer 110a and top portions of the first to third fins F1 to F3 are exposed. The recessing may include selective etching.

Meanwhile, portions of the first to third fins F1 to F3 protruding above the field insulation layer 110 may be formed by an epitaxial process. For example, after forming the insulation layer 110a, the portions of the first to third fins F1 to F3 may be formed by an epitaxial process using top surfaces of the first to third fins F1 to F3 exposed by the insulation layer 110a as seeds without recessing.

In addition, doping, for adjusting a threshold voltage, may be performed on the exposed first to third fins F1 to F3. For example, in a case of forming an NMOS transistor, a doped impurity may be boron (B), and in a case of forming a PMOS transistor, a doped impurity may be phosphorus (P) or arsenic (As).

Next, first to third sacrificial gate structures 111a, 111b and 111c crossing the first to third fins F1 to F3 are formed on the first to third fins F1 to F3. The first to third sacrificial gate structures 111a, 111b and 111c are spaced apart from one another. In FIG. 32, the first to third sacrificial gate structures 111a, 111b and 111c are illustrated as being arranged to form a right angle with a first direction X1, to cross the fin F1, but aspects of present inventive concepts are not limited thereto. The first to third sacrificial gate structures 111a, 111b and 111c may cross the first to third fins F1 to F3 with an acute angle and/or an obtuse angle formed with a second direction Y1.

First to third sacrificial gate structures 111a, 111b and 111c may be formed on top surfaces and top portions of sidewalls of the first to third fins F1 to F3. In addition, the first to third sacrificial gate structures 111a, 111b and 111c may be disposed on the field insulation layer 110. The first to third sacrificial gate structures 111a, 111b and 111c may include, for example, a silicon oxide layer.

The first to third hard mask layers 113a, 113b and 113c may be formed on the first to third sacrificial gate structures 111a, 111b and 111c, respectively. The first to third hard mask layers 113a, 113b and 113c may include at least one of a silicon oxide layer, a silicon nitride layer and a silicon oxynitride layer.

Next, a first spacer 115 is formed on opposite sidewalls of the first to third sacrificial gate structures 111a, 111b and 111c. The first spacer 115 may expose top surfaces of the first to third hard mask layers 113a, 113b and 113c. The first spacer 115 may include at least one of a silicon nitride layer and a silicon oxynitride layer.

Figure 35:
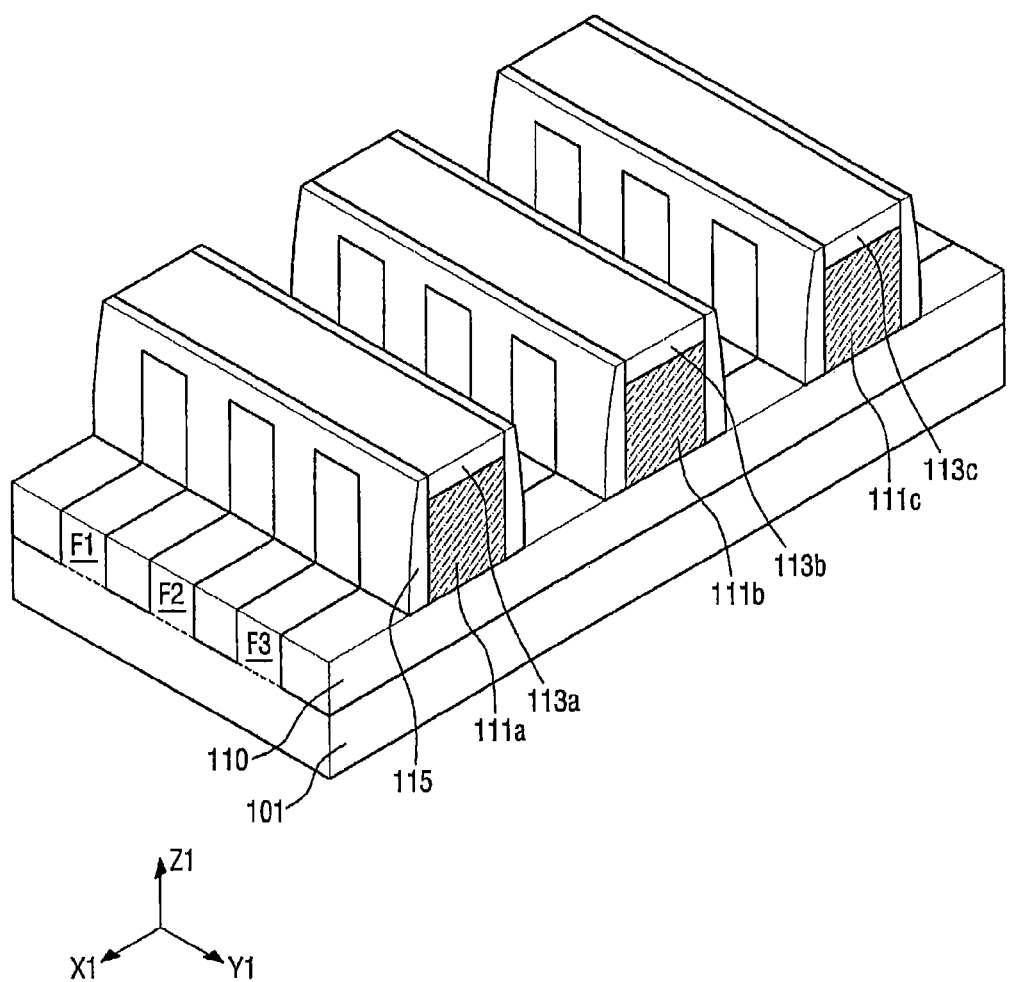

Referring to FIG. 35, the first to third fins F1 to F3 are etched. For example, portions of the first to third fins F1 to F3, except for portions covered by the first to third sacrificial gate structures 111a, 111b and 111c, may be etched. In other words, portions of the first to third fins F1 to F3 that are exposed between each of the first to third sacrificial gate structures 111a, 111b and 111c may be etched. The first to third fins F1 to F3 may be etched using the first spacer 115 and the first to third hard mask layers 113a, 113b and 113c as etch masks.

Figure 36:
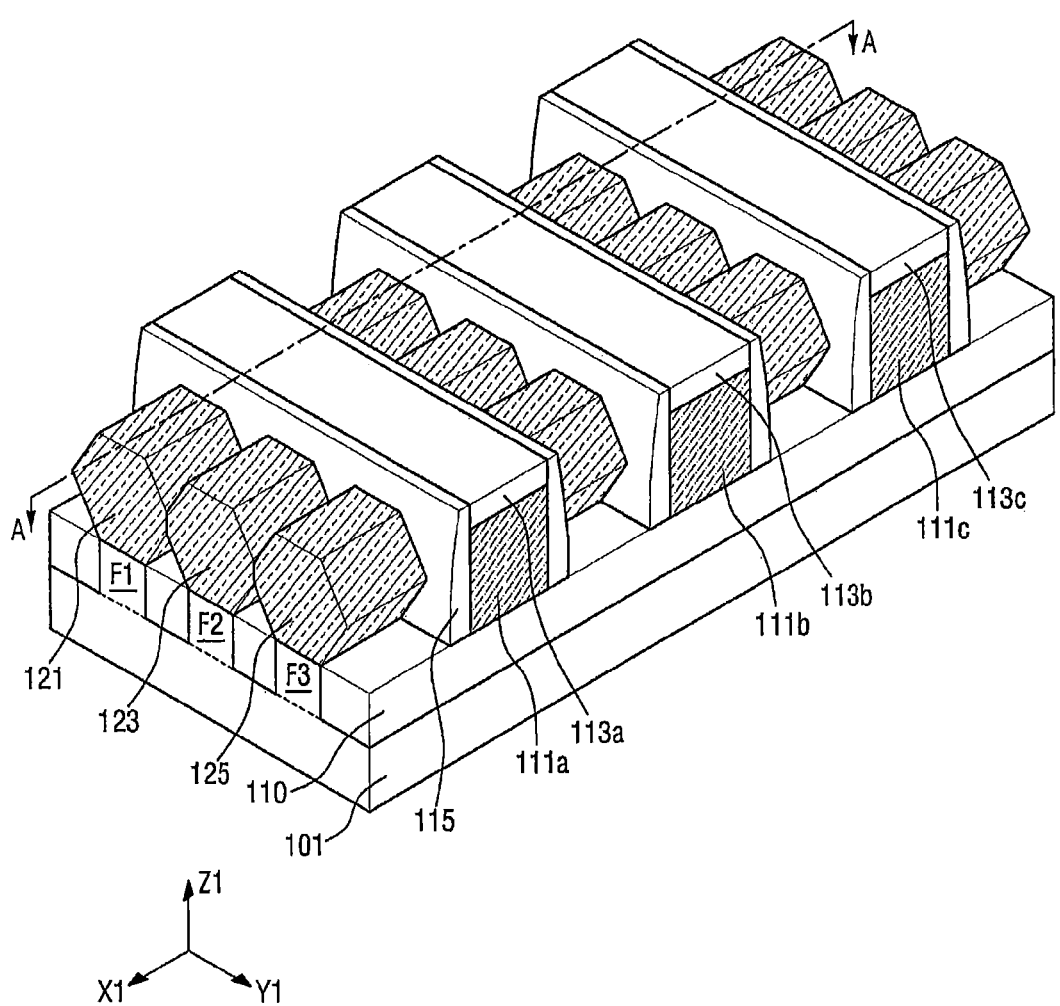
Figure 37:
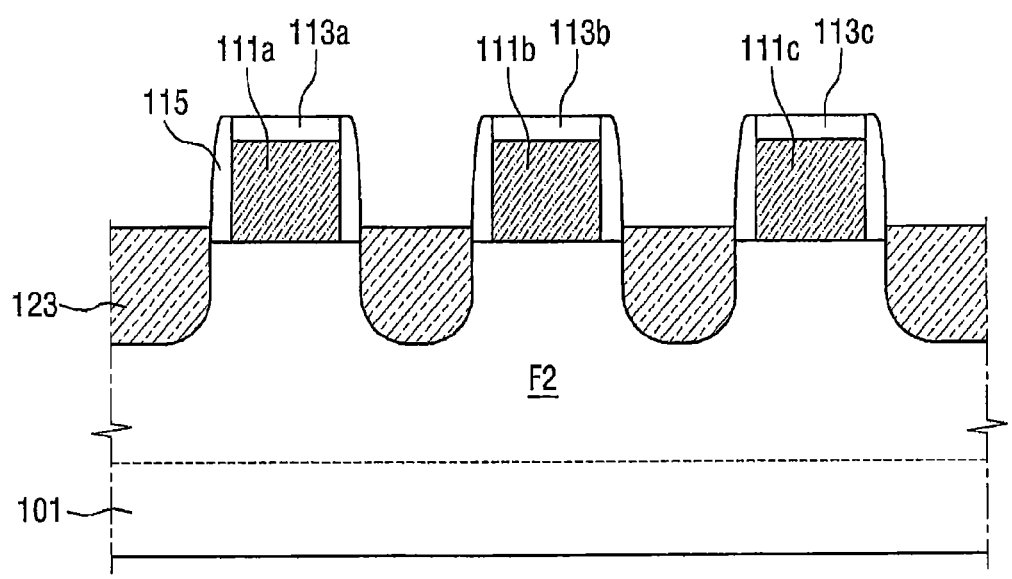

Referring to FIGS. 36 and 37, first to third source/drain regions 121, 123 and 125 are formed at etched portions of the first to third fins F1 to F3. The first source/drain region 121 may be formed in the first fin F1, the second source/ drain region 123 may be formed in the second fin F2, and the third source/drain region 125 may be formed in the third fin F3. The first to third source/drain regions 121, 123 and 125 may be elevated source/drain regions. Therefore, top surfaces of the first to third source/drain regions 121, 123 and 125 may be higher than the top surfaces of the first to third fins F1 to F3.

When the semiconductor device 1 is a PMOS transistor, the first to third source/drain regions 121, 123 and 125 may include a compressive stress material. For example, the compressive stress material may be a material having a larger lattice constant than silicon (Si), for example, SiGe. The compressive stress material may improve the mobility of carriers of a channel region by applying compressive stress to the first to third fins F1 to F3 under the first and second gate structures 151a and 151b, that is, the channel region.

When the semiconductor device 1 is an NMOS transistor, the first to third source/drain regions 121, 123 and 125 may include the same material as the substrate 101 or a tensile stress material. For example, when the substrate 101 includes Si, the first to third source/drain regions 121, 123 and 125 may include Si or a material having a smaller lattice constant than Si (e.g., SiC or SiP).

Moreover, the present inventive entity appreciates that the first to third source/drain regions 121, 123 and 125 may be formed through epitaxial growth.

Meanwhile, although the first to third source/drain regions 121, 123 and 125 are illustrated in FIG. 36 as contacting each another, aspects of present inventive concepts are not limited thereto. Accordingly, in some embodiments, the first to third source/drain regions 121, 123 and 125 may be spaced apart from one another (e.g., spaced apart in the direction Y1).

Figure 38:
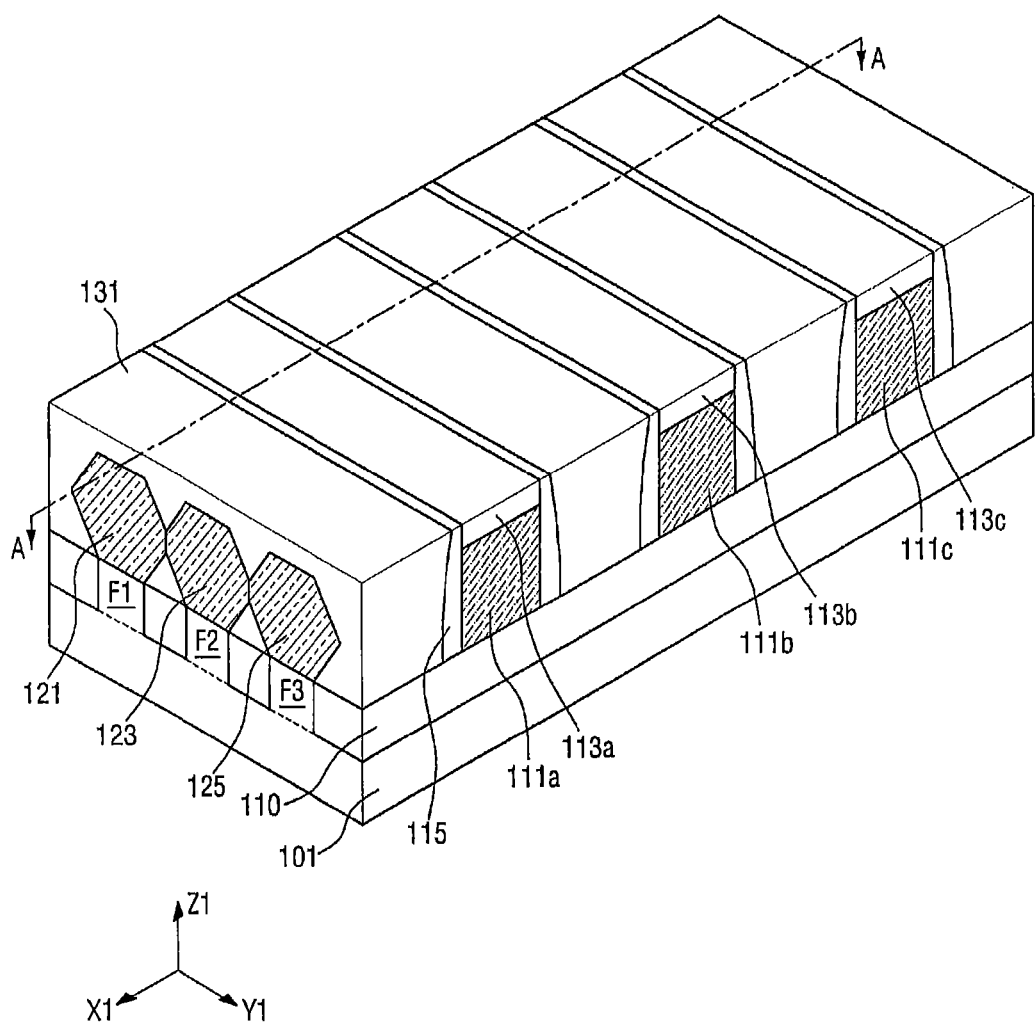
Figure 39:
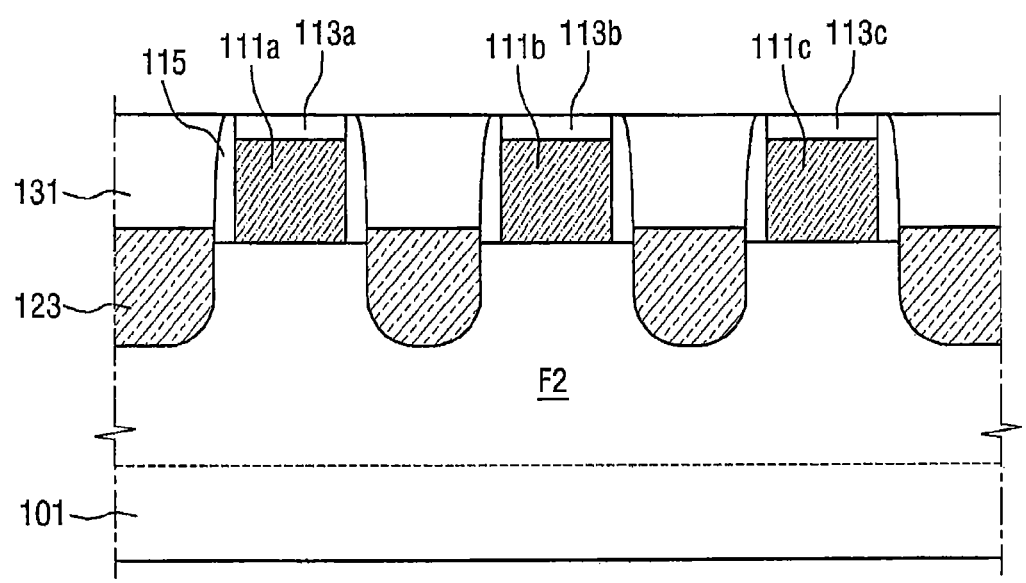

Referring to FIGS. 38 and 39, a first interlayer insulation layer 131 covering the first to third source/drain regions 121, 123 and 125 is formed. The first interlayer insulation layer 131 may cover sidewalls of the first spacer 115, and may expose the top surfaces of the first to third hard mask layers 113a, 113b and 113c. The first interlayer insulation layer 131 may include, for example, an oxide layer.

Figure 40:
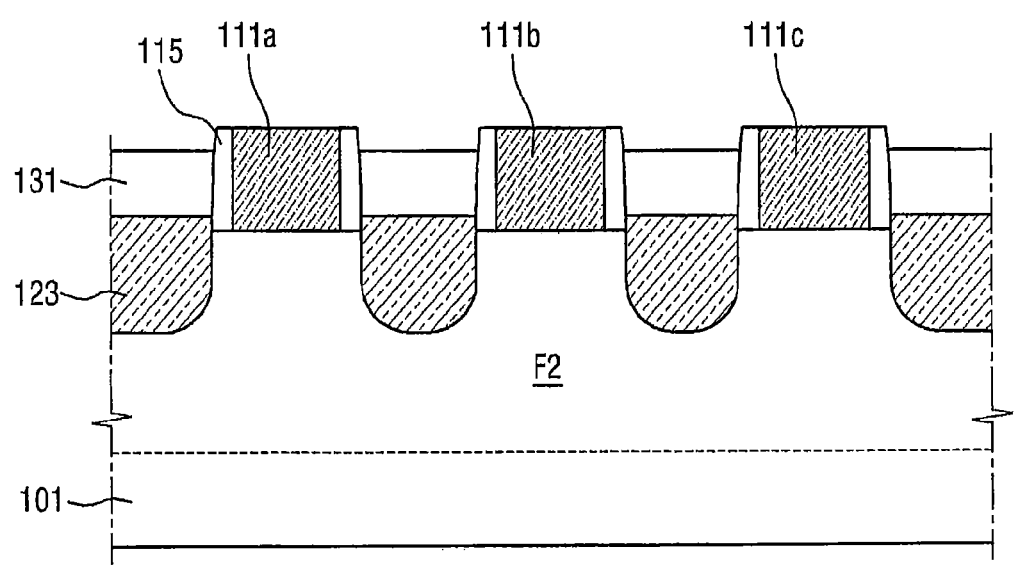

Referring to FIG. 40, the first to third hard mask layers 113a, 113b and 113c are removed. To remove the first to third hard mask layers 113a, 113b and 113c, a planarization process (e.g., CMP) may be performed. When the planarization process is performed, a portion of the first interlayer insulation layer 131 may be etched.

Residues produced by the planarization process may be removed by performing a cleaning process after performing the planarization process. At this time, the portion of the first interlayer insulation layer 131 may be removed, so that a top surface of the first interlayer insulation layer 131 may become lower than the top surfaces of the first to third sacrificial gate structures 111a, 111b and 111c, but aspects of present inventive concepts are not limited thereto. For example, the top surface of the first interlayer insulation layer 131 and the top surfaces of the first to third sacrificial gate structures 111a, 111b and 111c may be coplanarly positioned with each other.

Figure 41:
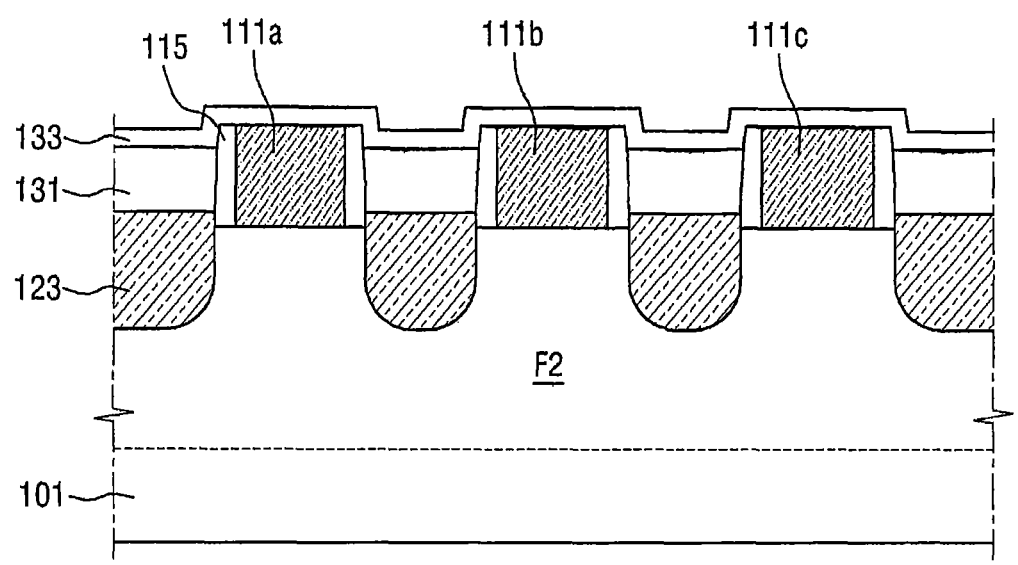

Referring to FIG. 41, a protection layer 133 covering top surfaces of the first interlayer insulation layer 131 and the first to third sacrificial gate structures 111a, 111b and 111c is formed. In a subsequent process, the protection layer 133 may protect/prevent the first interlayer insulation layer 131 from being etched. The protection layer 133 may include, for example, at least one of a nitride layer, an oxynitride layer, and so on.

Figure 42:
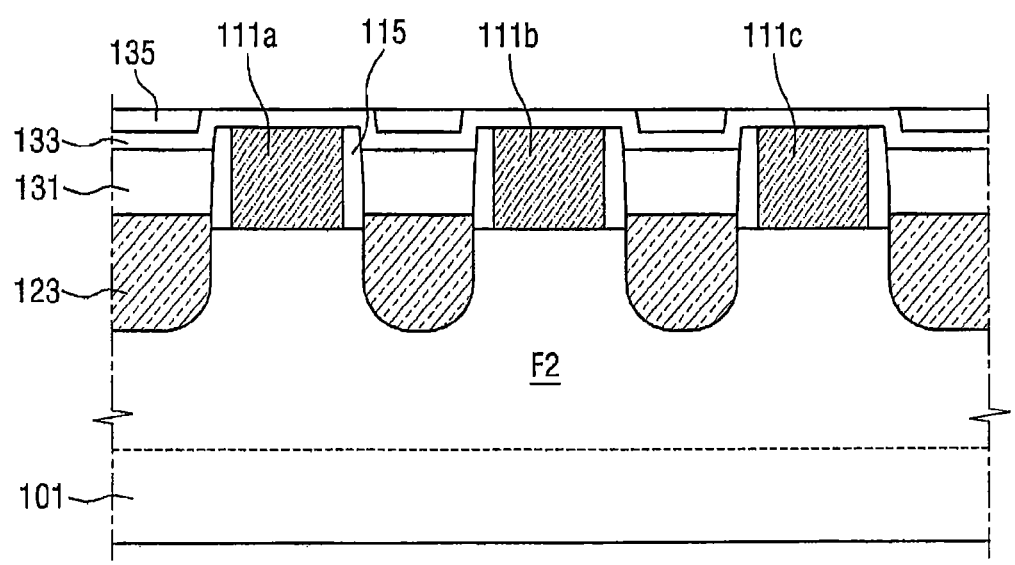

Referring to FIG. 42, an insulation layer 135 is formed on the protection layer 133. The insulation layer 135 is formed for the purpose of offsetting a step difference generated while the protection layer 133 is formed. In detail, since there is a height difference between the top surface of the first interlayer insulation layer 131 and the top surfaces of the first to third sacrificial gate structures 111a, 111b and 111c, the protection layer 133 may become non-planar when the protection layer 133 is formed and a recessed portion thereof is created on the first interlayer insulation layer 131. The insulation layer 135 may make a top surface of the resultant product of FIG. 42 planar by filling the recessed portion of the protection layer 133. The insulation layer 135 does not entirely cover the protection layer 133 but exposes a portion of the protection layer 133. The insulation layer 135 may include the same material as the first interlayer insulation layer 131.

Figure 43:
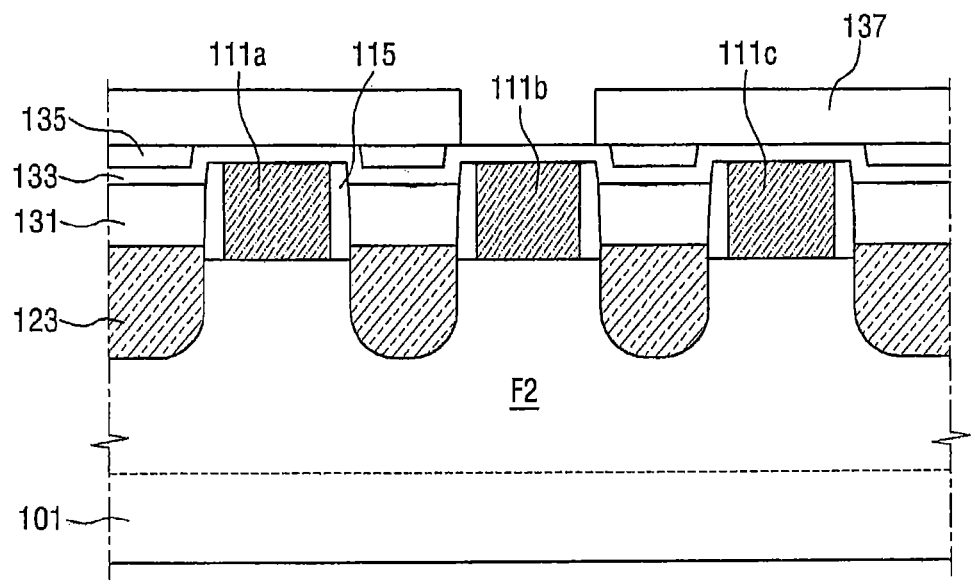

Referring to FIG. 43, an etch mask pattern 137 is formed on the protection layer 133. The etch mask pattern 137 exposes a top portion of the second sacrificial gate structure 111b (or exposes a top portion of the protection layer 133 overlying the second sacrificial gate structure 111b) and covers the first and third sacrificial gate structures 111a and 111c.

Figure 44:
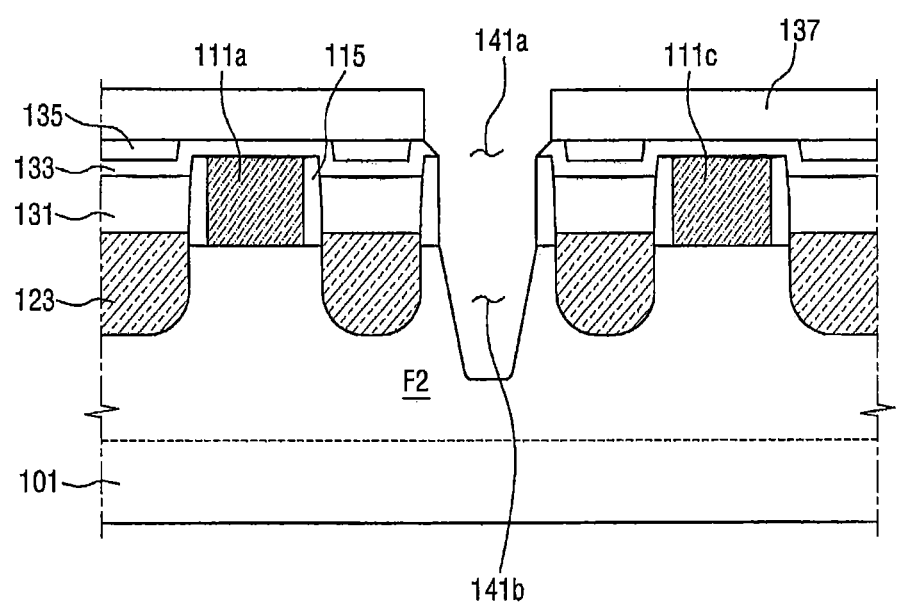

Referring to FIG. 44, the second sacrificial gate structure 111b is removed and a first recess 141a and a second recess 141b are formed. Portions of the protection layer 133 that were formed on the second sacrificial gate structure 111b are first removed using the etch mask pattern 137 and the second sacrificial gate structure 111b is then removed to form the first recess 141a. The first to third fins F1 to F3 are exposed by the first recess 141a and the exposed portions are etched/removed to form the second recess 141b.

The second recess 141b may be spaced apart from the first to third source/drain regions 121, 123 and 125. A bottom surface of the second recess 141b is lower than or at the same levels as bottom surfaces of the first to third source/drain regions 121, 123 and 125.

Figure 45A:
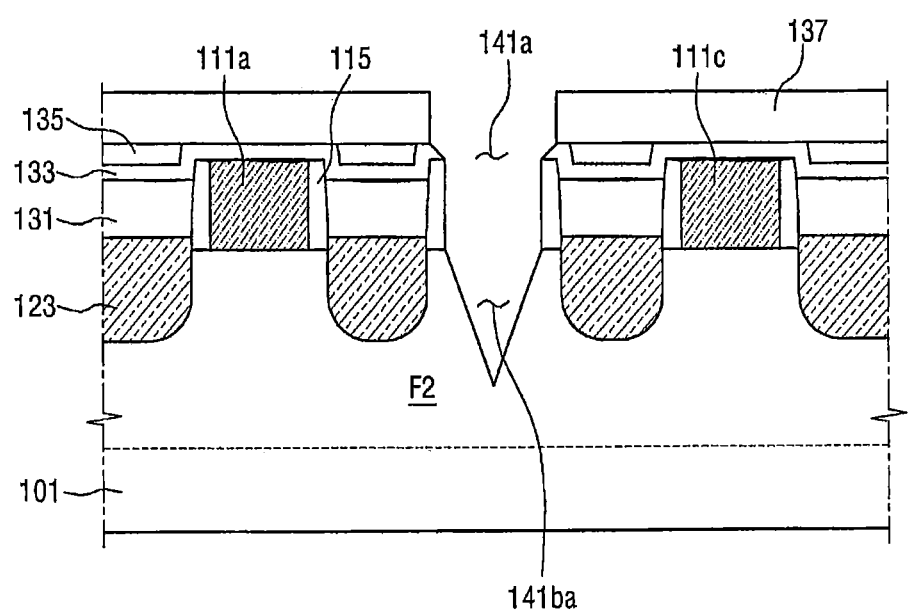
Figure 45B:
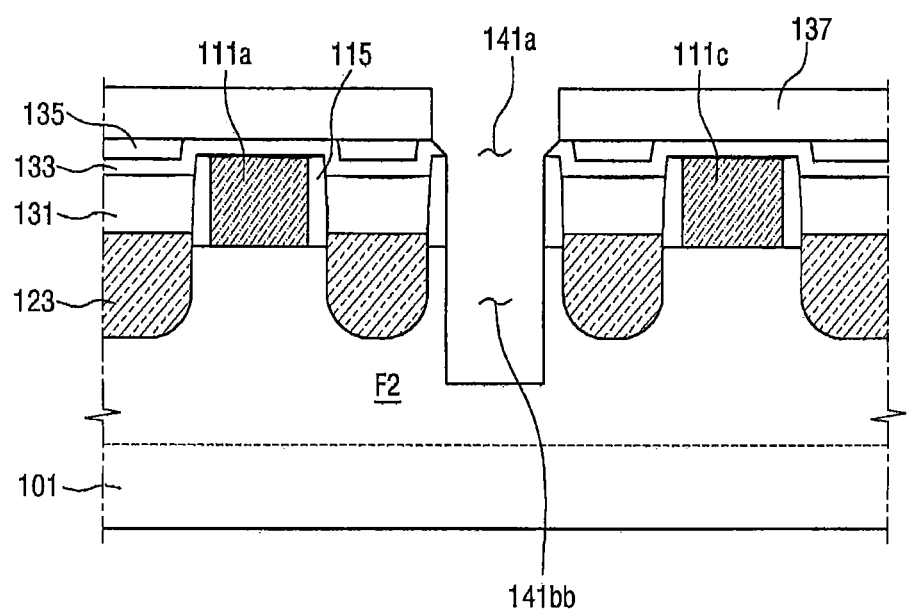
Figure 45C:
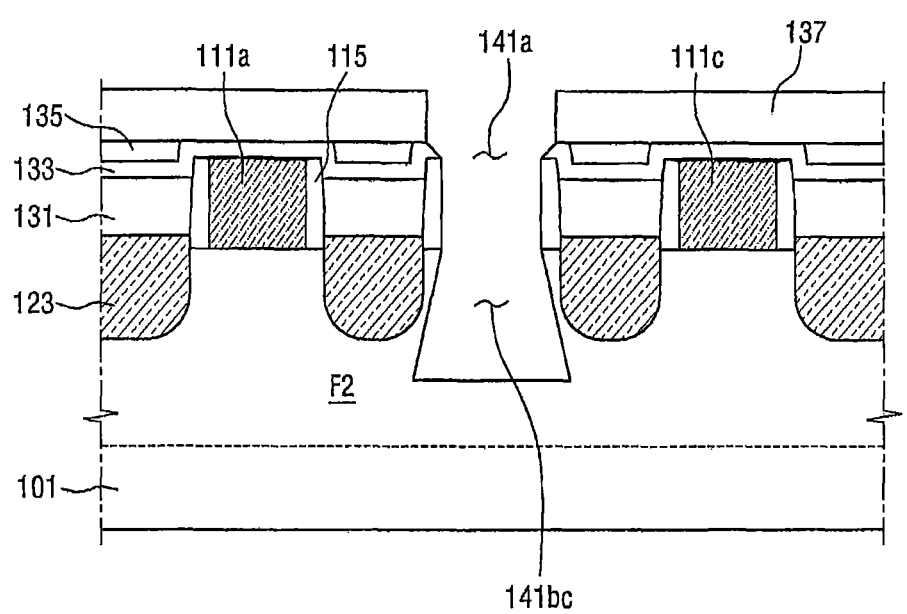
Figure 45D:
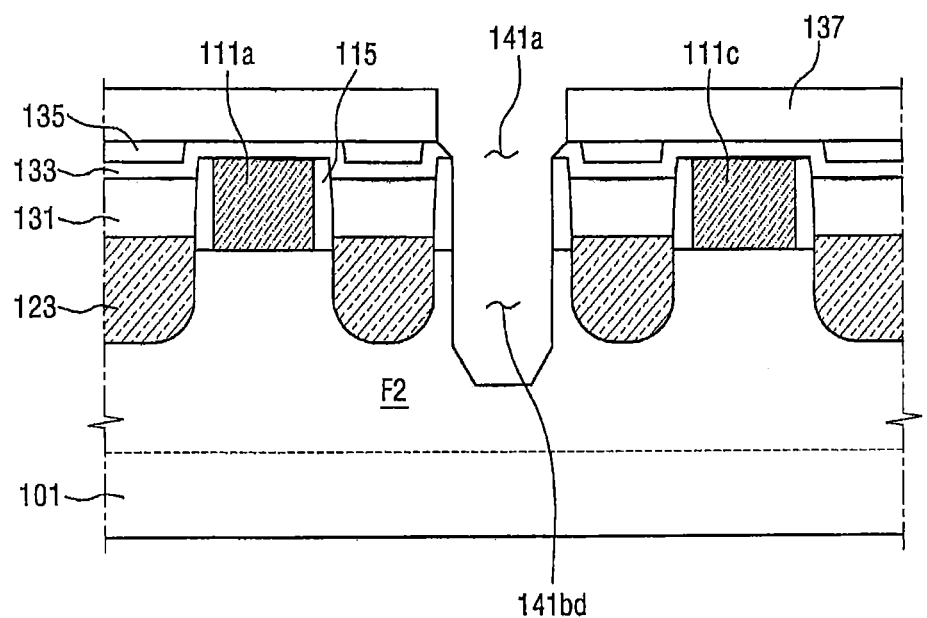
Figure 45E:
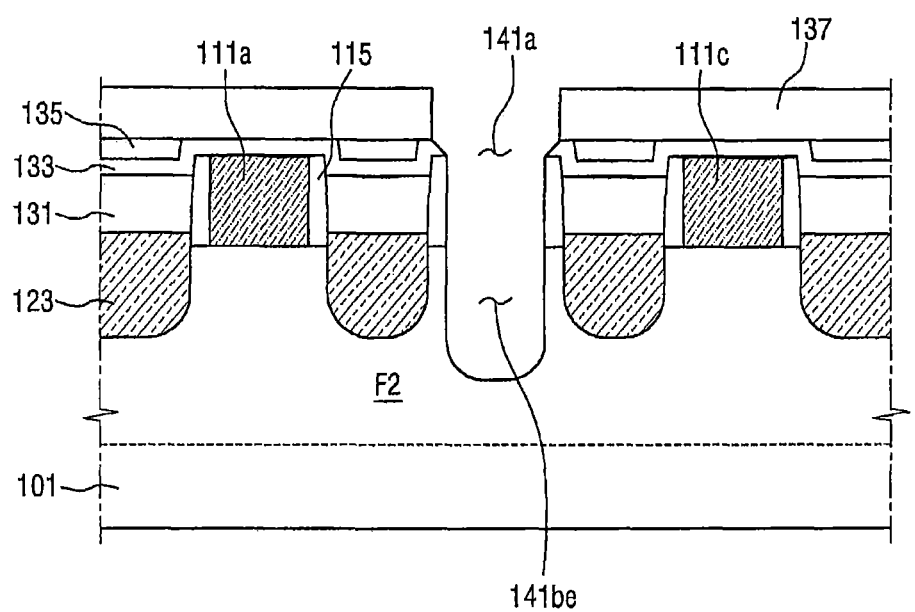
Figure 45F:
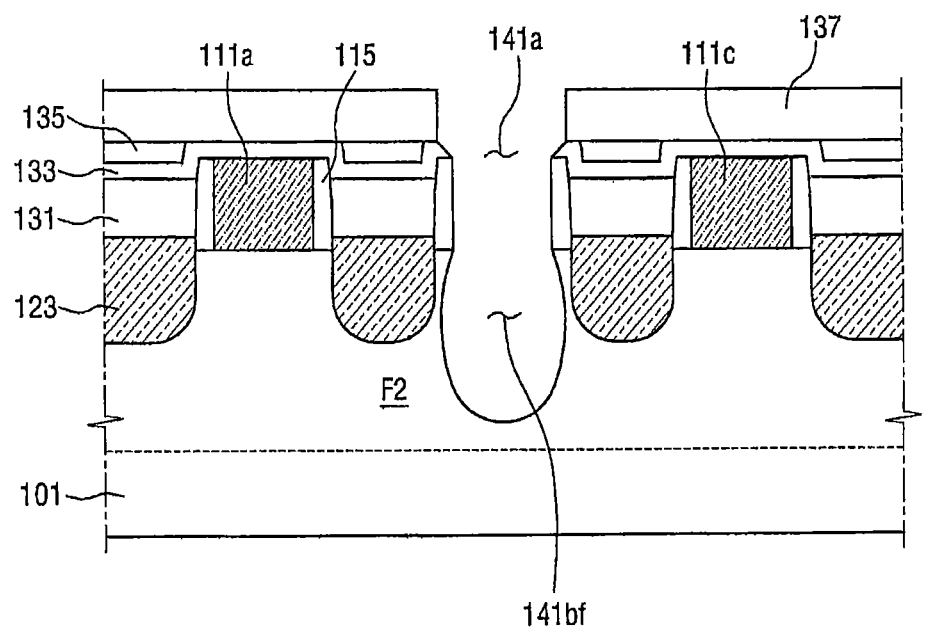

In FIG. 44, the second recess 141b is illustrated as having the shape of a trench tapering away from its top portion, but aspects of present inventive concepts are not limited thereto. The second recess 141b may have various shapes, as shown in FIGS. 45A to 45F. For example, the second recess 141b may have a V shape, as shown in FIG. 45A (recess 141ba), a rectangular shape, as shown in FIG. 45B (recess 141bb), a trapezoidal shape, as shown in FIG. 45C (recess 141bc), an angled U shape, as shown in FIG. 45D (recess 141bd), a U shape, as shown in FIG. 45E (recess 141be), or an oval shape, as shown in FIG. 45F (recess 141bf), but aspects of present inventive concepts are not limited thereto. The second recess 141b may have a shape other than those shown in FIGS. 44, 45A to 45F.

Figure 46:
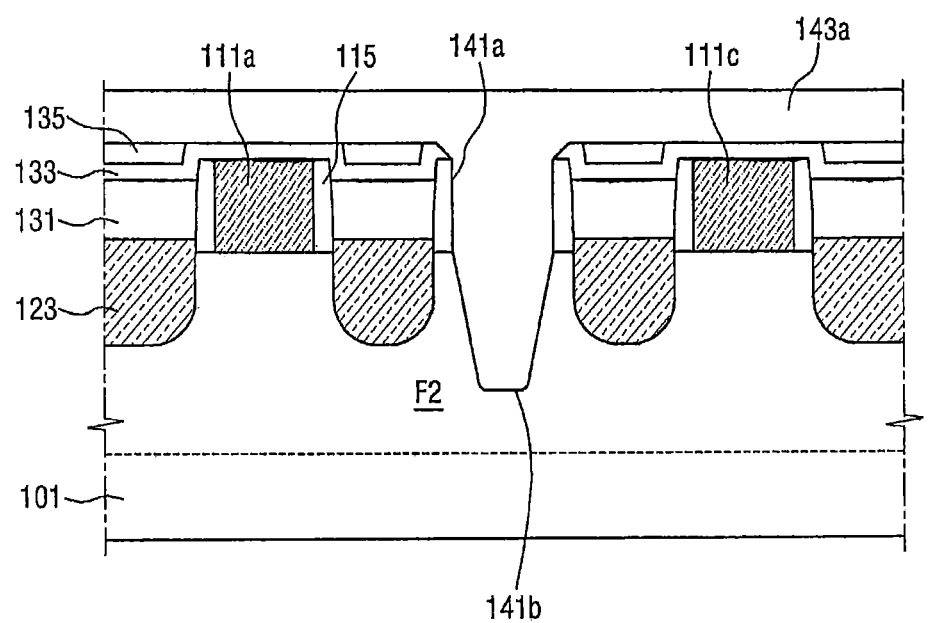

Referring to FIG. 46, the etch mask pattern 137 is removed, and a device isolation layer 143a filling the first and second recesses 141a and 141b is formed. The device isolation layer 143a may include, for example, an oxide layer, a nitride layer, or an oxynitride layer.

Figure 47:
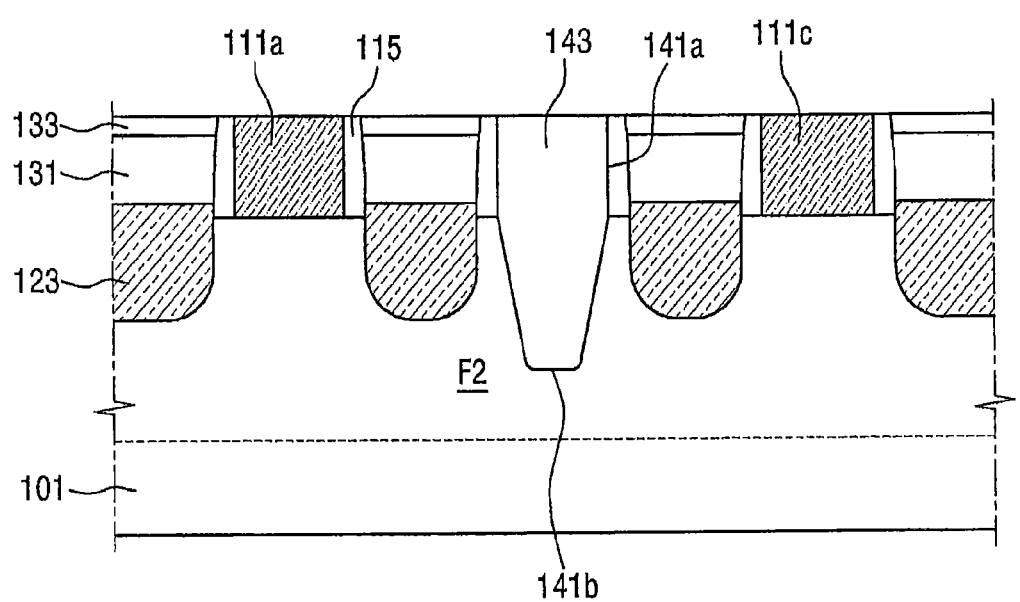

Referring to FIG. 47, the device isolation layer 143a is patterned/removed to expose the top surfaces of the first and third sacrificial gate structures 111a and 111c. Here, the protection layer 133 covering the first and third sacrificial gate structures 111a and 111c and the insulation layer 135 are removed together through a planarization process. The protection layer 133 may remain only on the first interlayer insulation layer 131. A remaining device isolation layer 143 may be located only in the first recess 141a and the second recess 141b.

Figure 48:
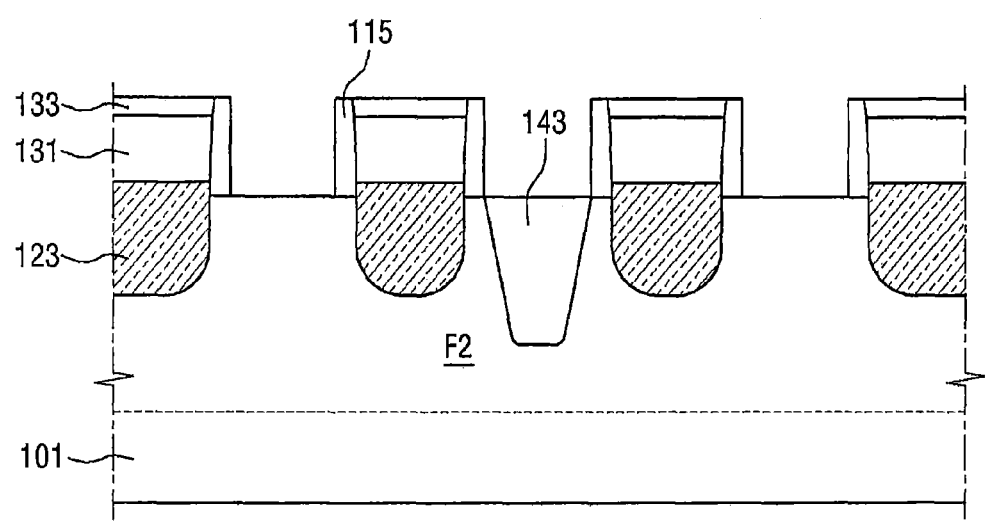

Referring to FIG. 48, the first and third sacrificial gate structures 111a and 111 c are removed. When the first and third sacrificial gate structures 111a and 111 c are removed, a portion of the device isolation layer 143 may also be etched.

In FIG. 48, the device isolation layer 143 is illustrated as being coplanarly positioned with the top surfaces of the first to third fins F1 to F3, but aspects of present inventive concepts are not limited thereto. The top surface of the device isolation layer 143 may be higher than or at the same level as the top surfaces of the first to third fins F1 to F3.

Figure 49:
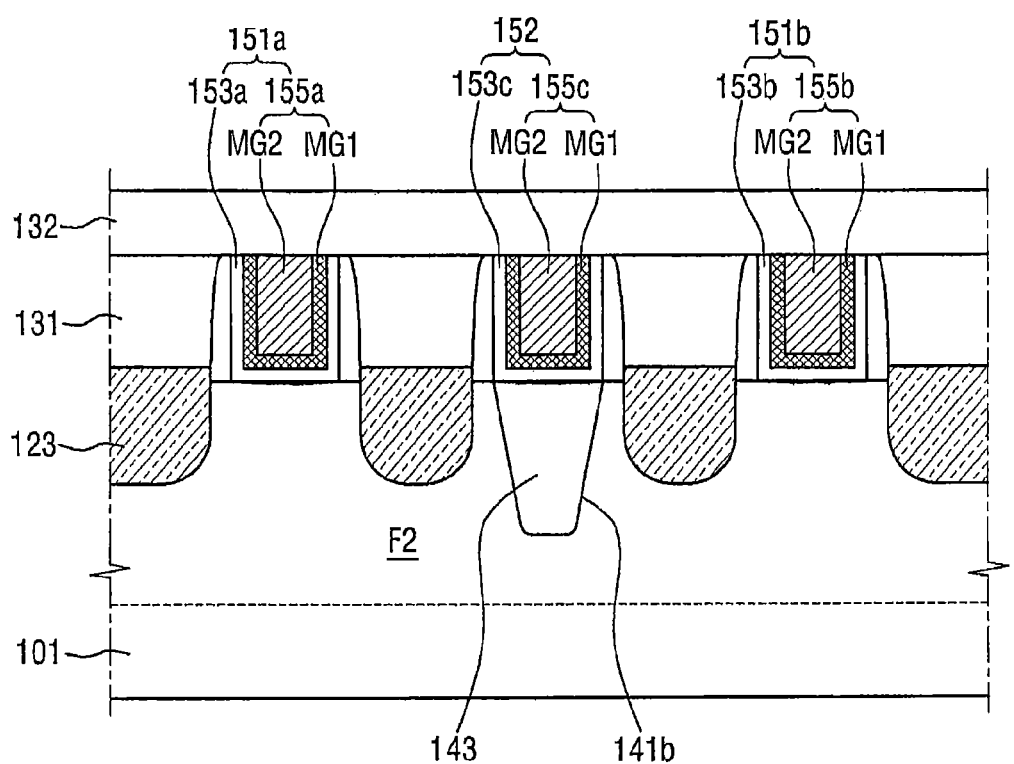

Referring to FIG. 49, the first and second gate structures 151a and 151b are formed at portions resulting from the removing of the first and third sacrificial gate structures 111a and 111 c, and a dummy gate structure 152 is formed on the device isolation layer 143. The first and second gate structures 151a and 151 b and the dummy gate structure 152 may be simultaneously formed.

The first and second gate structures 151a and 151b may include respective first and second gate insulation layers 153a and 153b and respective first and second gate electrodes 155a and 155b. The first and second gate insulation layers 153a and 153b may be formed between each of the first to third fins F1 to F3 and each of the first and second gate electrodes 155a and 155b, respectively. The first and second gate insulation layers 153a and 153b may be formed along the top surfaces of the first to third fins F1 to F3 and the sidewalls of the first spacer 115. The first and second gate insulation layers 153a and 153b may include a high-k material having a higher dielectric constant than a silicon oxide layer. For example, the first and second gate insulation layers 153a and 153b may include $HfO_2$, $ZrO_2$, LaO, $Al_2O_3$ or $Ta_2O_5$.

The first and second gate electrodes 155a and 155b may each include first and second metal layers MG1 and MG2. As shown in FIG. 49, the first and second gate electrodes 155a and 155b may include two or more stacked metal layers MG1 and MG2. The first metal layer MG1 may control a work function, and the second metal layer MG2 may fill a space provided by the first metal layer MG1. The first metal layer MG1 may be formed along the top surfaces of the first to third fins F1 to F3 and the sidewalls of the first spacer 115. For example, the first metal layer MG1 may include at least one of TiN, TaN, TiC, TiAlC and TaC. In addition, the second metal layer MG2 may include W or Al. In some embodiments, the first and second gate electrodes 155a and 155b may include a non-metal material, e.g., Si or SiGe.

The dummy gate structure 152 may include a dummy gate insulation layer 153c and a dummy gate electrode 155c. Unlike the first and second gate structures 151a and 151b, the dummy gate structure 152 does not function as a gate of a transistor.

The dummy gate insulation layer 153c may be formed between each of the first to third fins F1 to F3 and the dummy gate electrode 155c. The dummy gate insulation layer 153c may be formed along the top surface of the device isolation layer 143 and the sidewalls of the first spacer 115. The dummy gate insulation layer 153c may include a high-k material having a higher dielectric constant than a silicon oxide layer. For example, the dummy gate insulation layer 153c may include $HfO_2$, $ZrO_2$, LaO, $Al_2O_3$ or $Ta_2O_5$.

The dummy gate electrode 155c may include first and second metal layers MG1 and MG2. In some embodiments, the dummy gate electrode 155c may include two or more sequentially stacked metal layers MG1 and MG2. For example, the first metal layer MG1 may include at least one of TiN, TaN, TiC, TiAlC and TaC. In addition, the second metal layer MG2 may include W or Al. In some embodiments, the dummy gate electrode 155c may include a non-metal material, e.g., Si or SiGe.

Figure 50:
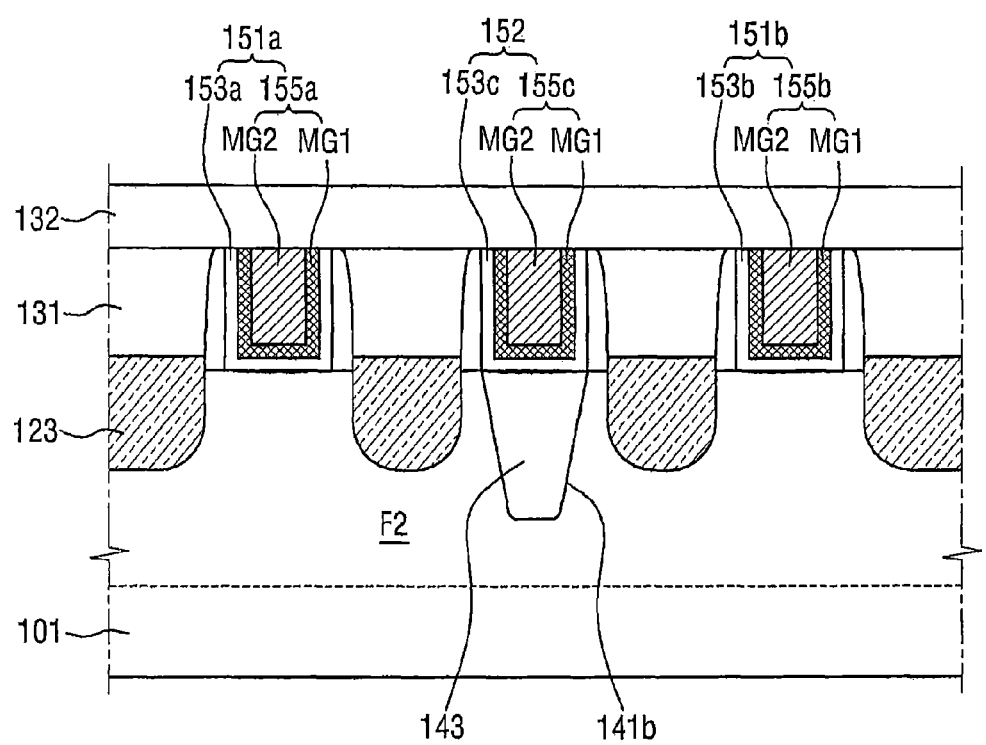

Referring to FIG. 50, the protection layer 133 disposed on the first interlayer insulation layer 131 is removed. To remove the protection layer 133, a planarization process may be performed. Therefore, the first and second gate structures 151a and 151b and the dummy gate structure 152 may also be partially removed.

After removing the protection layer 133, the second interlayer insulation layer 132 is formed. The second interlayer insulation layer 132 may cover the first interlayer insulation layer 131, the first and second gate structures 151a and 151b and the dummy gate structure 152.

Next, a silicide layer 161 is formed on the first to third source/drain regions 121, 123 and 125 and a contact 163 is formed on the silicide layer 161, thereby fabricating the semiconductor device 1 shown in FIGS. 1 to 4.

Figure 51:
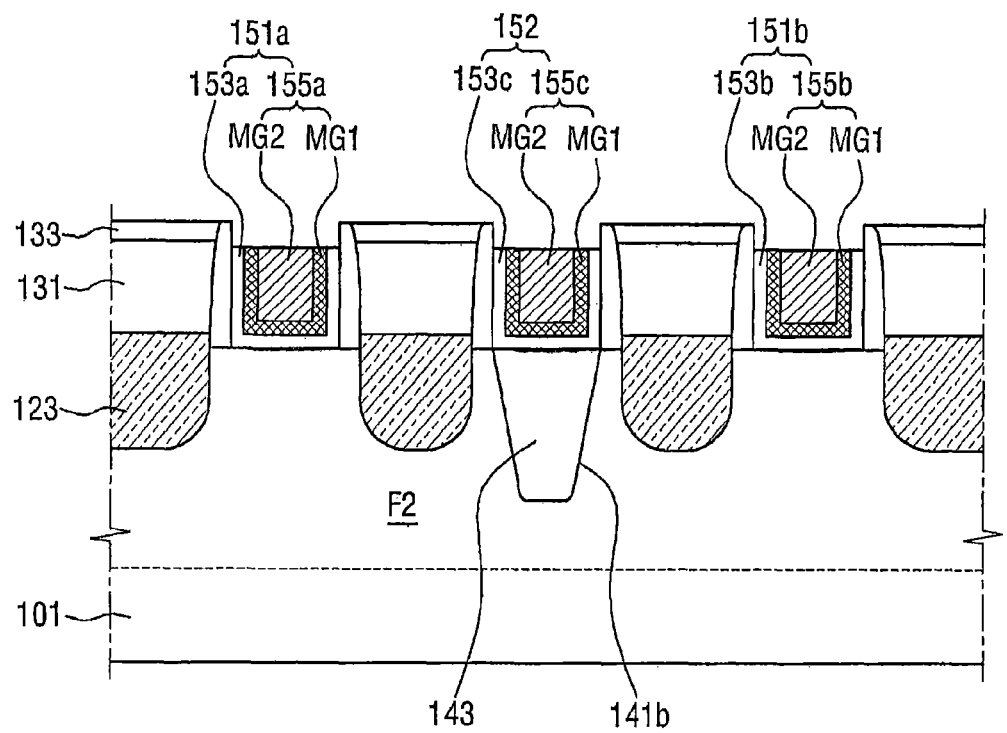
FIGS. 51 to 53 illustrate intermediate process operations of a method for fabricating a semiconductor device according to some embodiments of present inventive concepts.
Figure 52:
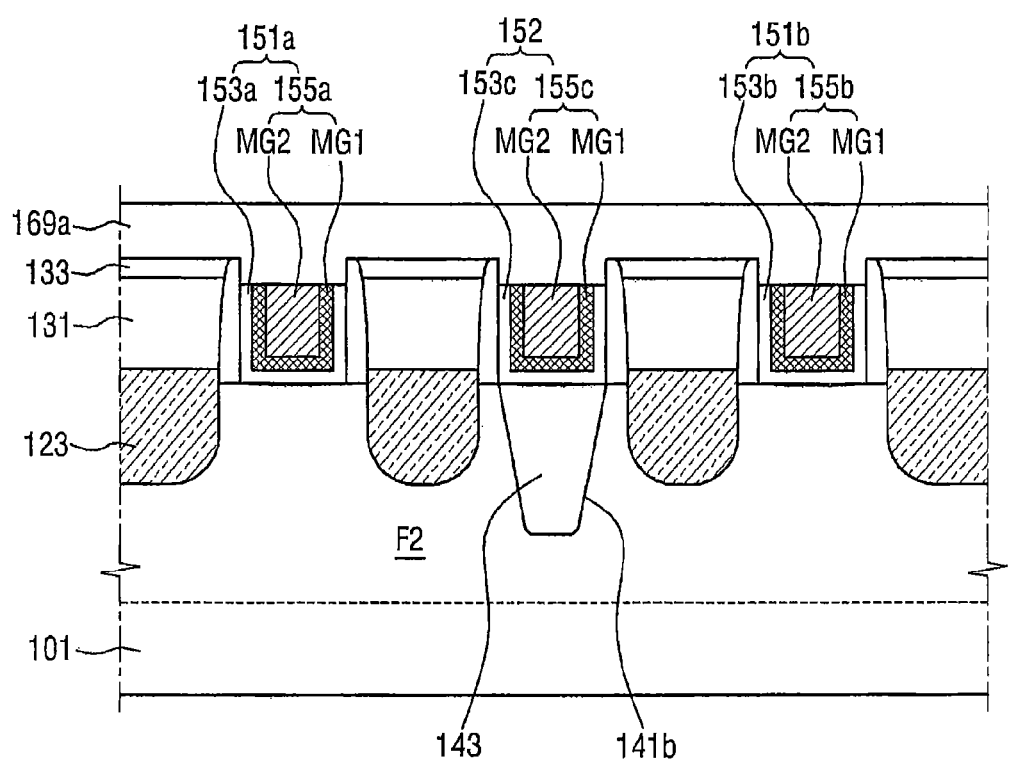
Figure 53:
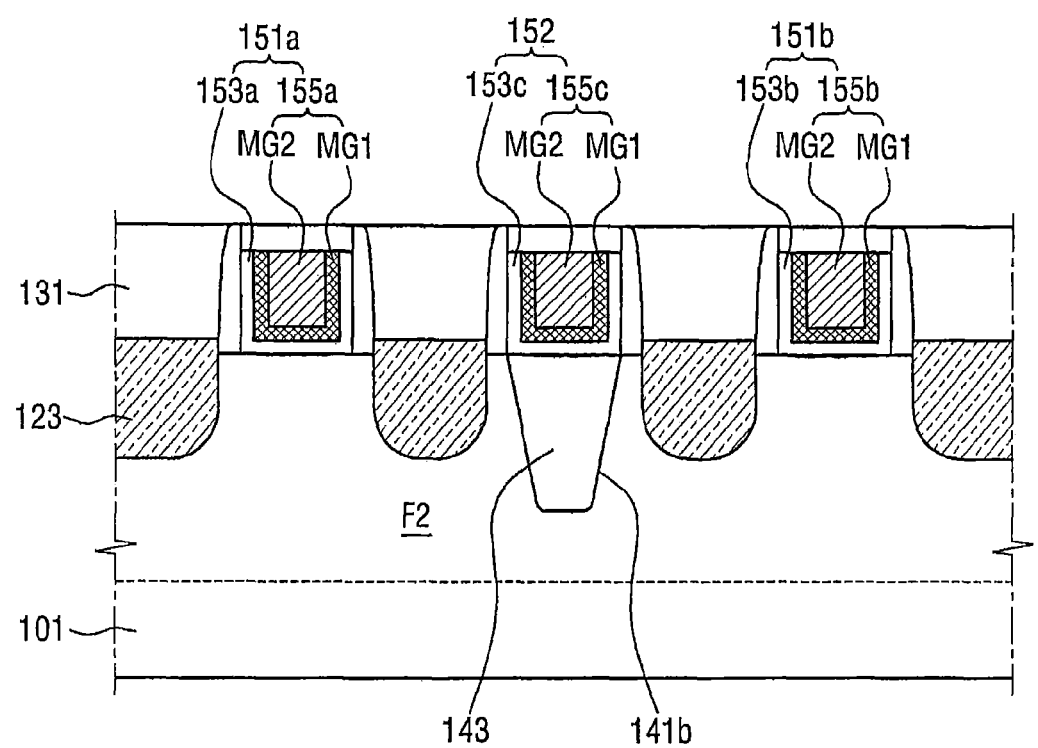

A method for fabricating a semiconductor device 2 according to some embodiments of present inventive concepts will be described with reference to FIGS. 5, 30 to 49, and 51 to 53. FIGS. 51 to 53 illustrate intermediate process operations of a method for fabricating a semiconductor device 2 according to some embodiments of present inventive concepts. FIGS. 30 to 49 have already been described above, and repeated descriptions thereof may be omitted.

Referring to FIG. 51, portions of the first and second gate structures 151a and 151b and the dummy gate structure 152 are removed. The protection layer 133 may protect the first interlayer insulation layer 131 from being etched.

Referring to FIG. 52, a cover layer 169a is formed on the resultant product of FIG. 51. The cover layer 169a covers the first and second gate structures 151a and 151b and the dummy gate structure 152. The cover layer 169a may include, for example, at least one of SiCN, SiN, SiON, SiCON and SiCO.

Referring to FIG. 53, portions of the cover layer 169a are removed so as to cover only the first and second gate structures 151a and 151b and the dummy gate structure 152. At this time, the protection layer 133 is also removed to expose the first interlayer insulation layer 131. Sidewalls of the cover layer 169a may be covered by the first spacer 115. To remove the protection layer 133 and the portions of the cover layer 169a, a planarization process may be performed.

Next, the second interlayer insulation layer 132, the silicide layer 161 and the contact 163 are formed, thereby fabricating the semiconductor device 2 shown in FIG. 5.

A method for fabricating a semiconductor device 3 according to some embodiments of present inventive concepts will be described with reference to FIGS. 6, 30 to 42, and 54 to 59.

FIGS. 54 to 59 illustrate intermediate process operations of a method for fabricating a semiconductor device 3 according to some embodiments of present inventive concepts. FIGS. 30 to 42 have already been described above, and repeated descriptions thereof may be omitted.

Figure 54:
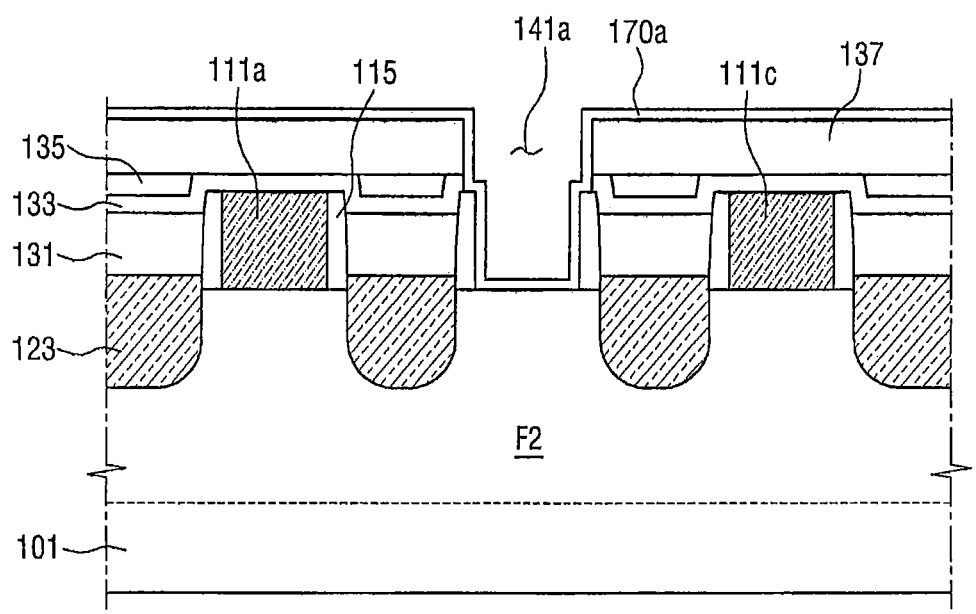
FIGS. 54 to 59 illustrate intermediate process operations of a method for fabricating a semiconductor device according to some embodiments of present inventive concepts.

Referring to FIG. 54, an etch mask pattern 137 is formed on the resultant product of FIG. 42. Next, an etching process is performed using the etch mask pattern 137, thereby forming a first recess 141a. To form the first recess 141a, the protection layer 133 disposed on the second sacrificial gate structure 111b and the second sacrificial gate structure 111b are sequentially etched. The first recess 141a exposes portions of the first to third fins F1 to F3.

Figure 55:
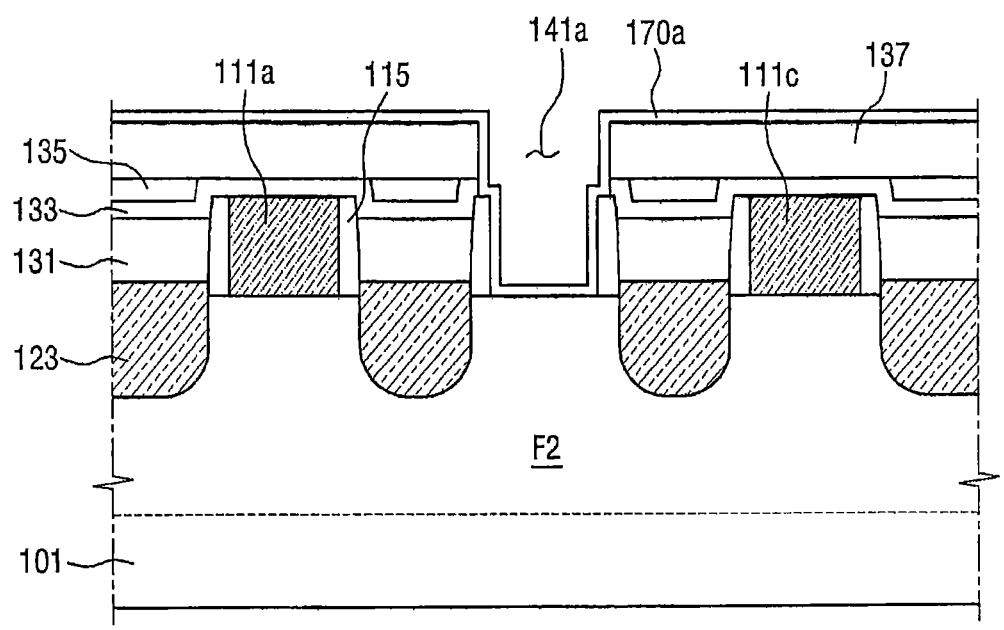

Referring to FIG. 55, an inner spacer 170a is formed. The inner spacer 170a may be conformally formed along a top surface and sidewalls of the etch mask pattern 137, sidewalls of the first spacer 115 and top surfaces of the first to third fins F1 to F3. The inner spacer 170a may include at least one of an oxide layer, a nitride layer and an oxynitride layer.

Figure 56:
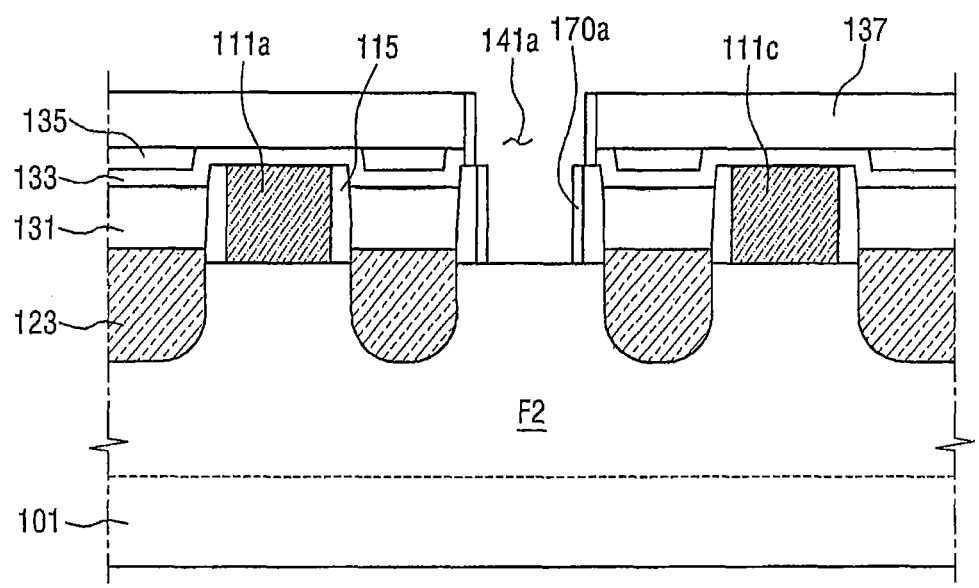

Referring to FIG. 56, the inner spacer 170a is etched to expose the first to third fins F1 to F3 again. The inner spacer 170a may remain on the sidewalls of the etch mask pattern 137 and the sidewalls of the first spacer 115 by, for example, an etch-back process. The inner spacer 170a may be disposed on the sidewalls of the first recess 141a.

Figure 57:
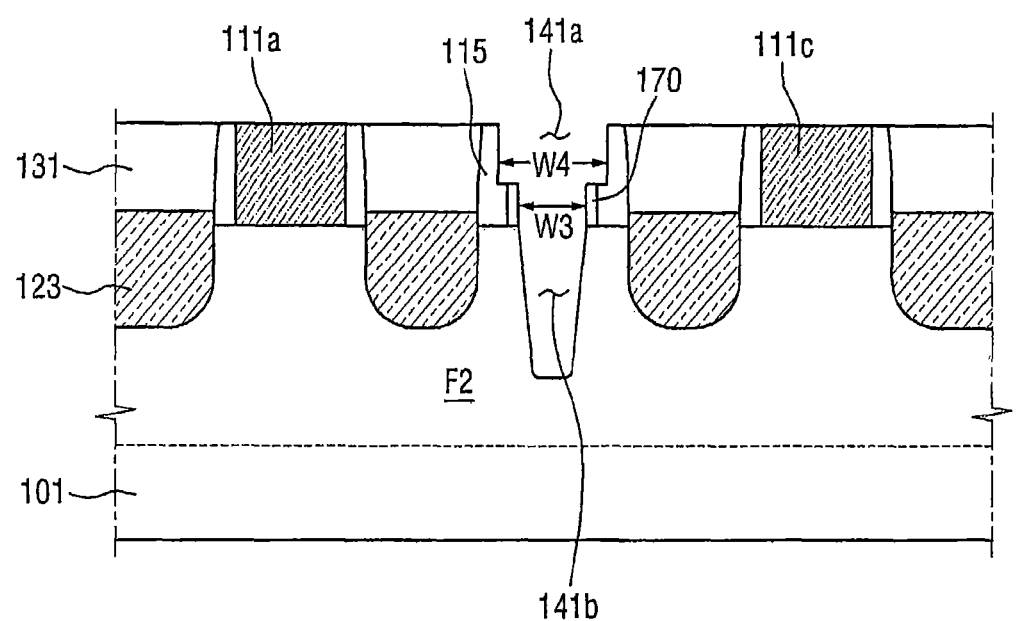

Referring to FIG. 57, the first to third fins F1 to F3 are etched, thereby forming a second recess 141b under the first recess 141a. The second recess 141b may be formed using the etch mask pattern 137, the first spacer 115 and the inner spacer 170a as etch masks.

While the second recess 141b is formed, a portion of the first spacer 115 and a portion of the inner spacer 170a may also be etched, thus forming an inner spacer 170. Accordingly, a height of the inner spacer 170 may be shorter than a height of the first spacer 115, and a width W3 between opposing portions of the inner spacer 170 may be narrower than a width W4 between opposing etched portions of the first spacer 115. A profile of the inner spacer 170 and a profile of the second recess 141b may be connected.

A bottom surface of the second recess 141b may be lower than bottom surfaces of the first to third source/drain regions 121, 123 and 125.

In addition, while the first and second recesses 141a and 141b are formed, the etch mask pattern 137, the insulation layer 135 and the protection layer 133 may also be removed.

Figure 58:
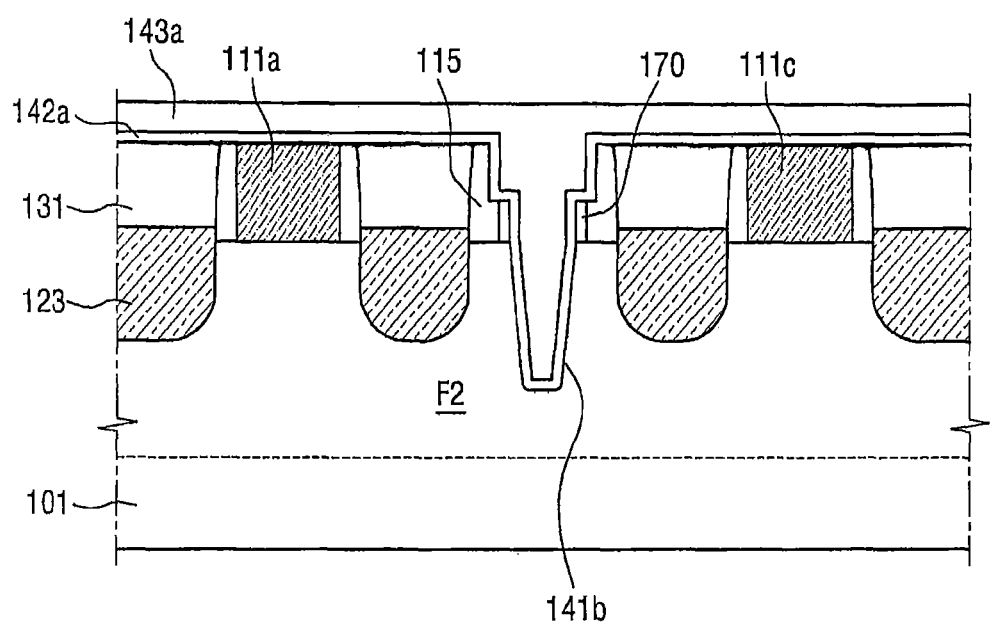

Referring to FIG. 58, a capping layer 142a and a device isolation layer 143a are sequentially formed. The capping layer 142a may be formed along inner surfaces of the first and second recesses 141a and 141b. In detail, the capping layer 142a may be conformally formed along a top surface and sidewalls of the first spacer 115, a top surface and sidewalls of the inner spacer 170, and an inner surface of the second recess 141b. The device isolation layer 143a may be formed on the capping layer 142a and may fill the remaining portions of the first recess 141a and the second recess 141b.

The capping layer 142a may include at least one of an oxide layer, a nitride layer and an oxynitride layer, and the device isolation layer 143a may include at least one of an oxide layer, a nitride layer and an oxynitride layer.

Figure 59:
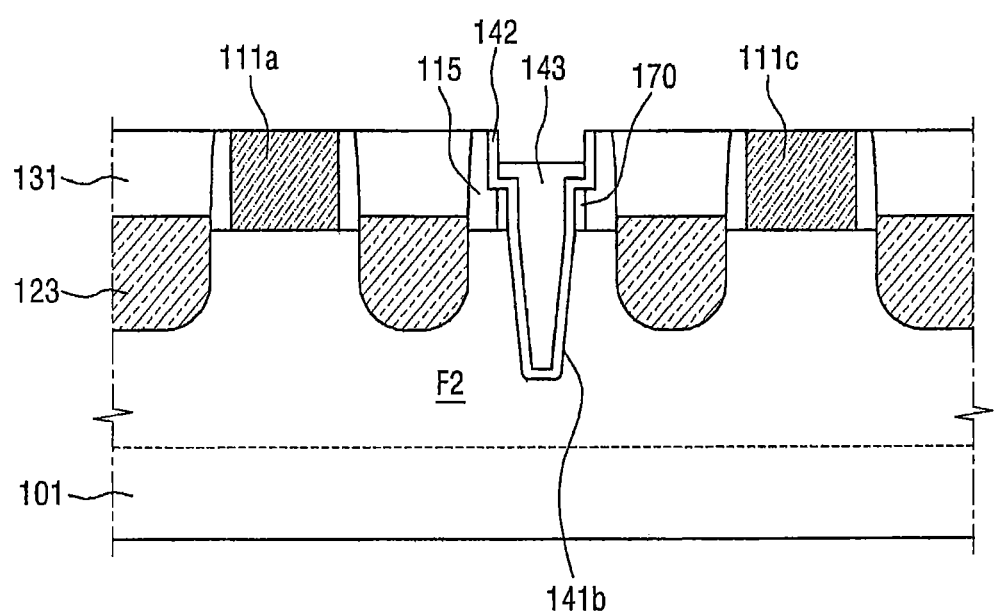

Referring to FIG. 59, portions of the capping layer 142a and the device isolation layer 143a are removed so as to be disposed only in the first and second recesses 141a and 141b, as a capping layer 142 and a device isolation layer 143, respectively. Next, a portion of the device isolation layer 143 is removed. Therefore, the device isolation layer 143 may fill only a portion of the first recess 141a. In FIG. 59, the top surface of the device isolation layer 143 is illustrated as being higher than the top surface of the inner spacer 170, but aspects of present inventive concepts are not limited thereto. The top surface of the device isolation layer 143 may be lower than the top surface of the inner spacer 170 in some embodiments.

When the capping layer 142 includes a different material from the device isolation layer 143, it may not be significantly etched/removed while removing the portion of the device isolation layer 143.

Next, the first and third sacrificial gate structures 111a and 111c are replaced with the first and second gate structures 151a and 151b, the dummy gate structure 152 is formed on the device isolation layer 143, the second interlayer insulation layer 132 is formed, and the silicide layer 161 and the contact 163 are formed, thereby fabricating the semiconductor device 3 shown in FIGS. 6 and 7.

A method for fabricating a semiconductor device 5 according to some embodiments of present inventive concepts will be described with reference to FIGS. 9, 10, 30 to 42 and 60 to 65.

FIGS. 60 to 65 illustrate intermediate process operations of a method for fabricating a semiconductor device 5 according to some embodiments of present inventive concepts. FIGS. 30 to 42 have already been described above, and repeated descriptions thereof may be omitted.

Figure 60:
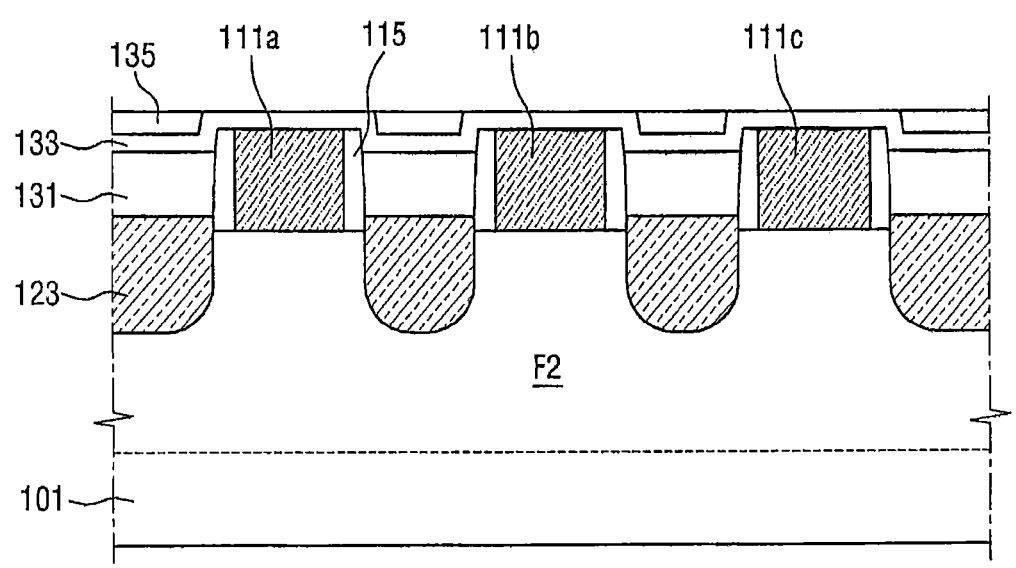
FIGS. 60 to 65 illustrate intermediate process operations of a method for fabricating a semiconductor device according to some embodiments of present inventive concepts.

Referring to FIG. 60, the protection layer 133 is partially removed to expose first to third sacrificial gate structures 111a, 111b and 111c. To expose the first to third sacrificial gate structures 111a, 111 b and 111 c, a planarization process may be performed.

Figure 61:
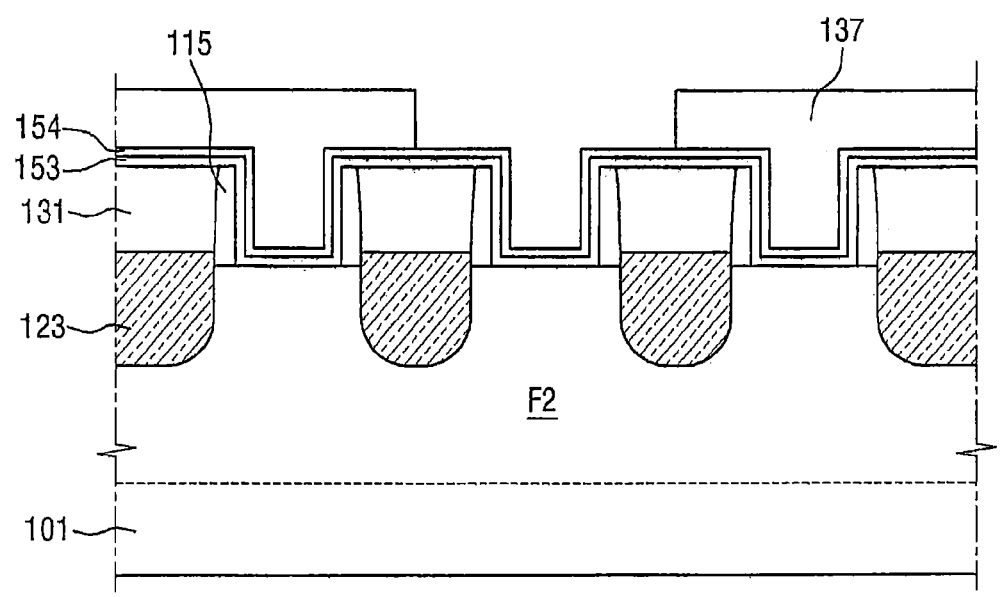

Referring to FIG. 61, the first to third sacrificial gate structures 111a, 111b and 111 c are removed.

Next, a gate insulation layer 153 and a barrier layer 154 are sequentially stacked. In detail, the gate insulation layer 153 may be formed along sidewalls of a first spacer 115 and top surfaces of first to third fins F1 to F3. The gate insulation layer 153 may include a high-k material having a higher dielectric constant than a silicon oxide layer. For example, the gate insulation layer 153 may include $HfO_2$, $ZrO_2$, $LaO$, $Al_2O_3$ or $Ta_2O_5$.

The barrier layer 154 may be disposed on the gate insulation layer 153 and may be formed along the sidewalls of the first spacer 115 and the top surfaces of the first to third fins F1 to F3, like the gate insulation layer 153. The barrier layer 154 may include, for example, TiN.

Next, an etch mask pattern 137 is formed. The etch mask pattern 137 exposes a portion of a second sacrificial gate structure 111b while filling portions of first and third sacrificial gate structures 111a and 111c.

Figure 62:
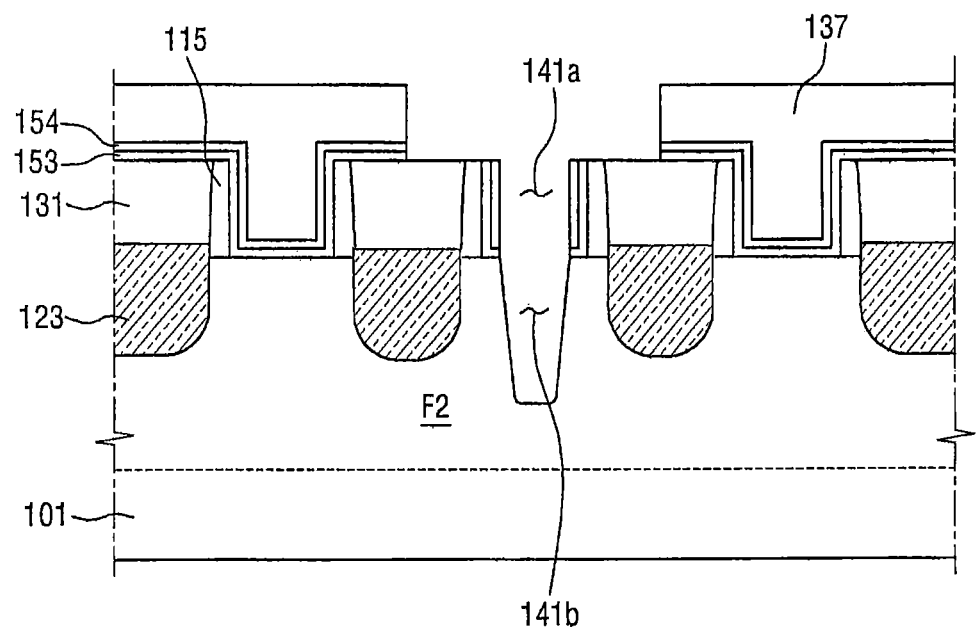

Referring to FIG. 62, first and second recesses 141a and 141b are formed. In detail, the first recess 141a is formed by removing portions of the gate insulation layer 153 and the barrier layer 154 that are exposed by the etch mask pattern 137. The gate insulation layer 153 and the barrier layer 154 are removed by an etch-back process. Portions of the gate insulation layer 153 and the barrier layer 154 that are disposed on the sidewalls of the first spacer 115 may be allowed to remain, and the first to third fins F1 to F3 may be exposed. The gate insulation layer 153 may have an L shape and the barrier layer 154 may be disposed on the gate insulation layer 153.

Next, the second recess 141b is formed in the first to third fins F1 to F3. The second recess 141b may be formed using the gate insulation layer 153 and the barrier layer 154 (e.g., using the gate insulation layer 153 and the barrier layer 154 as etch masks). Due to the presence of the gate insulation layer 153 and the barrier layer 154, a width of the second recess 141b is narrower than that of the second sacrificial gate structure 111b. Moreover, the second recess 141b is spaced apart from the first to third source/drain regions 121, 123 and 125.

Figure 63:
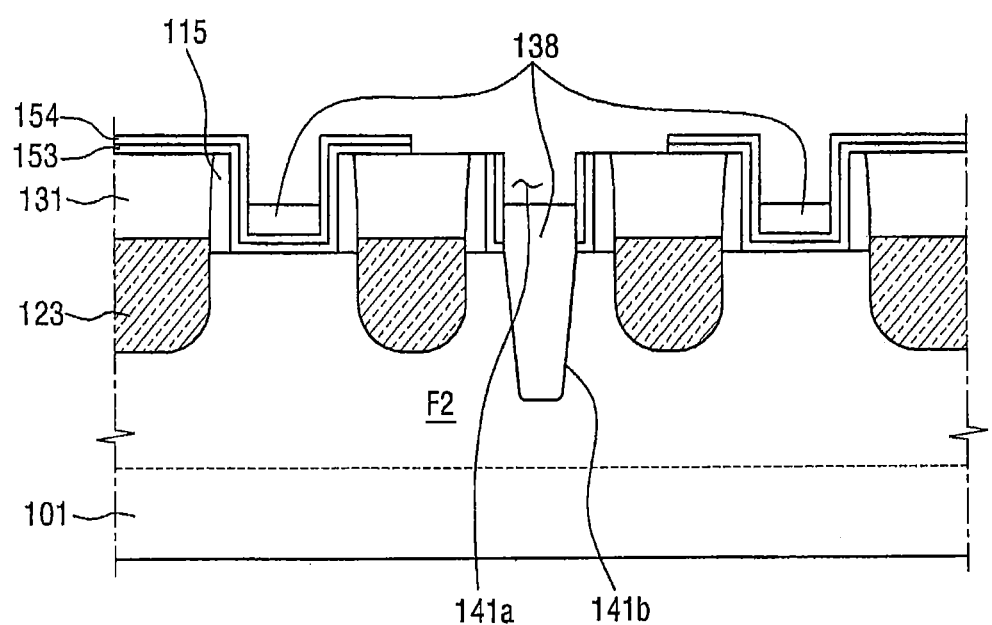

Referring to FIG. 63, the etch mask pattern 137 is removed, and an etch stop layer 138 is formed. The etch stop layer 138 may fill the second recess 141b, a portion of the first recess 141a, and regions resulting after the first and third sacrificial gate structures 111a and 111 c are removed.

Figure 64:
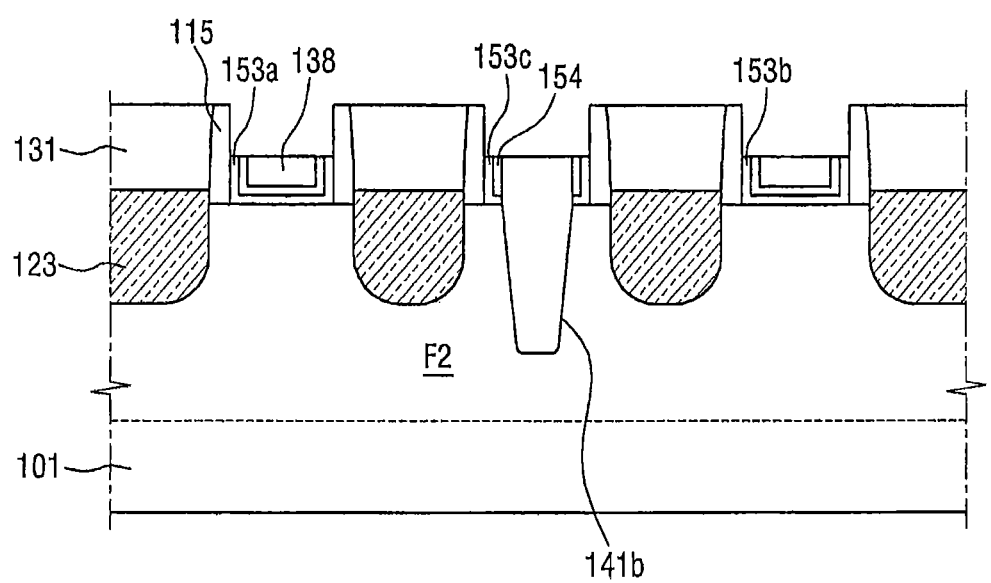

Referring to FIG. 64, the gate insulation layer 153 and the barrier layer 154 are partially removed to form the first and second gate insulation layers 153a and 153b, the dummy gate insulation layer 153c, and the barrier layer 154. Portions of the gate insulation layer 153 and the barrier layer 154 positioned higher than a top surface of the etch stop layer 138 are removed. The top surfaces of the first and second gate insulation layers 153a and 153b, the dummy gate insulation layer 153c and the barrier layer 154 may be coplanarly positioned with the top surface of the etch stop layer 138.

Figure 65:
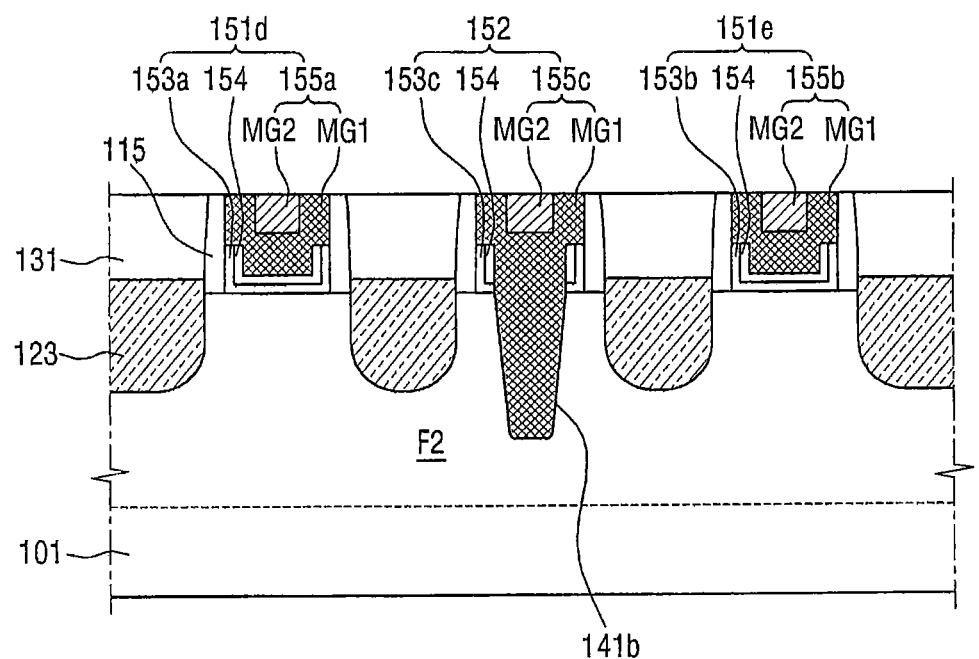

Referring to FIG. 65, the etch stop layer 138 is removed. Next, a first gate electrode 155a is formed on the first gate insulation layer 153a, a second gate electrode 155b is formed on the second gate insulation layer 153b, and a dummy gate electrode 155c is formed on the dummy gate insulation layer 153c. Then, first and second gate structures 151d and 151 e and a dummy gate structure 152 may be formed.

The dummy gate electrode 155c may fill the second recess 141b. In particular, a first metal layer MG1 of the dummy gate electrode 155c may fill the second recess 141b.

Next, the second interlayer insulation layer 132, the silicide layer 161 and the contact 163 are formed, thereby fabricating the semiconductor device 5 shown in FIGS. 9 and 10.

The semiconductor device 6 shown in FIG. 11 may be fabricated by additionally forming a cover layer 169 on the first and second gate structures 151d and 151 e and the dummy gate structure 152 of FIGS. 9 and 10.

A method for fabricating a semiconductor device 8 according to some embodiments of present inventive concepts will be described with reference to FIGS. 14 to 16, 30 to 39, and 66 to 78. FIGS. 66 to 78 illustrate an intermediate process operation of a method for fabricating a semiconductor device 8 according to some embodiments of present inventive concepts. FIGS. 30 to 39 have already been described above, and repeated descriptions thereof may be omitted.

Figure 66:
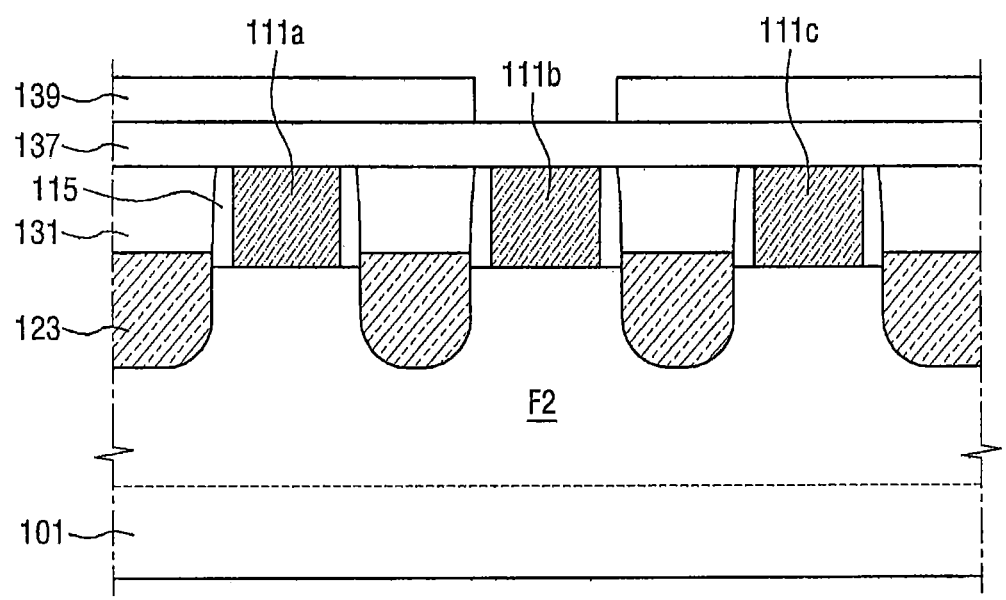
FIGS. 66 to 78 illustrates an intermediate process operation of a method for fabricating a semiconductor device according to some embodiments of present inventive concepts.

Referring to FIG. 66, a first etch mask pattern 137 is formed on the resultant product of FIG. 39 and a second etch mask pattern 139 is formed on the first etch mask pattern 137. To more elaborately and accurately perform an etching process, multiple etch masks may be formed.

To form the second etch mask pattern 139, a second etch mask layer is first formed and a photoresist pattern is then formed on the second etch mask layer, thereby patterning the second etch mask layer using the photoresist pattern. Accordingly, the second etch mask pattern 139 may be formed by patterning the second etch mask layer.

Figure 67:
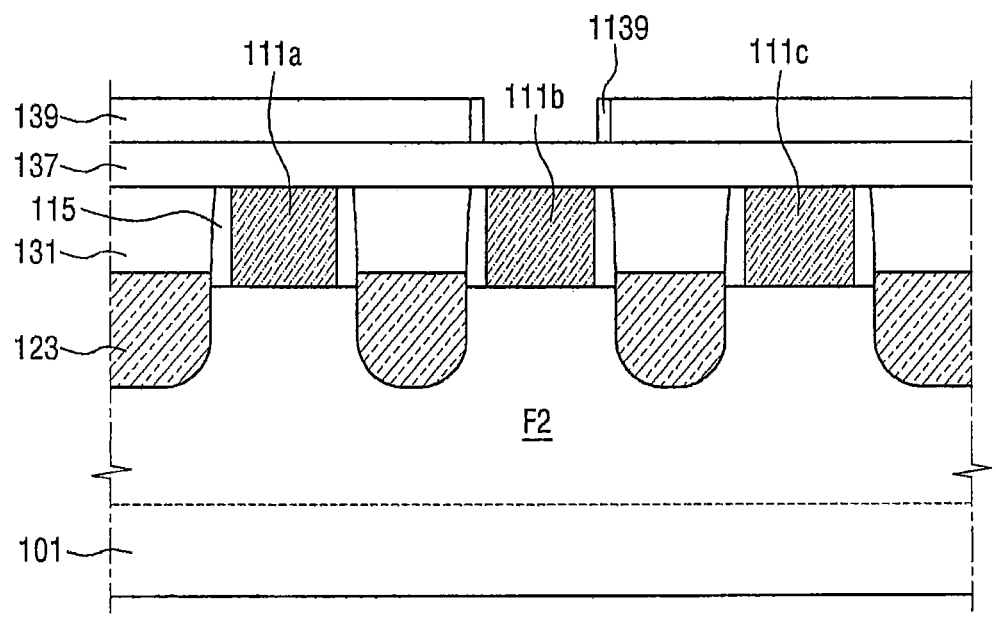

Meanwhile, as shown in FIG. 67, after forming the second etch mask pattern 139, a first mask spacer 1139 may be formed on sidewalls of the second etch mask pattern 139. The forming of the first mask spacer 1139 may protect/prevent the second etch mask pattern 139 from collapsing when patterning the first etch mask layer 137.

Figure 68:
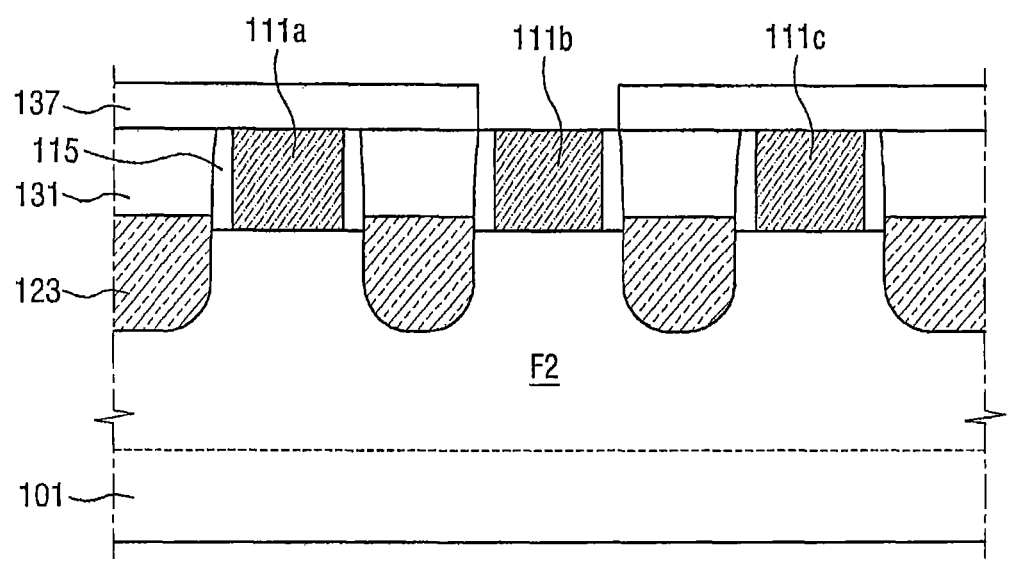

Next, as shown in FIG. 68, the first etch mask layer 137 is patterned using the second etch mask pattern 139. As a result, a first etch mask pattern 137 is formed, and a second hard mask layer 113b (e.g., as illustrated in FIG. 39) is exposed.

Next, the second etch mask pattern 139 disposed on the first etch mask pattern 137 is removed.

Figure 69:
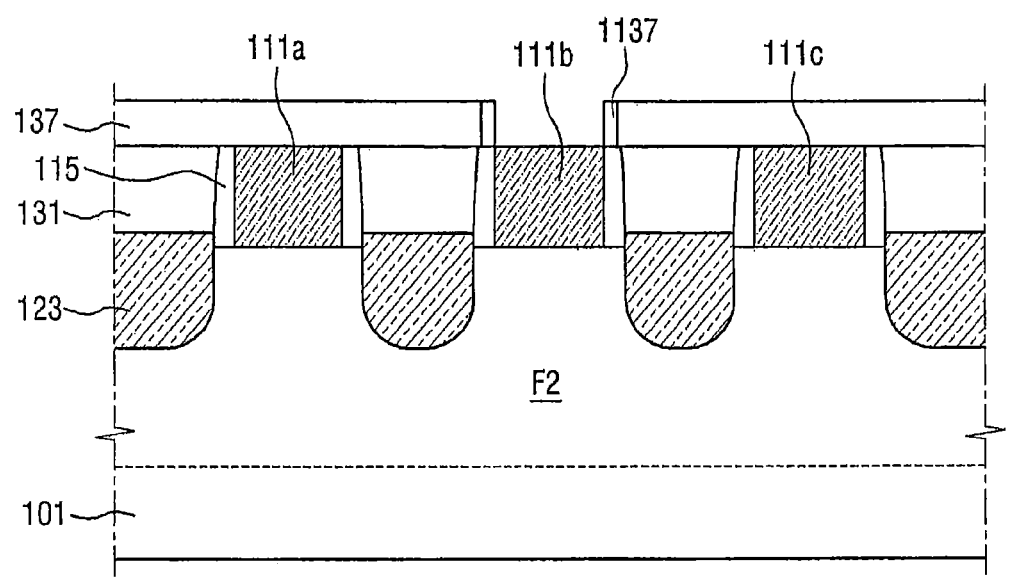

As shown in FIG. 69, after forming the first etch mask pattern 137, a second mask spacer 1137 may be formed on sidewalls of the first etch mask pattern 137. The forming of the second mask spacer 1137 may protect/prevent the first etch mask pattern 137a from collapsing in a subsequent process.

Figure 70:
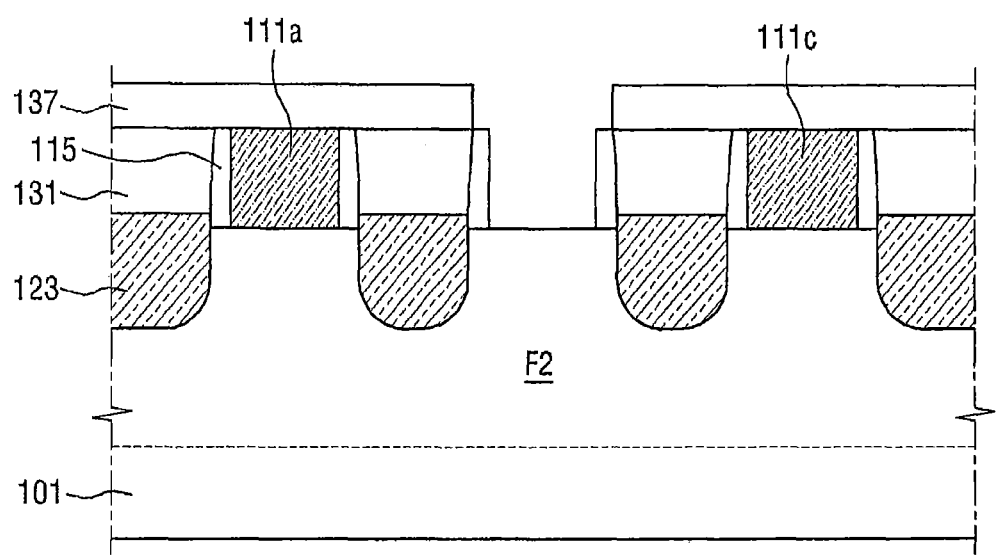

Referring to FIG. 70, the second hard mask layer 113b and the second sacrificial gate structure 111b are sequentially removed using the first etch mask pattern 137. The exposed second hard mask layer 113b is first removed to expose a top surface of the second sacrificial gate structure 111b, followed by removing the second sacrificial gate structure 111b. The first recess 141a may be formed by removing the second sacrificial gate structure 111b, and first to third fins F1 to F3 are exposed by the first recess 141a.

Figure 71:
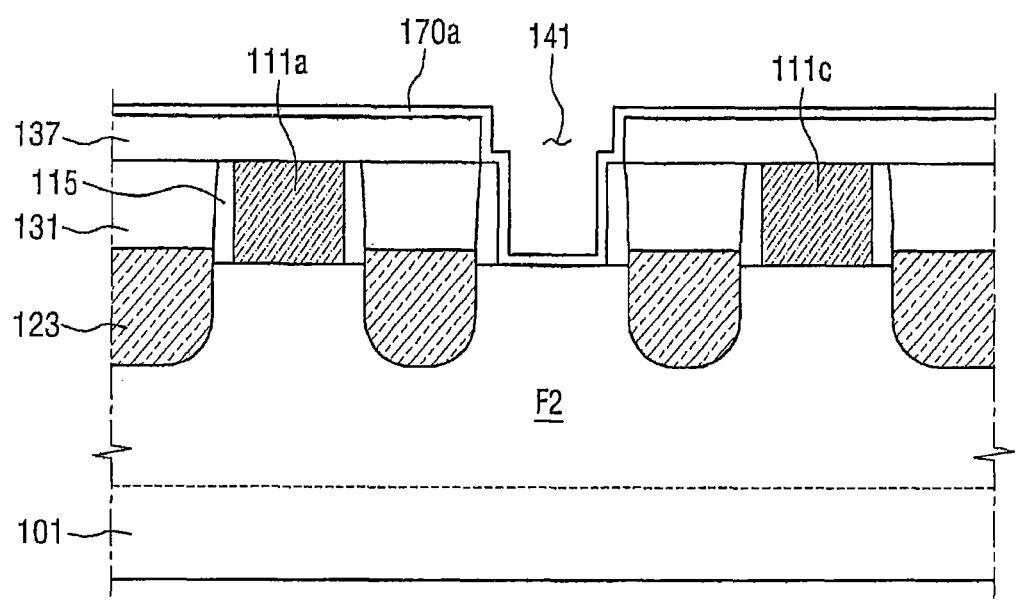
Figure 72:
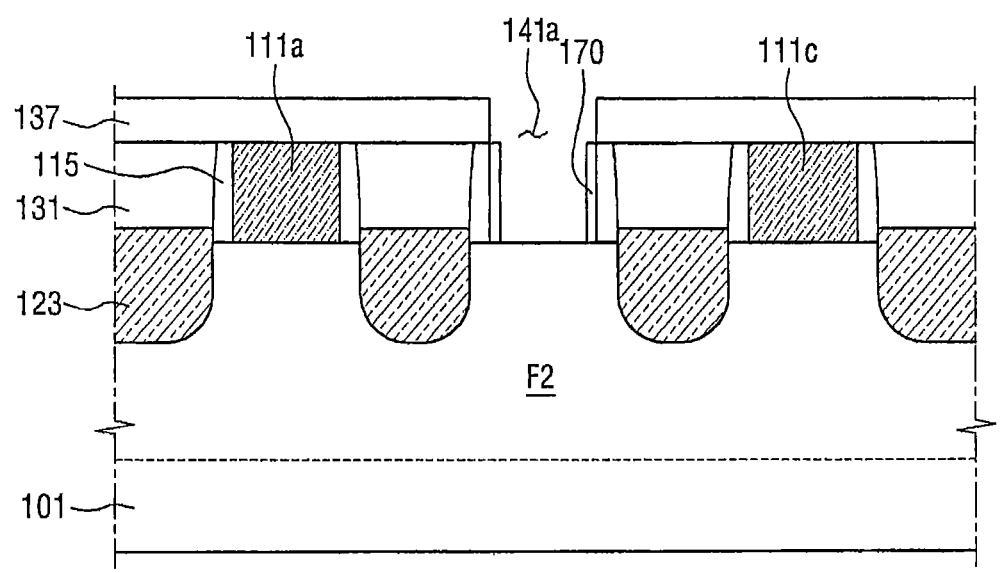

Referring to FIGS. 71 and 72, an inner spacer 170a is formed in the first recess 141a. First, as shown in FIG. 71, the inner spacer 170a is formed along a top surface and sidewalls of the first etch mask pattern 137, a top surface and sidewalls of the first spacer 115, and top surfaces of the first to third fins F1 to F3. Next, as shown in FIG. 72, portions of the inner spacer 170a are removed by, for example, an etch-back process, thus providing an inner spacer 170 remaining only on the sidewalls of the first etch mask pattern 137 and the sidewalls of the first spacer 115. Accordingly, the first to third fins F1 to F3 are also exposed.

Figure 73:
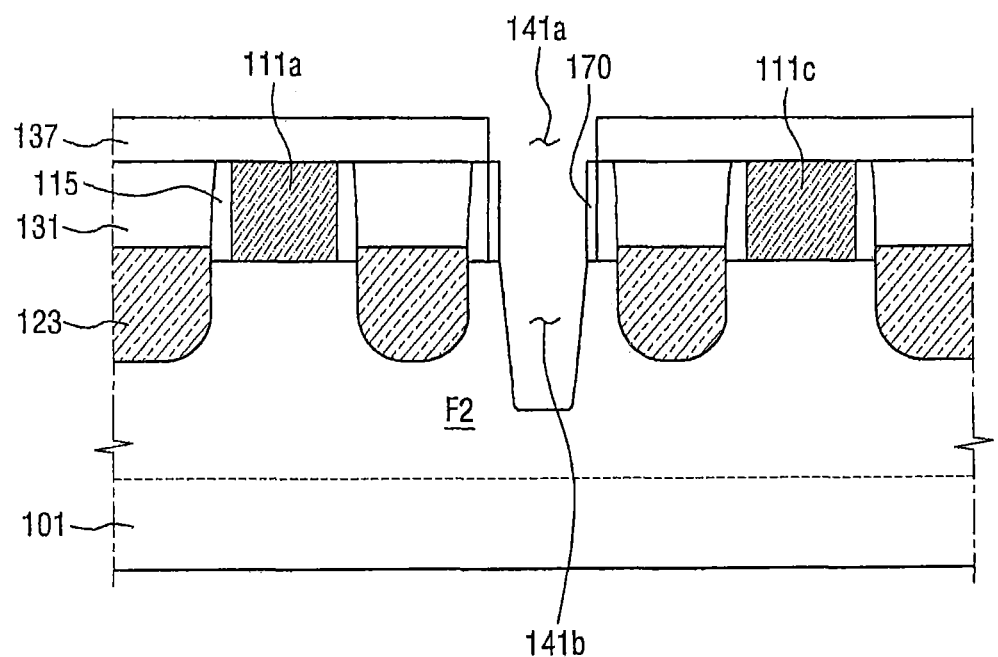

Referring to FIG. 73, the exposed first to third fins F1 to F3 are etched to form the second recess 141b. The second recess 141b may be formed using the first etch mask pattern 137 and the inner spacer 170 as etch masks. A width of the second recess 141b may be adjusted by adjusting a width of the inner spacer 170. A bottom surface of the second recess 141b is lower (e.g., closer to a surface of the substrate 101) than bottom surfaces of first to third source/drain regions 121, 123 and 125.

Figure 74:
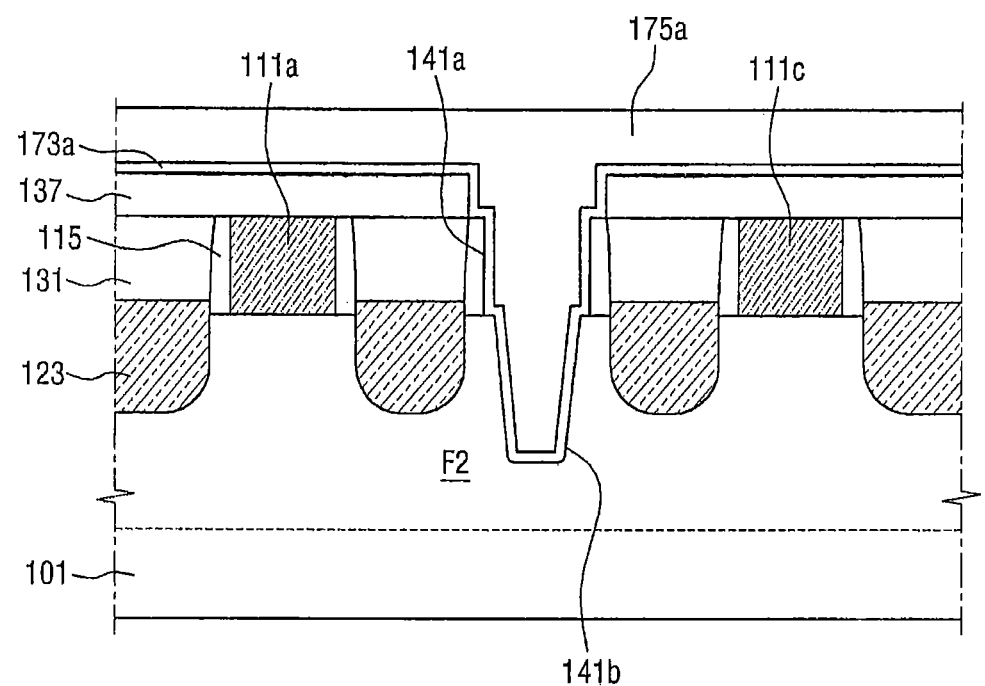

Referring to FIG. 74, the inner spacer 170 is removed and the capping layer 173a and the device isolation layer 175a are then formed. The capping layer 173a may be formed along a top surface and sidewalls of the first etch mask pattern 137, a top surface and sidewalls of the first spacer 115, and an inner surface of the second recess 141b. The device isolation layer 175a may fill the remaining portions of the first and second recesses 141a and 141b.

For example, the capping layer 173a may include at least one of a silicon oxide layer, a silicon nitride layer, and a silicon oxynitride layer, and the device isolation layer 175a may include at least one of a silicon oxide layer, a silicon nitride layer, and a silicon oxynitride layer.

Figure 75:
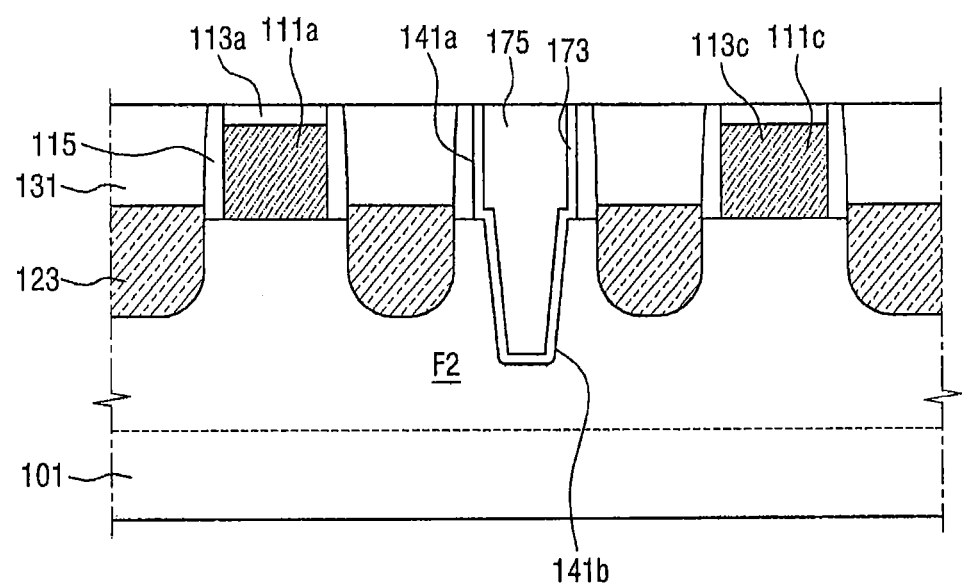

Referring to FIG. 75, portions of the device isolation layer 175a and the capping layer 173a are removed, and the device isolation layer 175 and the capping layer 173 are disposed only in the first and second recesses 141a and 141b. The first and third hard mask layers 113a and 113c may be exposed.

Figure 76:
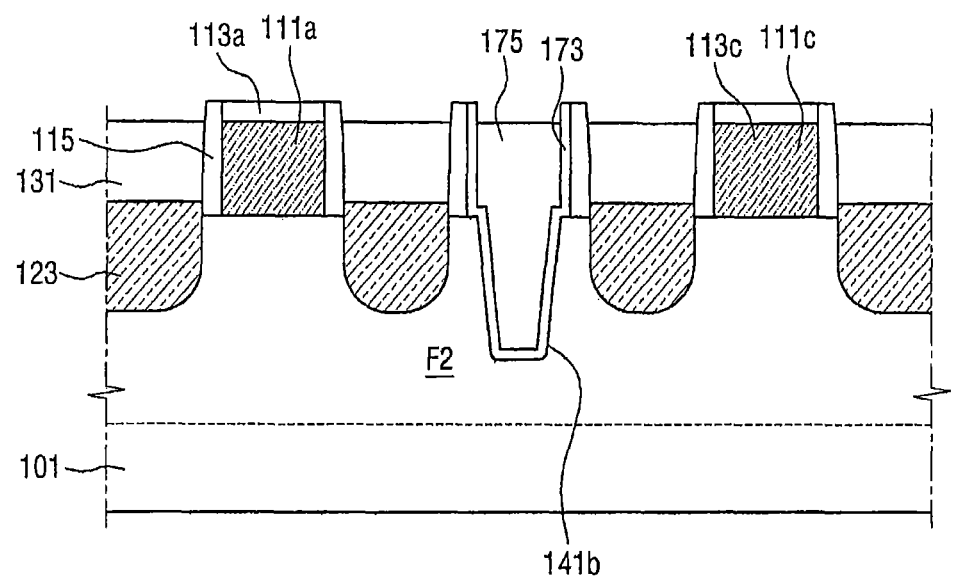

Next, referring to FIG. 76, a cleaning process is performed. As a result of the cleaning process, a portion of the first interlayer insulation layer 131 and a portion of the device isolation layer 175 may be etched.

Figure 77:
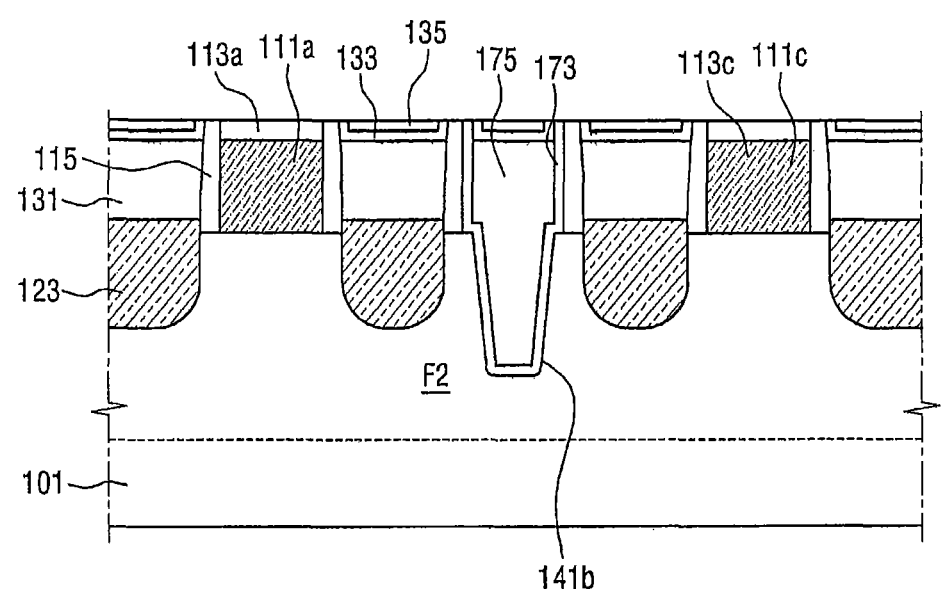

Referring to FIG. 77, a protection layer 133 is formed on the resultant device/product of FIG. 76. The protection layer 133 may be formed to have a uniform thickness. Accordingly, the protection layer 133 may have a recessed portion thereof formed on the first interlayer insulation layer 131. The protection layer 133 may include at least one of a nitride layer and an oxynitride layer. Next, an insulation layer 135 filling the recessed portion of the protection layer 133 is formed. The insulation layer 135 may include the same material as the first interlayer insulation layer 131.

Next, the first and third hard mask layers 113a and 113c are exposed through planarization. The protection layer 133 may cover the first interlayer insulation layer 131 and the device isolation layer 175.

Figure 78:
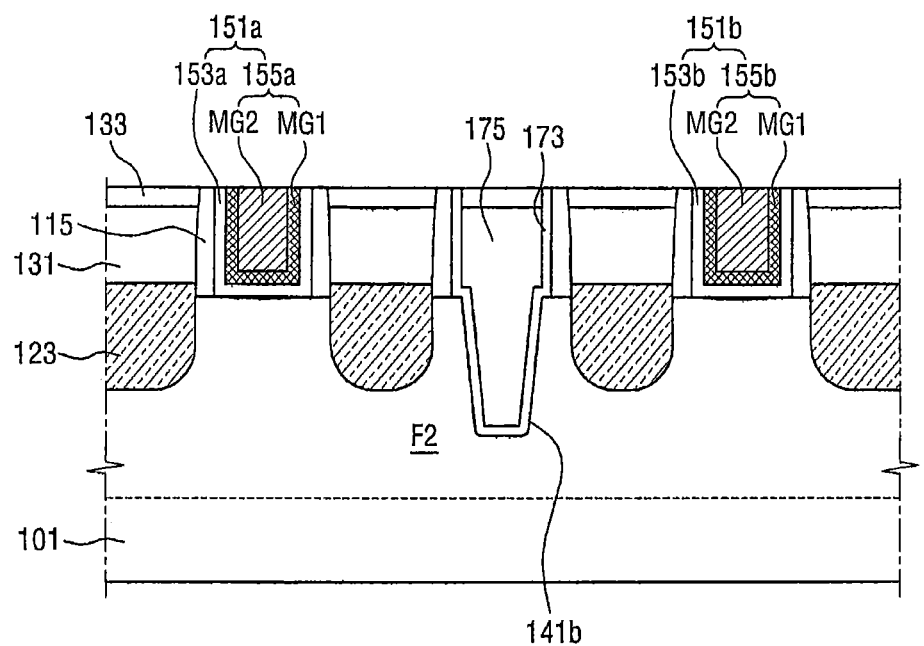

Referring to FIG. 78, the first and third hard mask layers 113a and 113c are removed by, for example, planarization. The first and third sacrificial gate structures 111a and 111 c are replaced with the first and second gate structures 151a and 151b. A dummy gate structure is not formed on the device isolation layer 175. Since the first and second gate structures 151a and 151b are the same as described above, detailed descriptions thereof will not be given.

Next, the protection layer 133 is removed, the second interlayer insulation layer 132 is formed, and the silicide layer 161 and the contact 163 are formed, thereby fabricating the semiconductor device 8 shown in FIGS. 14 to 16.

Figure 79:
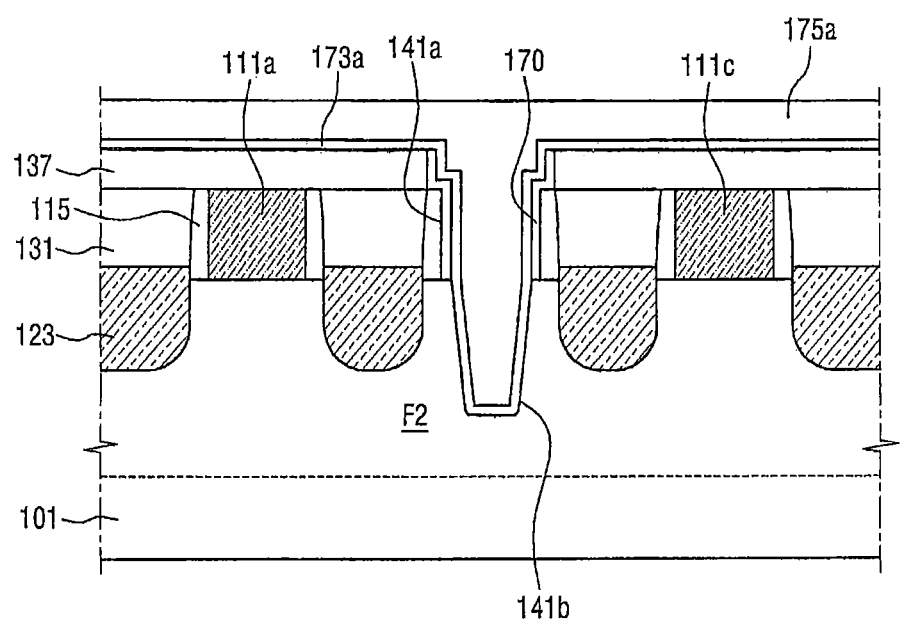
FIG. 79 illustrates an intermediate process operation of a method for fabricating a semiconductor device according to some embodiments of present inventive concepts.

A method for fabricating a semiconductor device 9a according to some embodiments of present inventive concepts will be described with reference to FIGS. 17, 18, 30 to 39, and 66 to 79. FIG. 79 illustrates an intermediate process operation of a method for fabricating a semiconductor device 9a according to some embodiments of present inventive concepts. FIGS. 30 to 39 and 66 to 73 have already been described above, and repeated descriptions thereof may be omitted.

Referring to FIG. 79, the capping layer 173a and the device isolation layer 175a are formed without removing the inner spacer 170. The capping layer 173a may be formed along a top surface of the first etch mask pattern 137, a top surface and sidewalls of the inner spacer 170, and an inner surface of the second recess 141b. The device isolation layer 175a may fill the remaining portions of the first and second recesses 141a and 141b.

Next, the same process operations of the fabricating method as shown in FIGS. 74 to 78 are performed, thereby fabricating the semiconductor device 9a shown in FIGS. 17 and 18.

Figure 80:
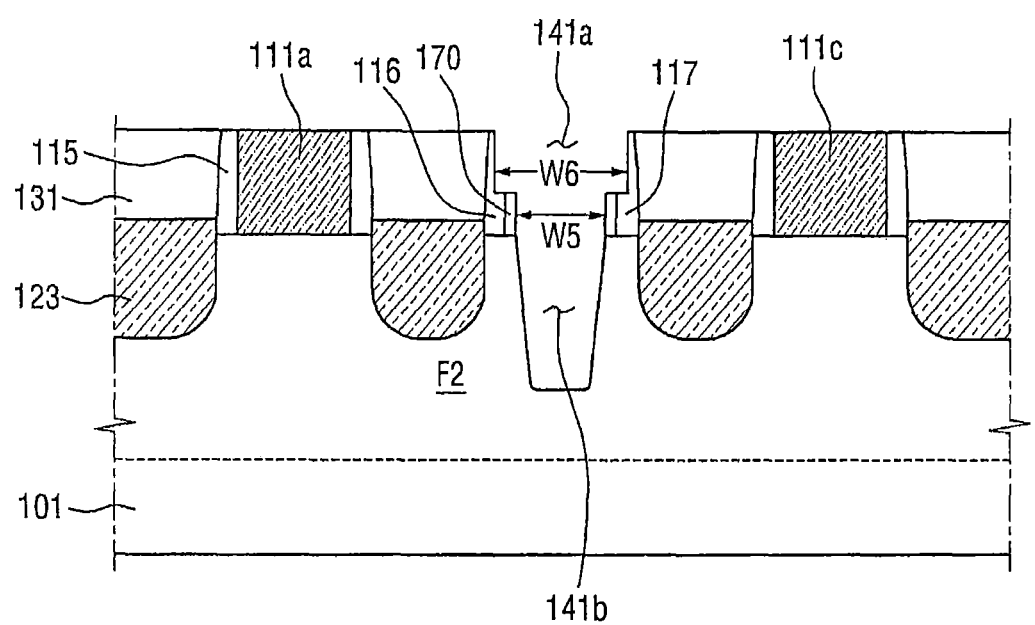
FIGS. 80 to 82 illustrate intermediate process operations of a method for fabricating a semiconductor device according to some embodiments of present inventive concepts.
Figure 81:
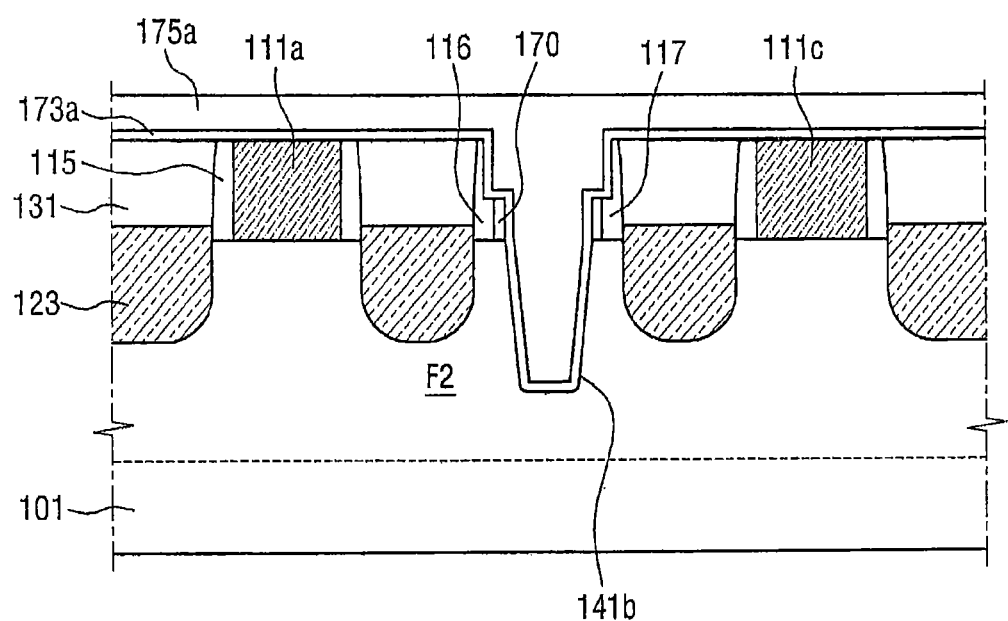
Figure 82:
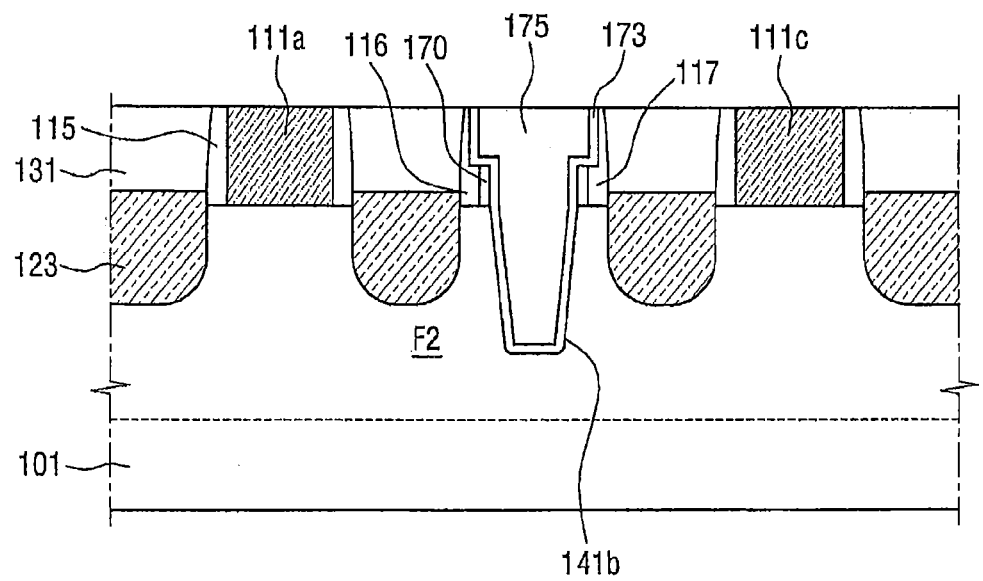

A method for fabricating a semiconductor device 10 according to some embodiments of present inventive concepts will be described with reference to FIGS. 23, 24, 30 to 39, 66 to 72, and 80 to 82. FIGS. 80 to 82 illustrate intermediate process operations of a method for fabricating a semiconductor device 10 according to some embodiments of present inventive concepts. FIGS. 30 to 39 and 66 to 72 have already been described above, and repeated descriptions thereof may be omitted.

Referring to FIG. 80, the exposed first to third fins F1 to F3 are etched to form the second recess 141b. Here, portions of the spacers 116 and 117 disposed on opposite sides of the first recess 141a and the inner spacer 170 may be etched. Accordingly, the spacers 116 and 117 may have L shapes facing each other, and top widths of the spacers 116 and 117 are smaller than bottom widths thereof. The inner spacer 170 does not cover the second recess 141b but is disposed on sidewalls of the spacers 116 and 117. A height of the inner spacer 170 may be smaller than heights of the spacers 116 and 117.

As the portions of the spacers 116 and 117 and the inner spacer 170 are etched, a shape of the first recess 141a may vary. A width W5 of the first recess 141a between the inner spacer 170 is smaller than a width W6 between the spacers 116 and 117 where the inner spacer 170 is not disposed.

Next, the etch mask pattern 137 is removed.

Referring to FIG. 81, the capping layer 173a and the device isolation layer 175a are sequentially formed in the first and second recesses 141a and 141b.

Referring to FIG. 82, the capping layer 173a and the device isolation layer 175a are partially removed to expose the first interlayer insulation layer 131 and the first to third hard mask layers 113a and 113c. The capping layer 173 and the device isolation layer 175 are disposed only in the first and second recesses 141a and 141b, after partially removing the capping layer 173a and the device isolation layer 175a.

Next, the first to third hard mask layers 113a and 113c are removed, and the first and third sacrificial gate structures 111a and 111c are replaced with the first and second gate structures 151a and 151b, and the second interlayer insulation layer 132, the silicide layer 161 and the contact 163 are formed, thereby fabricating the semiconductor device 10 shown in FIGS. 23 and 24.

Next, a method for fabricating a semiconductor device 11 according to some embodiments of present inventive concepts will be described with reference to FIGS. 25, 26, 30 to 39 and 83 to 86.

FIGS. 83 to 86 illustrate intermediate process operations of a method for fabricating a semiconductor device 11 according to some embodiments of present inventive concepts.

FIGS. 30 to 39 have already been described above, and repeated descriptions thereof may be omitted.

Figure 83:
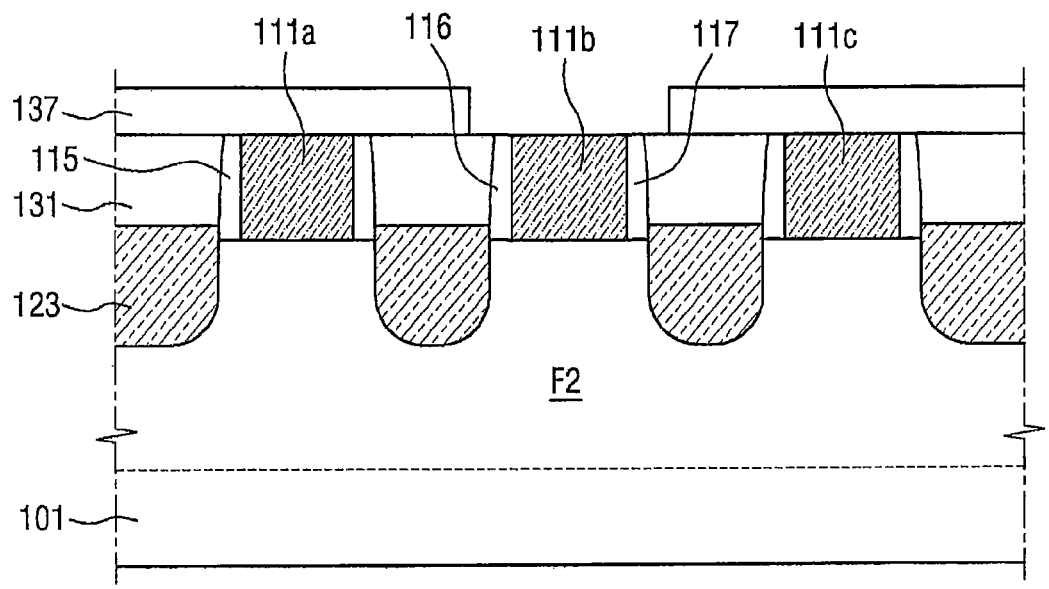
FIGS. 83 to 86 illustrate intermediate process operations of a method for fabricating a semiconductor device according to some embodiments of present inventive concepts.

Referring to FIG. 83, an etch mask pattern 137 is formed on the resultant product of FIG. 39. The etch mask pattern 137 exposes top surfaces of spacers 116 and 117 disposed on opposite sidewalls of a second sacrificial gate structure 111b and a portion of the first interlayer insulation layer 131.

Figure 84:
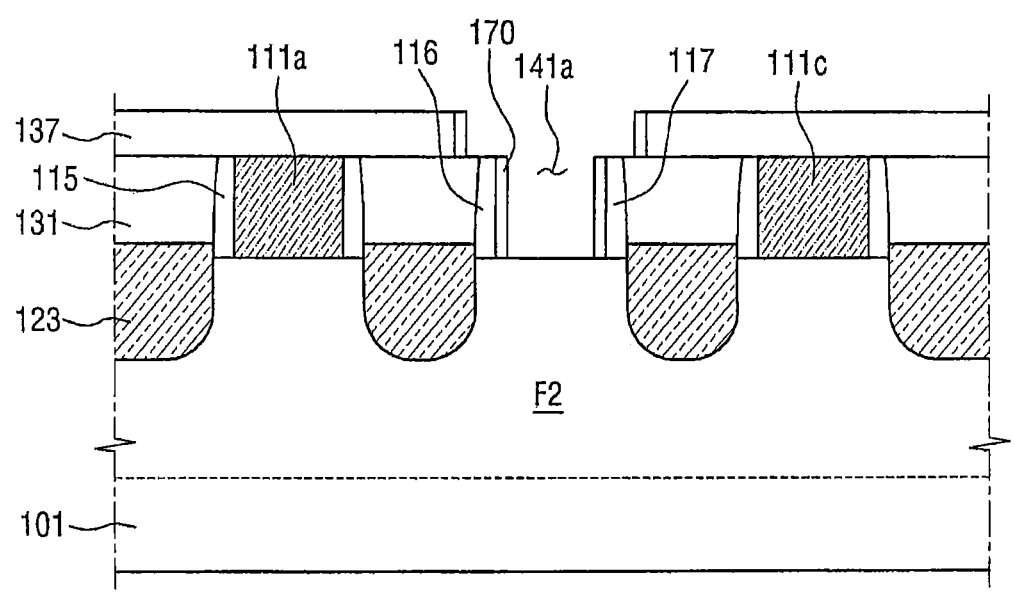

Referring to FIG. 84, the first recess 141a is formed by removing the second sacrificial gate structure 111b. The first recess 141a exposes portions of the first to third fins F1 to F3. Next, the inner spacer 170 is formed on sidewalls of the spacers 116 and 117. The inner spacer 170 may also be formed on sidewalls of the etch mask pattern 137.

Figure 85:
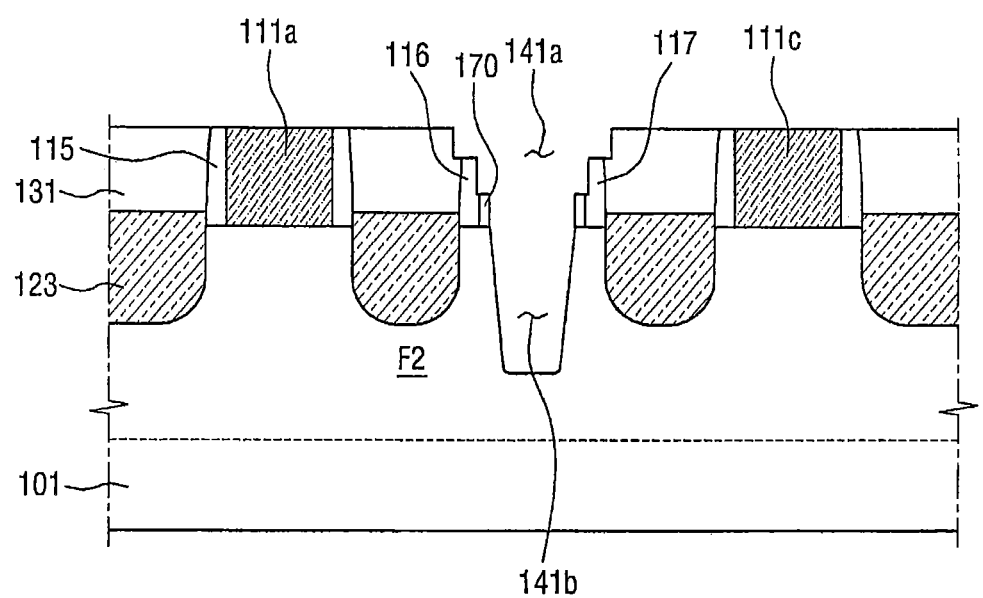

Referring to FIG. 85, the second recess 141b is formed in each of the first to third fins F1 to F3. In the course of forming the second recess 141b, a portion of the first interlayer insulation layer 131, portions of the spacers 116 and 117 disposed at opposite sides of the first recess 141a and a portion of the inner spacer 170 may be etched. Heights of the spacers 116 and 117 are greater than a height of the inner spacer 170, but aspects of present inventive concepts are not limited thereto. For example, when the spacers 116 and 117 and the inner spacer 170 include the same material, the heights of the spacers 116 and 117 may be equal to the height of the inner spacer 170.

A height of the first spacer 115 formed on sidewalls of the first and third sacrificial gate structures 111a and 111c may be taller than heights of the spacers 116 and 117 formed on opposite sides of the first recess 141a.

Figure 86:
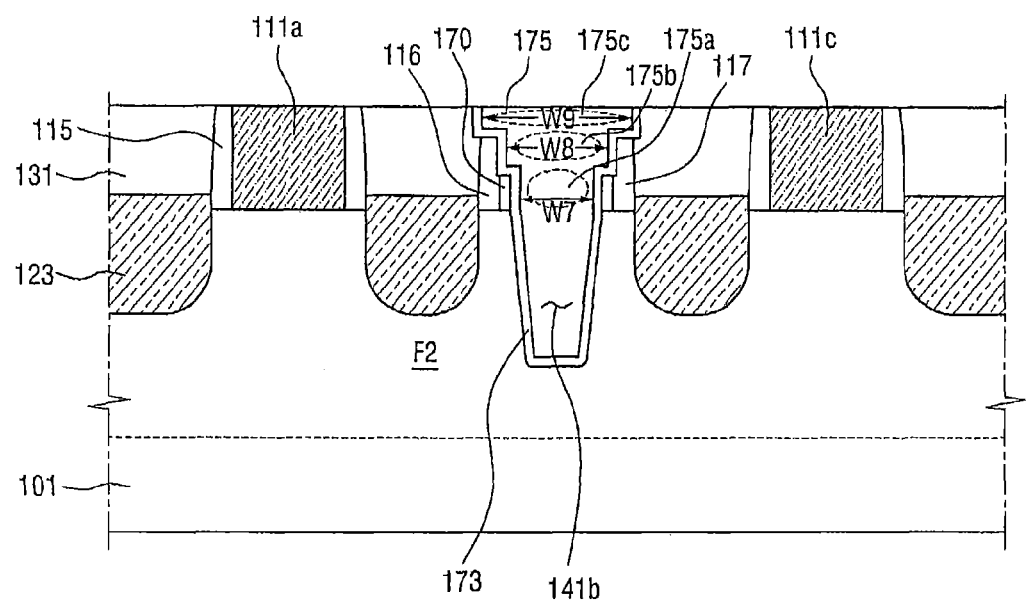

Referring to FIG. 86, a capping layer 173 and a device isolation layer 175 may be sequentially formed in the first and second recesses 141a and 141b. The capping layer 173 may be formed along sidewalls of the first interlayer insulation layer 131, top surfaces and sidewalls of the spacers 116 and 117, a top surface and sidewalls of the inner spacer 170 and an inner surface of the second recess 141b, and the device isolation layer 175 may fill remaining portions of the first and second recesses 141a and 141b that are not filled by the capping layer 173.

The device isolation layer 175 may cover the top surfaces of the spacers 116 and 117 disposed on opposite sides of the first recess 141a. The device isolation layer 175 may have a first region 175a disposed between opposing portions of the inner spacer 170, a second region 175b between the spacers 116 and 117 disposed on the first region 175a, and a third region 175c between opposite sides of the first interlayer insulation layer 131 disposed on the second region 175b. A width W7 of the first region 175a may be smaller than or equal to a width W8 of the second region 175b, and the width W8 of the second region 175b may be smaller than or equal to a width W9 of the third region 175c.

Next, the second interlayer insulation layer 132 is formed on the resultant product of the FIG. 86, the silicide layer 161 is formed and the contact 163 is then formed, thereby fabricating the semiconductor device 11 shown in FIGS. 25 and 26.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate comprising a first region and a second region;
   a first fin protruding from the substrate and extending in a first direction on the first region;
   a recess extending in a second direction different from the first direction in the first fin;
   second and third fins on the second region, protruding from the substrate, and extending in the first direction; and
   a trench between the second fin and the third fin such that the second fin and the third fin are spaced apart from each other,
   wherein a height and a width of the recess are smaller than those of the trench.

2. The semiconductor device of claim 1, wherein the height of the recess is smaller than that of the first fin and the height of the trench is greater than that of the first fin.

3. The semiconductor device of claim 1, further comprising a first device isolation layer in the recess and a second device isolation layer in the trench.

4. The semiconductor device of claim 3, wherein the second device isolation layer includes the same material as the first device isolation layer.

5. The semiconductor device of claim 3, further comprising a capping layer between the recess and the first device isolation layer.

6. The semiconductor device of claim 3, further comprising first and second gate structures on both sides of the recess and spaced apart from the first device isolation layer.

7. The semiconductor device of claim 6, wherein an upper layer of the first device isolation layer is coplanar with upper surfaces of the first and second gate structures.

8. The semiconductor device of claim 3, further comprising:
   a spacer on both sides of the first device isolation layer, and
   an inner spacer on inner sidewalls of the spacer.

* * * * *